(12) United States Patent
Okuyama et al.

(10) Patent No.: US 7,087,932 B2
(45) Date of Patent: Aug. 8, 2006

(54) SEMICONDUCTOR LIGHT-EMITTING DEVICE AND SEMICONDUCTOR LIGHT-EMITTING DEVICE

(75) Inventors: Hiroyuki Okuyama, Kanagawa (JP); Masato Doi, Kanagawa (JP); Goshi Biwa, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 610 days.

(21) Appl. No.: 10/088,463

(22) PCT Filed: Jul. 18, 2001

(86) PCT No.: PCT/JP01/06214

§ 371 (c)(1), (2), (4) Date: Jul. 23, 2002

(87) PCT Pub. No.: WO02/07232

PCT Pub. Date: Jan. 24, 2002

(65) Prior Publication Data

US 2003/0107047 A1 Jun. 12, 2003

(51) Int. Cl.
 H01L 29/04 (2006.01)

(52) U.S. Cl. ............ 257/89; 257/103; 257/627

(58) Field of Classification Search ............ 257/12, 257/13, 79, 86, 87, 88, 89, 90, 91, 92, 93, 257/94, 95, 96, 97, 98, 99, 100, 101, 102, 257/103, 627, 628
See application file for complete search history.

(56) References Cited

U.S. PATENT DOCUMENTS 6,541,130 B1 * 4/2003 Fukuda
6,603,146 B1 * 8/2003 Hata et al.

FOREIGN PATENT DOCUMENTS

| JP | 5-251738 | 9/1993 |
| JP | 09-092881 | 4/1997 |
| JP | 09-162444 | 6/1997 |

OTHER PUBLICATIONS

K. Tachibana et al., "Selective growth of InGaN quantum dot structures and their microphotoluminescence at room temperature" Applied Physics Letters, May 29, 2000, vol. 76, No. 22, pp. 3212–3214.

D. Kapolnek et al., "Spatial control of InGaN luminescence by MOCVD selective epitaxy" Journal of Crystal Growth, (1998), vol. 189/190, pp. 83–86.

* cited by examiner

Primary Examiner—Nathan J. Flynn
Assistant Examiner—Kevin Quinto
(74) Attorney, Agent, or Firm—Bell, Boyd & Lloyd LLC

(57) ABSTRACT

A semiconductor light-emitting element is provided which has a structure that does not complicate a fabrication process, can be formed in high precision and does not invite any degradation of crystallinity. A light-emitting element is formed, which includes a selective crystal growth layer formed by selectively growing a compound semiconductor of a Wurtzite type, a clad layer of a first conduction type, an active layer and a clad layer of a second conduction type, which are formed on the selective crystal growth layer wherein the active layer is formed so that the active layer extends in parallel to different crystal planes, the active layer is larger in size than a diffusion length of a constituent atom of a mixed crystal, or the active layer has a difference in at least one of a composition and a thickness thereof, thereby forming the active layer having a number of light-emitting wavelength regions whose emission wavelengths differ from one another. The element is so arranged that an electric current or currents are chargeable into the number of light-emitting wavelength regions. Because of the structure based on the selective growth, the band gap energy varies within the same active layer, thereby forming an element or device in high precision without complicating a fabrication process.

39 Claims, 53 Drawing Sheets

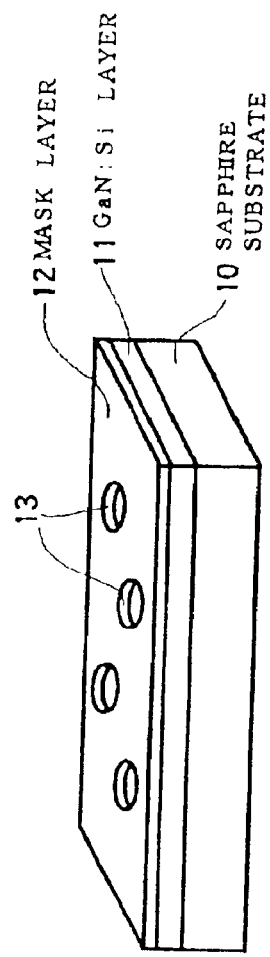
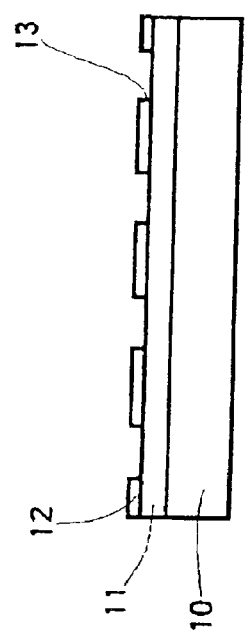

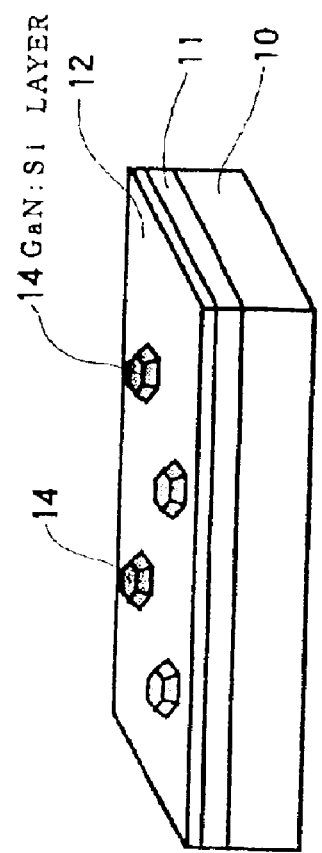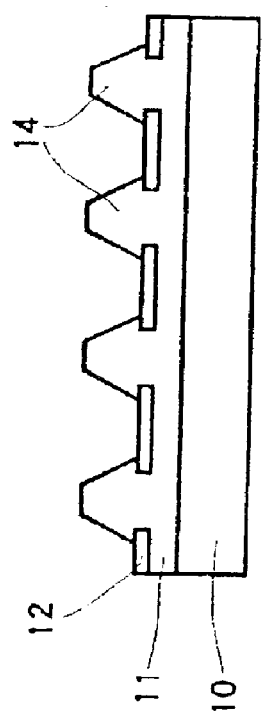

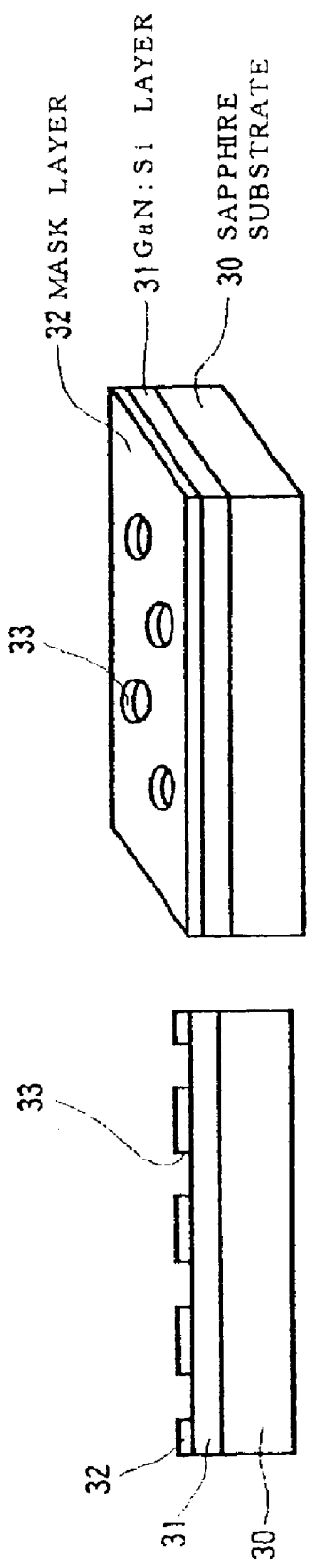

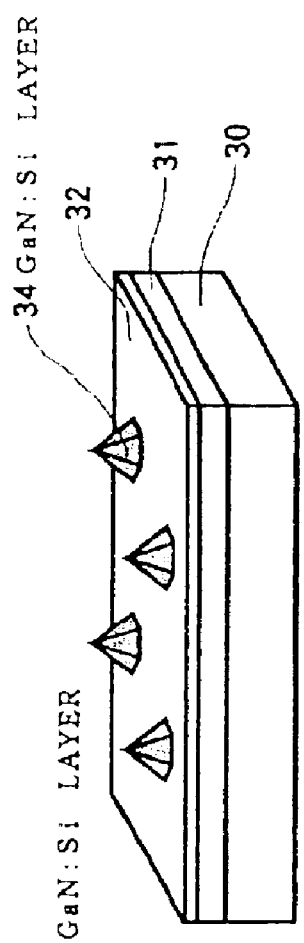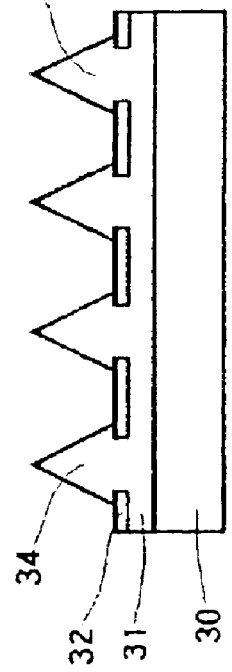

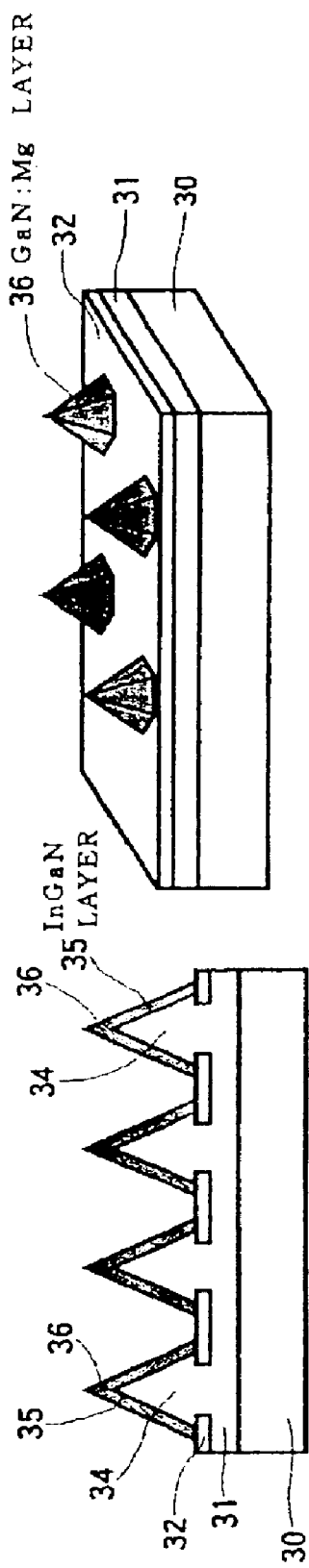

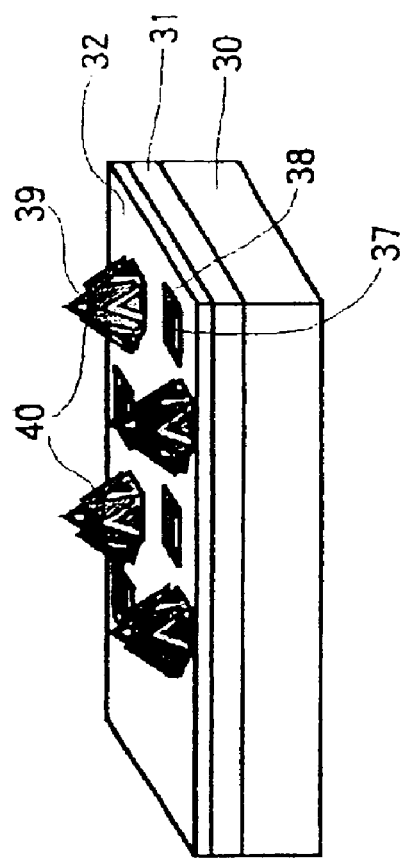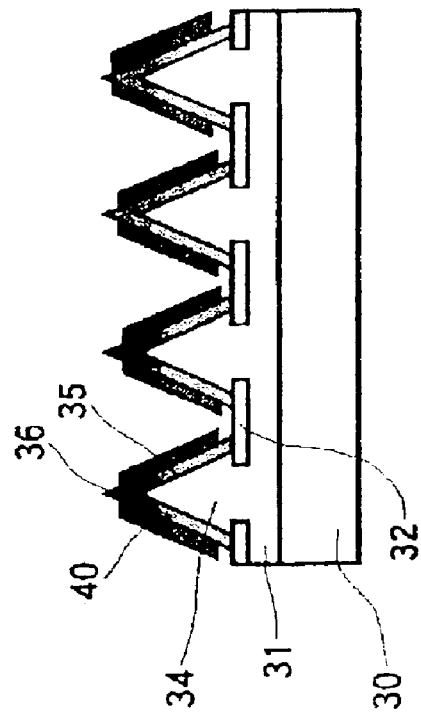
FIG.10A
FIG.10B

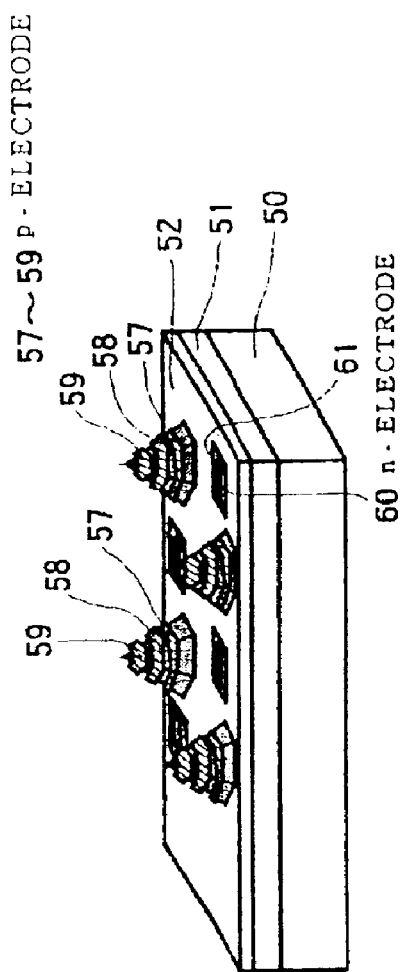
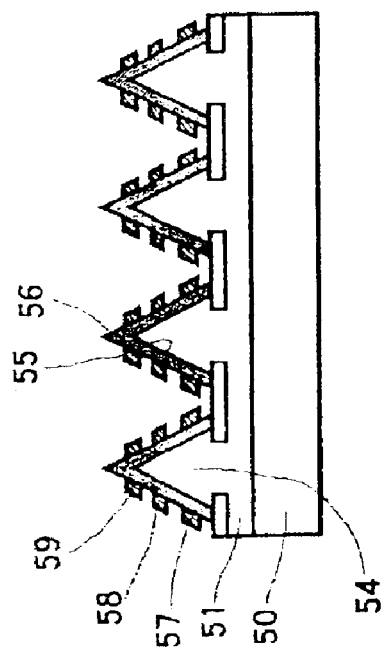
FIG. 16A
FIG. 16B

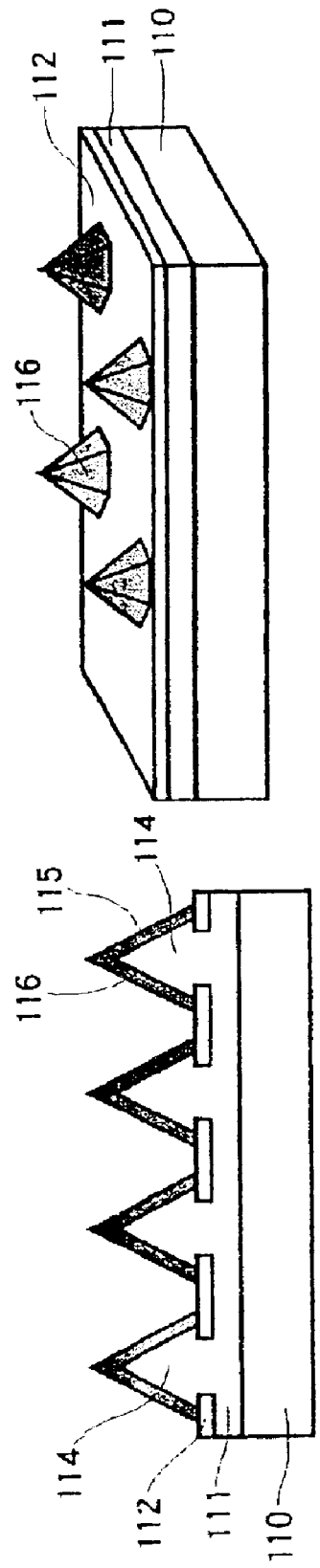

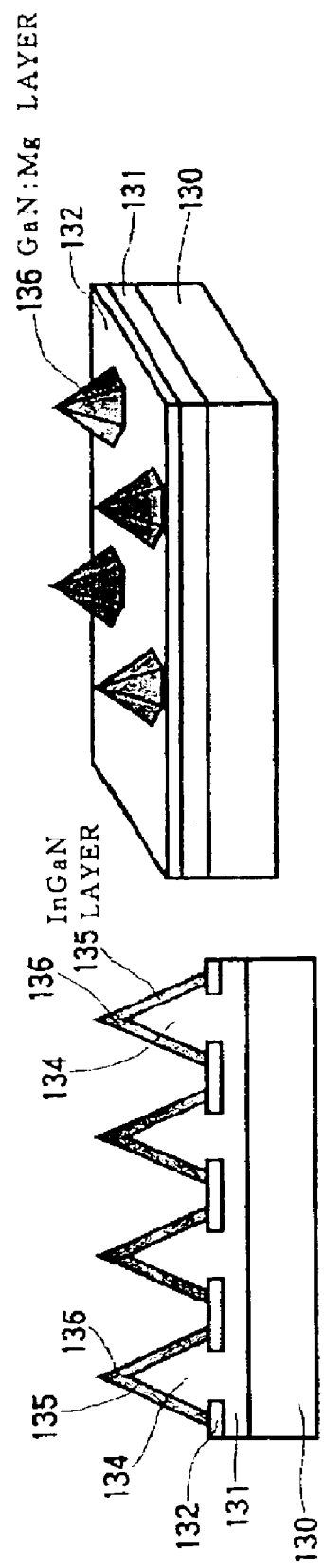

152 MASK LAYER
151 GaN:Si LAYER
150 SAPPHIRE SUBSTRATE

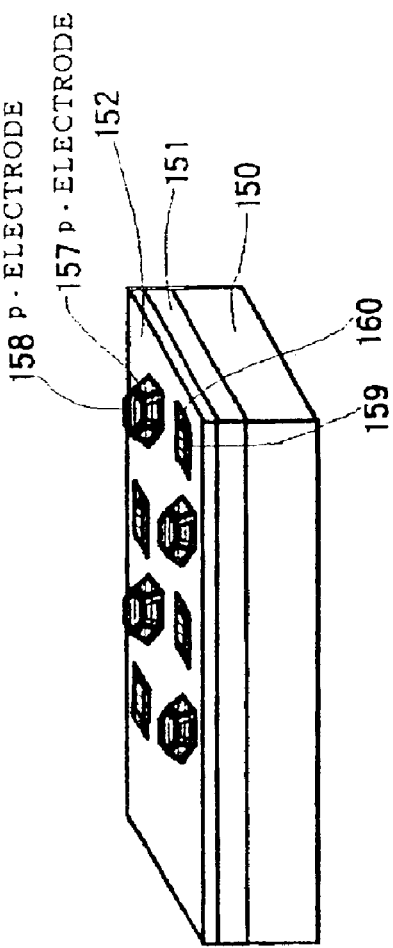
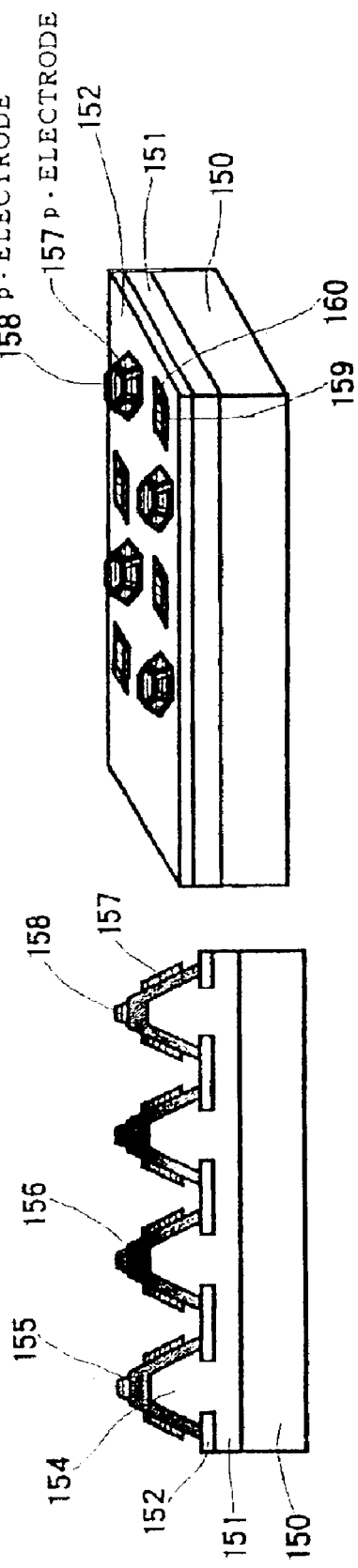

SEMICONDUCTOR LIGHT-EMITTING DEVICE AND SEMICONDUCTOR LIGHT-EMITTING DEVICE

BACKGROUND OF THE INVENTION

The present invention relates to a semiconductor light-emitting element making use of a compound semiconductor having a Wurtzite-type crystal structure and also to a semiconductor light-emitting device, an image display device and an illumination device, each using such a semiconductor light-emitting element making use of the compound semiconductor as mentioned above. More particularly, the present invention relates to a semiconductor light-emitting element capable of emitting multi-color or white light by use of a compound semiconductor having a Wurtzite-type crystal structure and also to a semiconductor light-emitting device, an image display device and an illumination device.

For a semiconductor light-emitting element, there is known an element which includes, entirely on a sapphire substrate, a builtup layer including a low temperature buffer layer, an n-type contact layer made of GaN doped with Si (silicon), an n-type clad layer made of Si-doped GaN formed on the contact layer, an active layer made of Si-doped InGaN, a p-type clad layer made of Mg-doped AlGaN, a p-type contact layer made of Mg (magnesium) doped GaN and the like. Commercially available products having such a structure as mentioned above have been mass-produced including blue and green LEDs (Light Emitting Diodes) with wavelengths ranging from 450 nm to 530 nm.

By the way, an image display device can be constituted by providing individual pixels through combinations of blue, green and red diodes and lasers, arranging the pixels in matrices and independently driving them. Moreover, blue, green and red light-emitting elements are subjected to simultaneous light emission and, thus, can be utilized as a white light-emitting device or an illumination device. In particular, a light-emitting element using a nitride semiconductor has a band gap energy ranging from about 1.9 eV to about 6.2 eV. Thus, it becomes possible to provide a full-color display by use of only one material, so that studies on a multi-color light-emitting element have been in progress.

For a technique of forming multi-color light-emitting elements on the same substrate, there is known an element wherein a number of active layers having different band gap energies depending on the difference in light-emitting wavelength are built up, and while a common electrode is used at the substrate side, counter electrodes are formed individually for different colors. Moreover, there is also known an element which has such a structure that a substrate has a stepped surface for electrode terminals wherein the respective steps corresponds to different colors. The element wherein a number of pn-junctions are built up in such a way as set out above has the possibility that a light-emitting element works as a thyristor within the same element. In order to prevent the thyristorlized operations, there is known an element wherein a groove is formed at every stepped portion for isolating the respective colors from one another. Such an element is disclosed, for example, in Japanese Patent Laid-open No. Hei 9-162444. The light-emitting element disclosed in Japanese Patent Laid-open No. Hei 9-92881 enables multi-color light emission wherein an InGaN layer is formed on an alumina substrate via an AlN buffer layer wherein Al is doped at a part of the InGaN layer thereby causing blue light to be emitted, P is doped at another part to cause red light to be emitted and a non-doped region of the InGaN layer is provided as a green light emission region, thus permitting multi-color light emission.

However, with such a semiconductor light-emitting element having such a structure as set out above, the fabrication process becomes complicated, so that the light-emitting element cannot be formed in high precision. Moreover, because crystallinity is degraded, good light-emitting characteristics cannot be obtained.

More particularly, with an element of the type wherein a groove is formed in every stepped portion for an intended color to permit isolation of individual colors, the regions of the respective active layers whose band gap energies differ from each other are isolated through etching, thus making it necessary to perform multiple anisotropic etching cycles. In general, however, a substrate and a semiconductor layer may suffer degradation in crystallinity depending on the manner of dry etching and, especially, where multiple etching cycles are performed, an element is formed through crystal growth from the surface of a substrate, where exposed by etching, in a second and subsequent etching cycles, thus making it difficult to keep crystallinity at a high level. When multiple etching cycles are carried out, the numbers of the steps of mask alignment and etching increase correspondingly, resulting in the increased fabrication costs of the element.

Further, in a technique of selectively doping an impurity in a single active layer formed on a substrate where openings of a mask layer are utilized, for example, for the selective doping, the layout of the respective emission colors has to be determined while taking into account a positional error such as an opening-forming margin of the mask layer. Where the error is taken into account beforehand, it is necessary to take a sufficient distance between the regions of different emission colors. Accordingly, where it is intended to form a minute or fine element, the regions for emission of different colors increase in size. In addition, it is as a matter of fact that the steps increase in number owing to the selective doping.

Hence, the present invention has been made in view of the problems set out above and provides a semiconductor light-emitting element having such a structure that is formed in high precision and does not invite any degradation of crystallinity without complicating a fabrication process thereof. The present invention is also directed to a semiconductor light-emitting device, along with the provision of an image display device and an illumination device each having a structure using such excellent semiconductor light-emitting element and semiconductor light-emitting device as mentioned above.

SUMMARY OF THE INVENTION

The semiconductor light-emitting element of the present invention includes a selective crystal growth layer formed by selectively growing a compound semiconductor of a Wurtzite type, a clad layer of a first conduction type, an active layer and a clad layer of a second conduction type, which are formed on the selective crystal growth layer, wherein part or all of the active layer is formed as extending in parallel to different crystal planes, respectively, and a first light-emitting wavelength region and a second light-emitting wavelength region whose light-emitting wavelengths are different from each other are formed at the active layer and are arranged in such a way that an electric current is chargeable into the first light-emitting wavelength region and the second light-emitting wavelength region, respectively.

As a measure for performing the selective growth, the selective crystal growth layer may be selectively grown from the opening of the mask layer formed, for example, on an underlying crystal layer, or may be selectively grown from a seed crystal region formed on the substrate, or the underlying crystal layer may be processed to provide an irregular surface, followed by selective growth from the irregular portions. In the semiconductor light-emitting element of the present invention, an arrangement including, aside from the first light emission region and the second light emission region whose light-emitting wavelengths differ from each other, a third light-emitting wavelength region having a further different light-emitting wavelength, may be used.

Another type of semiconductor light-emitting element according to the present invention is characterized by including a selective crystal growth layer formed by selectively growing a compound semiconductor of a Wurtzite type, a clad layer of a first conduction type, an active layer and a clad layer of a second conduction type, formed on the selective crystal growth layer, wherein the active layer is constituted of a ternary or more mixed crystal material such that the diffusion length of an atom constituting part of the mixed crystal material is made shorter than the extending length of the active layer, so that a first light-emitting wavelength region and a second light-emitting wavelength region having light-emitting wavelengths different from each other are formed at the active layer, respectively, and are arranged in such a way that an electric current is chargeable into the first light-emitting wavelength region and the second light-emitting wavelength region, respectively.

The respective light emission regions of the semiconductor light-emitting element whose light-emitting wavelengths are different from each other may be utilized as pixels, thereby constituting an image display device. Moreover, a number of such semiconductor light-emitting elements as stated above may be arranged to constitute an illumination device.

With the semiconductor light-emitting element of the present invention, the selective crystal growth layer is formed through selective growth, so that the selective crystal growth layer formed by the selective growth readily provides a required shape having different crystal planes on the surface thereof. Where the clad layer of the first conduction type, active layer and clad layer of the second conduction type are formed on the selectively crystal growth layer having different crystal planes on the surface thereof as extending in parallel to these crystal planes, the number of bonds may differ in every crystal plane. The difference in the number of bonds depending on the crystal plane will determine the amount of atoms being taken in, which influences a band gap energy. Thus, the amount of atoms being taken in, which influences the band gap energy, differs depending on the difference in crystal plane, with the result that regions having different light-emitting wavelengths can be obtained. The first light emission region and the second light emission region are, respectively, formed at such regions having different light-emitting wavelengths and are so arranged to be charged with an electric current thereinto, thereby enabling multi-color light emission from one element.

In this semiconductor light-emitting element of the present invention, because the band gap energy is changed within the same active layer, the extending size of the active layer is made shorter than the diffusion lengths of mixed crystal-constituting atoms, which influence the band gap energy. This leads to the fact that the mixed crystal-constituting atoms do not migrate uniformly and, thus, the concentrations of the mixed crystal-constituting atoms vary, thereby causing light-emitting wavelengths to be differed from one another within the same active layer.

A further type of semiconductor light-emitting element of the present invention is characterized by including a selective crystal growth layer formed by selectively growing a compound semiconductor of a Wurtzite type, a clad layer of a first conduction type, an active layer and a clad layer of a second conduction type, formed on the selective crystal growth layer, wherein a first light-emitting wavelength region and a second light-emitting wavelength region, which are different from each other with respect to the light-emitting wavelength due to the difference in at least one of a composition and a thickness thereof, are formed at the active layer, respectively, and are arranged in such a way that an electric current is chargeable into the first light-emitting wavelength region and the second light-emitting wavelength region, respectively.

As a measure for performing the selective growth for the element formation, the selective crystal growth layer may be selectively grown from the opening of a mask layer formed, for example, on an underlying crystal layer, or may be selectively grown from a seed crystal region formed on the substrate, or the underlying crystal layer may be processed to provide an irregular surface, followed by selective growth from the irregular portions.

The first light-emitting wavelength region and the second light-emitting wavelength region formed in the active layer: can be arranged to have such a structure that they are, respectively, formed on a side portion of a contact line between the planes of the selectively crystal growth layer and also on a plane portion of the selective crystal growth layer. The planes of the selective crystal growth layer may have an S plane in a plane orientation, at least, different from the principal plane of the substrate. Moreover, the semiconductor light-emitting element of the present invention may include, in addition to the first light-emitting wavelength region and the second light-emitting wavelength region whose light-emitting wavelengths differ from each other, a third light-emitting wavelength region having a further different light-emitting wavelength.

A semiconductor light-emitting device according to a still further embodiment of the present invention is characterized by including a substrate, a number of selective crystal growth layers formed by selectively growing a compound semiconductor of a Wurtzite type on the substrate, a clad layer of a first conduction type, an active layer and a clad layer of a second conduction type formed on each of the number of selective crystal growth layers, respectively, wherein two or more light emission groups, each consisting of the number of selective crystal growth layers that are the same or similar to each other with respect to the shape element thereof, are formed on one substrate and the light emission groups, respectively, have light-emitting wavelengths different from each other owing to a difference in the shape element.

These selective crystal growth layers may be selectively formed through openings provided in the mask layer formed on an underlying crystal layer, or may be selectively formed from seed crystal portions formed on the substrate. The shape element can be determined from the shape, dimension and array density of the opening and seed crystal portions.

When individual light emission regions of the semiconductor light-emitting element whose light-emitting wavelengths differ from each other or the light-emitting groups of the semiconductor light-emitting device whose light-emitting wavelength differ from each other are utilized as a pixel, it is possible to make an image display device, or an illumination device obtained by arranging a number of the elements or devices.

With the semiconductor light-emitting element of the present invention, the selective crystal growth layer is formed by selective growth, and the selective crystal grown layer formed by the selective growth may be readily formed as a required shape such as a hexagonal pyramid or a hexagonal trapezoid. Where the clad layer of a first conduction type, the active layer and the clad layer of a second conduction type are, respectively, formed on the selective crystal growth layer, these layers are influenced by the shape element of the selective crystal growth layer formed by the selective growth, resulting in different compositions and thicknesses depending on the underlying shape even if the layers of the same materials are used. Eventually, if the same types of active layers are used, different compositions appear or the thicknesses of such active layers differ from each other, thus leading to different band gap energies. Eventually, there are obtained regions whose light-emitting wavelengths differ from each other. In this way, the first light emission region and the second light emission region are, respectively, formed at regions having different light-emitting wavelengths, and are arranged so that an electric current is chargeable thereinto, thereby enabling the same element to permit multi-color light emission.

With the semiconductor light-emitting device of the present invention, two or more light emission groups, each consisting of a number of selective crystal growth layers whose shape elements are the same or similar to each other, are formed on a substrate. With the light emission groups consisting of the number of selective crystal growth layers whose shape elements are the same or similar to each other, light-emitting wavelengths are similar to each other, but a different light-emitting wavelength is obtained in comparison with a light emission group whose shape element differs from that of the above-mentioned groups.

Additional features and advantages of the present invention are described in, and will be apparent from, the following Detailed Description of the Invention and the Figures.

BRIEF DESCRIPTION OF THE FIGURES

FIG. 1 is a view showing a mask formation step in a fabrication process of a semiconductor light-emitting element of Example 1 of the present invention, including a sectional view (A) in the fabrication process and a perspective view (B) in the fabrication process.

FIG. 2 is a view showing the step of forming a silicon-doped GaN layer in the fabrication process of the semiconductor light-emitting element of Example 1 of the present invention, including a sectional view (A) in the fabrication process and a perspective view (B) in the fabrication process.

FIG. 7 is a view showing the step of forming a mask in the fabrication process of a semiconductor light-emitting element of Example 2 of the present invention, including a sectional view (A) in the fabrication process and a perspective view (B) in the fabrication process.

FIG. 8 is a view showing the step of forming a crystal layer in the fabrication process of the semiconductor light-emitting element of Example 2 of the present invention, including a sectional view (A) in the fabrication process and a perspective view (B) in the fabrication process.

FIG. 9 is a view showing the step of forming an active layer and the like in the fabrication process of the semiconductor light-emitting element of Example 2 of the present invention, including a sectional view (A) in the fabrication process and a perspective view (B) in the fabrication process.

FIG. 10 is a view showing the step of forming electrodes in the fabrication process of the semiconductor light-emitting element of Example 2 of the present invention, including a sectional view (A) in the fabrication process and a perspective view (B) in the fabrication process.

FIG. 16 is a view showing the step of forming electrodes in the fabrication process of the semiconductor light-emitting element of Example 3 of the present invention, including a sectional view (A) in the fabrication process and a perspective view (B) in the fabrication process.

FIG. 30 is a view showing the step of forming an active layer and the like in the fabrication process of the semiconductor light-emitting element of Example 7 of the present invention, including a sectional view (A) in the fabrication process and a perspective view (B) in the fabrication process.

FIG. 36 is a view showing the step of forming an active layer and the like in the fabrication process of the semiconductor light-emitting element of Example 8 of the present invention, including a sectional view (A) in the fabrication process and a perspective view (B) in the fabrication process.

FIG. 43 is a view showing the step of forming electrodes in the fabrication process of the semiconductor light-emitting element of Example 9 of the present invention, including a sectional view (A) in the fabrication process and a perspective view (B) in the fabrication process.

DETAILED DESCRIPTION OF THE INVENTION

Figure 3A:
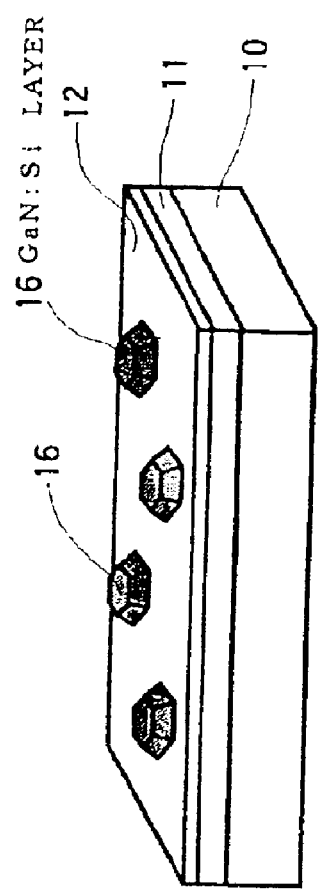
FIG. 3 is a view showing the step of forming an active layer and the like in the fabrication process of the semiconductor light-emitting element of Example 1 of the present invention, including a sectional view (A) in the fabrication process and a perspective view (B) in the fabrication process.

The semiconductor light-emitting element (first semiconductor light-emitting element) of the present invention is characterized by including a selective crystal growth layer formed by selectively growing a compound semiconductor of a Wurtzite type, a clad layer of a first conduction type, an active layer and a clad layer of a second conduction type, which are formed on the selective crystal growth layer, wherein part or all of the active layer is formed as extending in parallel to different crystal planes, respectively, and a first light-emitting wavelength region and a second light-emitting wavelength region whose light-emitting wavelengths are different from each other are formed at the active layer and are arranged in such a way that an electric current is chargeable into the first light-emitting wavelength region and the second light-emitting wavelength region, respectively.

Another type of semiconductor light-emitting element (second semiconductor light-emitting element) of the present invention includes by comprising a selective crystal growth layer formed by selectively growing a compound semiconductor of a Wurtzite type, a clad layer of a first conduction type, an active layer and a clad layer of a second conduction type, formed on the selective crystal growth layer, wherein the active layer is constituted of a ternary or more mixed crystal material such that the diffusion length of an atom constituting part of the mixed crystal material is made shorter than the extending length of the active layer, so that a first light-emitting wavelength region and a second light-emitting wavelength region having light-emitting wavelengths different from each other are formed at the active layer, respectively, and are arranged in such a way that an electric current is chargeable into the first light-emitting wavelength region and the second light-emitting wavelength region, respectively.

A further type of semiconductor light-emitting element (third semiconductor light-emitting element) of the present invention includes a selective crystal growth layer formed by selectively growing a compound semiconductor of a Wurtzite type, a clad layer of a first conduction type, an active layer and a clad layer of a second conduction type, formed on the selective crystal growth layer, wherein a first light-emitting wavelength region and a second light-emitting wavelength region, which are different from each other with respect to the light-emitting wavelength due to the difference in at least one of a composition and a thickness thereof, are formed at the active layer, respectively, and are arranged in such a way that an electric current is chargeable into the first light-emitting wavelength region and the second light-emitting wavelength region, respectively.

In the respective semiconductor light-emitting elements of the present invention, the selective crystal growth layer is formed on the substrate. Such a substrate is not critically limited to any specific one so far as the selective crystal growth layer described hereinafter can be formed, for which various types of materials may be used. Those materials usable as the substrate include sapphire ($Al_2O_3$, including A, R and C planes), SiC (including 6H, 4H and 3C), GaN, Si, ZnS, ZnO, AlN, LiMgO, GaAs, $MGal_2O_4$, InAlGaN and the like. Preferably, hexagonal system substrates or cubic system substrates made of these materials are used, of which hexagonal system substrates are more preferably used. For instance, where a sapphire substrate is used, there can be used a sapphire substrate having a C plane as a principal plane, which has been frequently employed for the growth of a gallium nitride (GaN) compound semiconductor. In this case, the C plane used as the principal plane of the substrate includes a plane orientation inclined within a range of 5 to 6 degrees.

The selective crystal growth layer formed on the substrate by selective growth may be made of a compound semiconductor of a Wurtzite type, which is capable of forming an active layer, among a clad layer of a first conduction type, an active layer and a clad layer of a second conduction type formed on the selective crystal growth layer, in such a way that at least one of the composition and thickness of the active layer differs at portions within the region of the same active layer, and is thus not critical. In particular, there is preferably used a semiconductor layer that has a Wurtzite-type crystal structure having a crystal plane (i.e., an S plane or a plane substantially equivalent to the S plane in the third semiconductor light-emitting element) inclined relative to the principal plane of the substrate. More particularly, nitride semiconductors, BeMgZnCdS compound semiconductors and BeMgZnCdO compound semiconductors and the like, which have the Wurtzite-type crystal structure, are preferred. As the crystal layer made of a nitride semiconductor, there may be used, for example, compound semiconductors of group III elements. Preferably, a gallium nitride (GaN) compound semiconductor, an aluminium nitride (AlN) compound semiconductor, an indium nitride (InN) compound semiconductor, an indium gallium nitride (InGaN) compound semiconductor, and an aluminium gallium nitride (AlGaN) compound semiconductor are used, of which a gallium nitride compound semiconductor is more preferred. It will be noted that in the practice of the present invention, InGaN, AlGaN, GaN and the like do not always mean nitride semiconductors of a ternary mixed crystal alone or a binary mixed crystal alone, but with InGaN, for example, a small amount of Al or other types of impurities may be present within a range not causing the action of InGaN to be changed, which is, of course, within the scope of the present invention.

The crystal plane inclined relative to the principal plane of the substrate includes the crystal planes of the Wurtzite type of (0001) plane, (1-100) plane, (1-101) plane, (11-20) plane, (1-102) plane, (1-123) plane, (11-22) plane and the like, and also include plane orientations, which are planes substantially equivalent to the planes mentioned above, inclined relative to the above crystal planes within a range of 5 to 6 degrees. Similarly, the planes substantially equivalent to the S plane include plane orientations inclined relative to the S plane within a range of 5 to 6 degrees. The term nitride used herein refers to compounds containing B, Al, Ga, In and Ta as elements of Group III and N as an element of Group V, in which a small amount of an impurity may be incorporated.

The growing methods of the selective crystal growth layer include various vapor phase growth methods including, for example, vapor phase growth methods such as a metallo-organic compound vapor deposition method (MOCVD (MOVPE) method), a molecular beam epitaxy method (MBE method) and the like, and a hydride vapor phase epitaxial growth method (HVPE method). When the MOVPE method is used among them, a highly crystalline layer can be rapidly obtained. In the MOVPE method, alkyl metal compounds are frequently used, including TMG (trimethyl gallium) and TEG (triethyl gallium) as a Ga source, TMA (trimethyl aluminium) and TEA (triethyl aluminium) as an Al source, TMI (trimethyl indium) and TEI (triethyl indium) as an In source, and the like, and a gas such as ammonia or hydrazine is used as a nitrogen source. For impurity sources, there are used gases including a silane gas for Si, a germanium gas for Ge, Cp2Mg (cyclopentadienyl magnesium) for Mg, DEZ (diethyl zinc) for Zn, and the like. In the. MOVPE method, these gases are supplied to the surface of a substrate heated, for example, to 600° C. or higher whereupon the gases are decomposed, thereby causing an InAlGaN compound semiconductor to be epitaxially grown.

Especially, in the practice of the present invention, the selective crystal growth layer may be selectively grown, for example, from an opening of a mask layer formed on an underlying crystal layer. Alternatively, the layer may be selectively grown from a seed crystal portion formed on the substrate. Still alternatively, an underlying crystal layer may be processed to have irregular surfaces, followed by selective growth from the irregular portions. The underlying crystal layer may have a structure made of a gallium nitride or an aluminium nitride layer, for example, and made of a combination of a low temperature buffer layer and a high temperature buffer layer or a combination of a buffer layer and a crystal species layer serving as a crystal seed. Like the selective crystal growth layer, the underlying crystal layer may be formed by various vapor growth methods including, for example, a metallo-organic compound vapor phase epitaxial growth method (MOVPE method), a molecular beam epitaxial method (MBE method), a hydride vapor phase epitaxial growth method (HVPE method) and the like. When the growth of the selective crystal growth layer is started from a low temperature buffer layer, polycrystals are liable to be deposited on a mask, thus presenting a problem. To avoid this, a crystal seed layer is provided, after which a plane or planes different from that of the substrate are grown, under which there can be grown a crystal of better crystallinity. In order to effect crystal growth by use of selective growth, it becomes necessary to initially form a buffer layer in the absence of a crystal seed layer. If the selective growth commences from the buffer layer, growth is apt to occur at a portion that is impeded in growth and is unnecessary for growth. Accordingly, when using the crystal seed layer, a crystal can be selectively grown in a region where the growth is necessary. The buffer layer may have the purpose of mitigating lattice mismatching between the substrate and the nitride semiconductor. Accordingly, where a substrate which has a lattice constant close to or in coincidence with that of a nitride semiconductor is used, the buffer layer may not be formed in some cases. For instance, a buffer layer may be formed on SiC without rendering AlN low in temperature. Likewise, AlN and GaN may be, in some cases, grown on a Si substrate as a buffer layer without making them low in temperature. Nevertheless, high-quality GaN can be formed. A structure having no buffer layer may be used, and a GaN substrate may be used.

According to an embodiment of the present invention, the mask layer used for the selective growth is made, for example, of an insulating layer such as a silicon oxide layer or a silicon nitride layer, with its thickness being, for example, in the range of 100 to 500 nm. The mask layer formed on the underlying crystal layer is formed of openings, through which a selective crystal growth layer is grown. For the formation of the openings, a photolithographic technique and a given type of etchant are used. The size of the opening is determined depending on the characteristics of an intended light-emitting element. For one instance, the opening has a size of approximately 10 µm, and may have various shapes including rectangular, square, circular, hexagonal, triangular, rhombic, ellipsoidal and the like forms. The selective growth may be carried out according to a method using no mask layer. For instance, the crystal seed layer on a buffer layer or a substrate may be finely, sporadically divided into crystal seed portions each having a size of approximately 10 µm, and the selective crystal growth layer may be formed through crystal growth from individual crystal seed portions. For example, the finely divided crystal seed portions may be arranged as kept away from one another while taking into account margins for isolation as individual light-emitting elements. Individual small regions may take various forms such as circular, square, hexagonal, triangular, rectangular, rhombic, and ellipsoidal forms along with their modifications. The crystal growth from the crystal seed portions is effected such that a selective mask is made, under which a masked portion is left and the others are etched to obtain seed crystal portions, from which selective growth is developed. A multi-color element is substantially similarly obtained while changing electrodes, whereupon an influence of contamination with the mask is lessened. Another method of growing the selective crystal growth layer is one wherein an underlying crystal layer is processed to provide irregular surfaces, and selective growth starts from the irregular portions. The method of processing the surface of the underlying crystal layer in the form of irregularities includes, for example, a photolithographic technique and a given etching technique. Other irregularity-forming methods may be used as well. The processings such as etching and the selective growth on the processed surface enable the wavelength to differ depending on the location or position. A striped S plane or a 11-22 plane may be formed at a portion having a planar structure where it is intended to change a wavelength. Thus, the portion alone is rendered longer in wavelength, so that a longer wavelength region than at a planar portion can be made by only one epitaxial growth. The processing in the form of irregularities used herein refers to such a processing of forming a striped S plane or an 11-22 plane or the like, and the processed portion may be in the form of stripes or a rectangles. When the stripes are changed in width, two or more different wavelength portions may be made, thus making it possible to permit three primary color light emission. In this way, even with a planar structure, growth for three-color emission can be simply performed by the initial etching.

When the selective growth is used and a window region that is an opening of the mask layer is made in the form of a circle with approximately 10 µm in diameter (or a hexagon whose sides are in a 1-100 direction, or a hexagon whose sides are in a 11-20 direction), a selective growth region having an area of about twice the circle can be simply formed. If the S plane is in a direction different from the principal plane of a substrate, an effect of bending or covering a dislocation develops, so that the dislocation density can be conveniently reduced. Where a substantially hexagonal pyramidal trapezoid or a substantially hexagonal pyramid has such a shape as extending linearly, the hexagonal pyramidal trapezoid or hexagonal pyramid that has a lengthwise direction can be formed when the window region of the mask layer is in the form of a band or the crystal seed layer is in the form of a band.

In the semiconductor light-emitting element of the present invention, the selective crystal growth layer is formed by selective growth, so that it is possible to readily form an S plane or a plane substantially equivalent to the S plane. The S plane is a stable plane obtained upon selective growth on a C+ plane and is, one which is relatively easy to obtain, with its index of plane of the hexagonal system being at (1-101). Like the case where a C plane includes a C+ plane and a C– plane, the S plane includes a S+ plane and S– plane. In the present specification, unless otherwise indicated, an S+ plane is grown on GaN of a C+ plane and is illustrated as an S plane. It will be noted that as for the S plane, an S+ plane is a stable plane. The index of plant of the C+ plane is at (0001). With respect to the S plane, where a crystal layer is constituted of a gallium nitride compound semiconductor as having set forth hereinbefore, the number of bonds is from Ga to N ranges 2 or 3 on the S plane, which is second to the C– plane. The C– plane is not obtained, in fact, on the C+ plane, so that the number of bonds on the S plane is largest. For instance, where a nitride is grown on a sapphire substrate having a C+ plane as a principal plane, the surface of the nitride of the Wurtzite type generally becomes a C+ plane, and when using selective growth, the S plane can be stably formed. N that is liable to eliminate from a plane parallel to the C+ plane has only one bond from Ga, whereas with an inclined S plane, at least one or more bonds contribute to the bonding. Accordingly, a V/III ratio effectively increases, with the attendant advantage that the crystallinity of a built-up structure is improved. Moreover, growth in an orientation different from that of a substrate may result in the bend of a dislocation extending upwardly from the substrate, thus being advantageous in reducing defects in number.

In the semiconductor light-emitting element of the present invention, the selective crystal growth layer made of a compound semiconductor may have such a structure that the S plane or a plane substantially equivalent to the S plane constitutes inclined surfaces of a substantially hexagonal pyramid, respectively. Alternatively, the layer may have such a structure that the S plane or a plane substantially equivalent to the S plane, respectively, constitutes the inclined planes of a substantially hexagonal pyramidal trapezoid and the C plane or a plane substantially equivalent to the C plane constitutes an upper planar plane portion of the substantially hexagonal pyramidal trapezoid. These substantially hexagonal pyramid and substantially hexagonal pyramidal trapezoid do not need an exact hexagonal pyramid and include those wherein some planes are lost. Moreover, the ridgeline between crystal planes of the crystal layer may not always be linear. The substantially hexagonal pyramid and substantially hexagonal pyramidal trapezoid may take such a form as extend linearly or in the form of a band.

In the experiments carried out in connection with the present invention, when a hexagonal pyramidal form grown by use of a cathode luminescence is observed, it has been found that the crystal at the S plane is of good quality and is higher in luminous efficiency in comparison with the C+ plane. Especially, the growth temperature of an InGaN active layer ranges from 700 to 800° C., the decomposition efficiency of ammonia is low, so that a larger amount of N species is necessary. The observation of the surface via AFM reveals a plane which has regularly stepped portions and is thus suited for taking InGaN therein. Besides, although the growth surface of an Mg-doped layer is usually poor with respect to the surface state at the AFM level, the Mg-doped layer is grown as having a good surface state owing to the growth of the S plane. In addition, it has been found that doping conditions significantly differ from each other. Moreover, when microscopic photoluminescence mapping is performed, measurement is possible at a resolution of approximately 0.5 to 1 µm. According to an ordinary method of growth on the C+ plane, there exist irregularities of approximately 1 µm pitches. In contrast, samples where the S plane is obtained through selective growth give uniform results. The flatness of inclined planes as seen through SEM is better than that of the C+ plane.

When selective growth is performed using a selective growth mask and growth is made only on a portion at the opening of the selective mask, growth in lateral directions does not exist. When growth in lateral directions is made by use of microchannel epitaxy, a layer may be formed as extending from the window region. It has been known that through-type dislocations are more liable to be avoided in case where growth in lateral directions is performed by use of the microchannel epitaxy, thus reducing the dislocations in number. Such lateral direction growth results in an increasing number of light-emitting regions, along with the advantages of the uniformity of an electric current, the avoidance of an electric current being concentrated, and the reduction of a current density.

The respective semiconductor light-emitting elements of the present invention includes a clad layer of a first conduction type, an active layer and a clad layer of a second conduction type formed on the selective crystal growth layer. The first conduction type clad layer may be a p-type or an n-type clad layer, and the second conduction type is an opposite conduction type. For instance, where the crystal layer (i.e., a crystal layer constituting the S plane in the third semiconductor light-emitting element) constituting an underlying layer of the active layer is made of a silicon-doped gallium nitride compound semiconductor layer, the n-type clad layer is constituted of a silicon-doped gallium nitride compound semiconductor layer, on which an InGaN layer is formed as the active layer and a magnesium-doped gallium nitride compound semiconductor layer is further formed as the p-type clad layer, thereby forming a double hetero structure. There may be used a structure wherein the InGaN layer serving as the active layer may be sandwiched between the AlGaN layers, or a structure wherein the AlGaN layer is formed only at one side. Although the active layer may be constituted of a single bulk active layer, it may be one which is formed with a quantum well structure including a single quantum well (SQW) structure, a double quantum well (DQW) structure, a multiple quantum well (MQW) structure or the like. The quantum well structure may be used in combination with a barrier layer for isolation of quantum wells from each other, if necessary. Where the active layer is made of an InGaN layer, the resultant structure is easy to fabricate in view of the fabrication process, thus permitting good light emission characteristics of the element. Moreover, the InGaN layer is very likely to be crystallized upon growth on the S plane wherein a nitrogen atom is unlikely to eliminate, and better crystallinity is obtained, thus resulting in an increasing luminous efficiency. It will be noted that a nitride semiconductor, even not doped, has a tendency of conversion to an n-type because of the hole of nitrogen made in a crystal, and generally can be converted to an n-type having a favorable carrier concentration when doped with a donor impurity, such as Si, Ge, Se or the like, in the course of crystal growth. In order to make a p-type nitride semiconductor, it is sufficient to dope an acceptor impurity, such as Mg, Zn, C, Be, Ca, Ba or the like, in a crystal. For obtaining a p-type layer having a high carrier concentration, it is preferred that, after doping of an acceptor impurity, the layer is annealed in an atmosphere of an inert gas such as nitrogen, argon or the like at a temperature of 400° C. or more. Besides, there are known a method of activation such as by electron beam irradiation and a method of activation by microwave irradiation or light irradiation. Such an active layer preferably should be constituted of a semiconductor crystal layer formed by one cycle of growth. The one cycle of growth refers to growth by a single film-forming treatment or a series of continuous film-forming treatments, not including the step of forming an active layer, per se, many times.

With the semiconductor light-emitting element (first semiconductor light-emitting element) utilizing different crystal planes according to the present invention, the clad layer of a first conduction type, active layer and clad layer of a second conduction type are extended over different crystal planes formed by elective growth within planes parallel to the different crystal planes. Such an extension within the plane can be readily achieved by forming a surface wherein a crystal is selectively grown and subsequently continuing the crystal growth. Where the crystal layer is in the form of a substantially hexagonal pyramidal trapezoid and individual inclined surfaces are made of the S plane or the like, the emission region made of the clad layer of a first conduction type, the active layer and the clad layer of a second conduction type can be formed on all or part of the S planes, and the first conduction-type clad layer, active layer and the second conduction-type clad layer are formed on the C plane parallel to the principal plane of the substrate. When light is emitted by utilizing an inclined S plane, the light is attenuated through multiple reflection for a parallel plate. In this connection, however, if there is an inclined plane, an advantage is found in that light escapes from the influence of multiple reflection and can come out of the semiconductor. The first conduction-type clad layer can be made of the same type of material as the crystal layer formed by the selective growth along with the same conduction type as the crystal layer. After the formation of the crystal layer constituting the S plane or the like, the clad layer can be continuously formed while controlling a concentration. In another instance, there may be arranged such a structure that part of the crystal layer serving as the S plane functions as the first conduction-type clad layer.

In the semiconductor light-emitting element using different crystal planes according to the present invention, where planes other than the C plane, such as the S plane inclined by selective growth, are formed, the luminous efficiency can be enhanced by utilizing good crystallinity of the S plane and the like. Especially, when an electric current is charged into the S plane alone having good crystallinity, the luminous efficiency can be made high because the S plane has a good uptake of In with good crystallinity. For the multi-color light emission using an InGaN active layer, it is necessary that In be sufficiently taken in as a crystal. The luminous efficiency can be enhanced by utilizing the good crystallinity of the S plane, and a structure desirable for the multi-color light emission is obtained. More particularly, N that is liable to eliminate so far as it is grown on the C+ plane has only one bond from Ga. So far as ammonia that is low in decomposition efficiency is used for the growth, an effective V/III ratio cannot be made great. Thus, for good-quality crystal growth, many considerations are needed. However, for the growth on the S plane, N is joined to Ga through 2 or 3 bonds thereof, with the tendency that the N is unlikely to eliminate. Thus, the effective V/III ratio is considered to become high. With the growth not only on the S plane, but also on planes other than the C+ plane, the number of bonds of from Ga to N tends to increase, so that the growth without use of the C+ plane, in fact, results in a greater uptake of In in the crystal. The great uptake of In is suitable for multi-color emission because the band gap energy is dominated by the uptake of In.

The different crystal planes preferably include two or more crystal planes selected from Wurtzite-type (0001) plane (C plane), (1-100) plane (M plane), (1-101) plane (S plane), (11-20) plane (A plane), (1-102) plane (R plane), (1-123) plane (N plane), (11-22) plane, and crystal planes equivalent thereto. Especially, the uptake of a mixed crystal constituent atom such as In is greatly changed from the combination of the C plane and a plane other than the C plane, and wavelengths are significantly varied from each other within the same active layer, thus being suited for multi-color emission.

In the semiconductor light-emitting element of the present invention, a first light-emitting wavelength region and a second light-emitting wavelength region whose emission wavelengths differ from each other are formed. Moreover, in addition to the first light-emitting wavelength region and the second light-emitting wavelength region, a third light-emitting wavelength region may be formed so as to permit three emission wavelengths to be emitted from the same element.

For the semiconductor light-emitting element (second semiconductor light-emitting element) using a diffusion length of a mixed crystal constituent atom, where the active layer is constituted of an InGaN active layer, for example, a semiconductor light-emitting element of a longer wavelength can be constituted by increasing the amount of In present in the active layer. More particularly, in the crystal growth of the InGaN layer, the diffusion length of InGaN, particularly, In (i.e., a migration length) is estimated at about 1 to 2 μm at approximately 700° C. that is substantially optimized for the crystal growth of the InGaN layer having a relatively great concentration of In. This is because the InGaN deposited on the mask is grown only at about 1 to 2 μm from a selectively grown portion. In view of this, the diffusion length of In is considered to be at such a level, and the migration length such as of In in InGaN, which ranges from the masked portion to the grown portion, is relatively short, so that the compositions of In or the thicknesses of InGaN in the plane may differ from each other.

The wavelength from the active layer tends to relatively change depending on the position within a plane or on the substrate, which is considered to result from the fact that the diffusion distance of In is shortened at approximately 700° C. that is suitable for the growth of InGaN. The semiconductor light-emitting element of the present invention make positive use of the change in emission wavelength depending on the region within the same active layer. Regions capable of emitting substantially the same wavelength are taken as one region, and the element is so arranged that an electric current is, respectively, chargeable into the first light-emitting wavelength region and the second light-emitting wavelength region whose emission wavelengths differ from each other. The first light-emitting wavelength region and the second light-emitting wavelength region are independently formed with electrodes so as to charge an electric current independently. One of the electrodes may be used commonly. Two or three or more regions whose wavelengths differ from one another are formed in the same active layer and are independently applied with an electric current to constitute a multi-color semiconductor light-emitting element. Further, when elements for different color light emissions are controlled to permit light emission simultaneously, there can be arranged a semiconductor mixed color or white color light-emitting element.

On the other hand, with the semiconductor light-emitting element (third semiconductor light-emitting element) of the present invention which makes use of a different In composition or film thickness, the first conduction-type clad layer, active layer and second conduction-type clad layer are extended, for example, within the S plane formed by selective growth or within a plane parallel to a plane substantially equivalent to the S plane. The extension within the plane is readily feasible when crystal growth is continued during the formation of the S plane or the like. The crystal layer is shaped in the form of a substantially hexagonal pyramid or a substantially hexagonal pyramidal trapezoid. Where individual inclined planes are made of an S plane or the like, the emission region consisting of the first conduction-type clad layer, active layer and second conduction-type clad layer can be formed on all or part of the S planes. With a substantially hexagonal pyramidal trapezoid, the first conduction-type clad layer, active layer and second conduction-type clad layer can be formed on an upper surface parallel to the principal plane of the substrate. Since light is emitted by use of the inclined S planes, the light is attenuated owing to the multiple reflection for a parallel plate. Nevertheless, the inclined planes are advantageous in that the light does not undergo the influence of the multiple reflection and can come out of the semiconductor. The first conduction-type clad layer can be made of the same type of material with the same conduction type as the crystal layer constituting the S plane. After the formation of the crystal layer constituting the S plane, the clad layer can be continuously formed while controlling a concentration. In another instance, such a structure may be arranged that part of the crystal layer constituting the S plane functions as the first conduction-type clad layer.

The semiconductor light-emitting element of the present invention makes use of good crystallinity of the inclined S planes formed by selective growth, thereby enabling an increasing luminous efficiency. In particular, when an electric current is charged only into the S plane of good crystallinity, the luminous efficiency can be enhanced because the S plane exhibits a good uptake of In and has good crystallinity. For multi-color emission using an InGaN active layer, it is necessary that In is satisfactorily taken in as a crystal. The luminous efficiency can be enhanced by utilizing the good crystallinity of the S plane, with the resultant structure being desirable for multi-color light emission. More particularly, N that is liable to eliminate so far as the crystal is grown on the C+ plane has only one bond from Ga. Thus, insofar as ammonia that is low in decomposition efficiency is used for the growth, the effective V/III ratio cannot be made great, so that many considerations should be made in order to effect high-quality crystal growth. However, for the growth on the S plane, it is considered that N is joined to Ga through 2 or 3 bonds, with the tendency that N is unlikely to eliminate, with the result that the effective V/III ratio becomes high. It can be said that the number of bonds of Ga against N tends to increase not only for growth on the S plane, but also for growth on planes other than the C+ plane, so that growth without use of the C+ plane leads to high-quality layer formation in all cases, and actually the uptake of In to the crystal becomes large. In this way, because the band gap energy is dominated by the uptake of In, a great uptake of In is suitable for multi-color emission.

Taking into account a selective crystal growth layer in the form of a hexagonal pyramid, the stepped state at a portion, in particular, near an apex of the S plane becomes poor and, thus, the luminous efficiency at the apex lowers. This is for the reason that with the hexagonal pyramid-shaped element, the pyramid is divided into four portions, that is an apex side plane, a left side plane, a right side plane and a bottom side plane, about a substantially central portion of individual planes and that, especially, the step at the apex side portion is most waved so that abnormal growth is liable to occur in the vicinity of the apex. In contrast, the two side planes, respectively, have steps that are substantially linear and are densified, ensuring a very good growing state. Slightly wavy steps appear at a portion near the bottom plane, but such abnormal growth as at the apex side does not occur. Thus, in the semiconductor light-emitting element of the present invention, the current charge into the active layer can be so controlled as to be lower in density at the vicinity of the apex than at peripheral sides. In order to pass a low density current at the apex portion, there can be arranged such a structure that electrodes are formed at a side portion of the inclined plane without formation of any electrode at the apex portion, or such a structure that a current block region is formed at the apex portion prior to formation of electrodes.

In the third semiconductor light-emitting element of the present invention, a first light-emitting wavelength region and a second light-emitting wavelength region whose emission wavelengths differ from each other are formed as well. In order to permit three light-emitting wavelengths from the same element, there may be formed, aside from the first light-emitting wavelength region and a second light-emitting wavelength region whose emission wavelengths differ from each other, a third light-emitting wavelength region whose emission wavelength differs. The respective light-emitting wavelength regions have such a structure that different emission wavelengths develop depending on a difference in at least one of the composition and thickness of the active layer. More particularly, it is sufficient to change the composition alone in the active layer or the thickness alone of the active layer, or both the composition and the thickness of the active layer.

For the change of the composition, a mixed crystal ratio of a ternary mixed crystal or a binary mixed crystal constituting the active layer may be changed within the same active layer. For instance, where the active layer is constituted of an InGaN active layer, a greater amount of In in the active layer leads to a semiconductor light-emitting element of a longer wavelength. In the crystal growth of the InGaN layer, the migration length of InGaN (particularly, In), is estimated at about 1 to 2 μm at approximately 700° C., which is optimized for the crystal growth of an InGaN layer having a relatively high composition of In. This is because InGaN deposited on the mask grows to an extent of only about 1 to 2 μm from a selective growth portion. In view of this, the migration length of In is considered to be at such an extent. Thus, the migration length of In in InGaN ranging from the mask portion to the growth portion is relatively short, so that the contents of In and the thicknesses of InGaN may, in some case, differ in the plane of the layer, respectively.

The wavelength of the active layer tends to relatively change depending on the position in the plane or on the substrate. This is considered for the reason that the migration distance of In is shortened at approximately 700° C. that is suited for the growth of InGaN. The semiconductor light-emitting element of the present invention makes the positive use of a change in emission wavelength depending on the region within the same active layer, wherein regions with substantially the same emission wavelength are taken as one region, and the element is so arranged that an electric current is, respectively, chargeable into a first light-emitting wavelength region and a second light-emitting wavelength region whose emission wavelengths differ from each other. The first light-emitting wavelength region and the second light-emitting wavelength region are independently formed with electrodes so as to charge an electric current independently. One of the electrodes may be used commonly. Two or three or more regions whose wavelengths differ from one another are formed in the same active layer and are independently applied with an electric current to constitute a multicolor semiconductor light-emitting element. Further, when elements for different color light emissions are controlled to permit light emission simultaneously, there can be arranged a semiconductor mixed color or white color light-emitting device or element.

In the respective semiconductor light-emitting elements, the formation of a selective crystal growth layer having a hexagonal pyramid structure through selective growth is illustrated. In the case where the selective growth is performed from an opening of a mask layer, the surface of the selective growth region undergoes a change in growing conditions vertically and from a central portion toward an end portion, unlike a planar-type epitaxial structure. For instance, it is considered that with the hexagonal pyramid structure, a lower portion is in a state where the element of group III is rich, with complicated behaviors including the tendency that Ga is reduced in amount toward an upper portion and also with the tendency that the area becomes smaller toward an upper portion, so that the element of group III increases in amount, under which the effective V/III ratio is determined. As for the growing rate, an actual growing rate of GaN and a growing rate of GaN to which In is added differ from each other, and growing conditions are changed depending on the growth temperature. According to certain experimental data, the results of cathode luminescence of a DH (double hetero) structure selectively grown in the form of a hexagonal trapezoid and a hexagonal pyramid reveal that there is obtained a sample whose wavelength is shifted to a longer side by 100 nm from a lower an to upper portion. From the experimental data, it has been found that when different electrodes are provided at the DH structures of the respective wavelength regions, a first light-emitting wavelength region, a second light-emitting wavelength region and a third light-emitting wavelength region whose wavelengths and emission colors differ from one another can be grown by one growth cycle, thereby forming a semiconductor multi-color or white light-emitting element.

In the semiconductor light-emitting element wherein the selective crystal growth layer made of InGaN has a hexagonal pyramid structure or a hexagonal pyramidal trapezoid structure, the concentration of In becomes higher at a central side of the hexagonal pyramid form or the hexagonal pyramidal trapezoid form, with the emission wavelength being longer. In the semiconductor light-emitting element wherein the selective crystal growth layer has a hexagonal pyramid-shaped or hexagonal pyramidal trapezoid-shaped crystal structure, the side, which is a contact line between adjacent planes of the selective crystal growth layer, and the plane portion of the selective crystal growth layer differ in the thickness of the active layer and the mixed crystal ratio depending on the shape, resulting in different emission wavelengths. Accordingly, it is possible to provide a structure wherein a first light-emitting wavelength region is formed at the side portion, which is the contact line of the planes of the selective crystal growth layer, and a second light-emitting wavelength region is formed at a plane portion. When the first and second light-emitting wavelength regions are formed at side portions of the contact lines between planes whose orientations differ from each other and at planes whose orientations differ from each other, respectively, independent drivings for different wavelengths become possible. The uptake of In significantly changes for every plane, and it has been demonstrated from the results of actual photoluminescence that the uptakes at the side portion and the plane portion differ from each other, thus making it easier to perform independent driving for changing a wavelength.

In the respective semiconductor light-emitting elements, electrodes, through which an electric current is chargeable, are independently formed on the first light-emitting wavelength region and the second light-emitting wavelength region whose emission wavelengths differ from each other, and also on a third light-emitting wavelength region whose emission wavelength further differs from the above ones. The electrodes are formed on each of the regions, and either of a p-electrode or an n-electrode may be provided commonly. In order to lower a contact resistance, a contact layer may be formed, after which an electrode is formed on the contact layer. In general, the respective electrodes are each formed of a multi-layered metal film such as by vacuum deposition, and microfabrication may be made according to a lift-off method using photolithography for division into individual regions. The respective electrodes may be formed on one surface of a selective crystal growth layer or a substrate, or may be formed on both sides to arrange the electrodes at a higher density. The independently driven electrodes may be formed by microfabricating the same material. Alternatively, different types of electrode materials may be used for the respective regions.

The electric currents charged into the respective wavelength regions may be independently provided. In this case, when the semiconductor light-emitting element of the present invention is arranged to have such a structure capable of emitting three primary color light rays including RGB (red, green, blue), and CYM (cyan, yellow, magenta), a color image display such as a full color display can be fabricated. Further, when a number of semiconductor light-emitting elements having luminescent colors including three primary colors and two or more colors are arranged as desired, under which the same electric current is charged into the first light-emitting wavelength region and the second light-emitting wavelength region, and also into the third light emission wavelength region of each element, a white light or mixed color light illuminator can be provided. For instance, with an image display device, when the elements are provided in number correspondingly to the primary colors, and are arranged so that independent electric currents are chargeable and scanned, such elements can be utilized as a display with a reduced area. This is for the reason that the S planes are used and, thus, an electrode area can be reduced. With an illumination device, simultaneous light emission can be made using elements whose emission wavelengths differ from one another, thereby permitting generation of white light or mixed color light. Where light-emitting wavelengths emanate two colors, there further may be used a fluorescent material or a dyestuff material in order to obtain a third wavelength color.

In the practice of the present invention, as having stated hereinbefore, not only a single semiconductor light-emitting element capable of multi-color light is provided, but also a semiconductor light-emitting device which can be arranged using a number of semiconductor light-emitting elements so as to constitute light emission groups. In the present specification, the light emission group is a region formed in a number of selective crystal growth layers having the same or similar shape elements, and a first conduction-type clad layer, an active layer and a second conduction-type clad layer are formed on the respective selective crystal growth layers. The light emission group has shape elements that are the same or similar to one another, and has a substantially similar light-emitting wavelength within a range of one light emission group. Two or more light emission groups are formed on one substrate and are capable of emitting different emission wavelengths. Accordingly, light with two or more wavelengths are generated wholly in the device, and such groups are used as a semiconductor light-emitting device as a whole.

Where the selective crystal growth layer is selectively grown through openings provided in a mask layer formed on an underlying crystal layer, the shape element consists of the shape, dimension and array density of the openings. Where the selective crystal growth layer is selectively grown from seed crystal portions formed on a substrate, the shape element consists of the shape, dimension and array density of the seed crystal portions. The shape of the opening or seed crystal portion may be a circle, a square, a hexagon, a triangle, a rectangle, a rhomb, an ellipsoid, a band, other polygonal shapes and modifications thereof, and are selected depending on the emission wavelength of the light emission group. The dimension of the opening or seed crystal portion refers to a diameter, a length, a height, a width or the like size, and is selected depending on the emission wavelength of the light emission group. The array density refers to a distance between adjacent openings or seed crystal portions. Whether a number of openings or seed crystal portions is arranged either closely or roughly is selected depending on the emission wavelength of the light emission group. As a general tendency, when the array density is made low and the distance between adjacent growth layers is made large, the emission wavelength can be made longer. Although light-emitting elements may be formed using the same shape element within the same emission group, there may be arranged, for example, an emission group using a combination of a number of elements having different shapes and dimensions. Alternatively, emission groups per se may extend over mixed regions on a substrate or may be superposed. Such a number of emission groups whose emission wavelengths differ from one another are formed with electrodes, respectively, and the same signal or independent signals are applied to the respective electrodes to control the device.

The present invention is described in more detail by way of examples. The examples correspond to the respective fabrication methods, and the elements accomplished according to such fabrication methods are semiconductor light-emitting elements having structures of the invention. Hence, a fabrication procedure is first described in the respective examples, and the resultant element is then illustrated. It will be noted that the semiconductor light-emitting elements of the present invention may be modified and altered without departing from the spirit and scope of the present invention and the present invention should not be construed as limiting to these examples.

EXAMPLE 1

This example deals with direct selective growth on a sapphire substrate wherein a selective crystal growth layer having different crystal planes including an S plane and a C plane, and regions of the S plane and regions of the C plane are divided from each other and independent p-electrodes corresponding to two color light-emitting wavelengths are formed. With reference to FIGS. 1 to 6, an element structure is described along with a fabrication process thereof.

First, a low temperature buffer layer made of either AlN or GaN is formed on a sapphire substrate 10 having a C+ plane as a principal plane thereof at a low temperature of 500° C. Thereafter, a mask layer 12 made of $SiO_2$ or SiN is formed over the entire surface in a thickness ranging from 100 to 500 nm, and openings 13 with a size of approximately 10 μm are formed according to photolithography by use of a hydrofluoric acid etchant (FIG. 1). In this example, the opening 13 is substantially in a round shape, and the size may be changed depending on the intended characteristics of a light-emitting element to be fabricated.

Figure 3B:
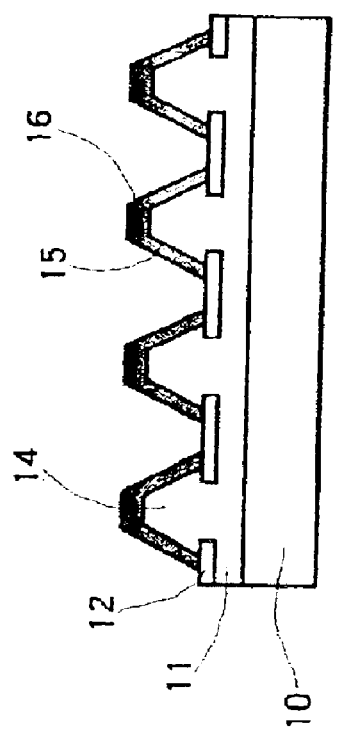

Subsequently, crystal growth is performed once more, whereupon the temperature is increased to approximately 1000° C. to form a silicon-doped GaN layer 14 by selective growth. This silicon-doped GaN layer 14 is grown at the openings 13 of the mask, and when the growth is continued for a while, a hexagonal pyramidal trapezoidal form develops as shown in FIG. 2. The inclined planes of the hexagonal pyramid are covered with a (1-101) plane of an S plane, with an upper plane being covered with a C plane that is the same as the principal plane of the sapphire substrate 10. When the uppermost C plane becomes substantially flat after a sufficient time, a silicon-doped GaN layer is formed, after which growth is continued for a time, followed by growth of a silicon-doped GaN layer 14 serving as a first conduction-type clad layer. Thereafter, the growth temperature is lowered to permit growth of an InGaN layer 15. Subsequently, the growth temperature is increased, under which a magnesium-doped GaN layer 16 is grown as shown in FIG. 3.

The resultant InGaN layer 15 has a thickness of approximately 0.5 nm to 3 nm. For the active layer, there further may be used a quantum well structure (QW) or a multiple quantum well structure (MQW) of an (Al) GaN/InGaN structure. Alternatively, there may be used a multiple structure using a guide layer of GaN or InGaN. In this connection, it is preferred to grow an AlGaN layer as a layer just above InGaN. The composition and thickness of the InGaN layer 15 serving as an active layer are reflective of the shape of the GaN layer 14 in the form of a hexagonal pyramidal trapezoid wherein the side planes are covered with the S plane and the upper plane is covered with the C plane parallel to the principal plane of the substrate. At the C plane and S plane in alignment with the shape, the emission wavelength is such that it becomes longer at the C+ plane close to the center, and is shorter at the S plane portion close to the substrate. Accordingly, when electrodes are separately formed on these C+ plane and the S plane, first and second light-emitting wavelength regions can be formed.

Figure 4A:
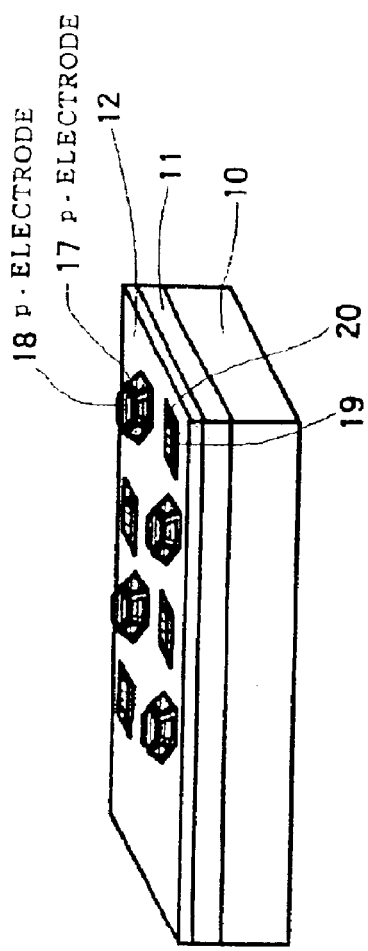
FIG. 4 is a view showing the step of forming electrodes in the fabrication process of the semiconductor light-emitting element of Example 1 of the present invention, including a sectional view (A) in the fabrication process and a perspective view (B) in the fabrication process.
Figure 4B:
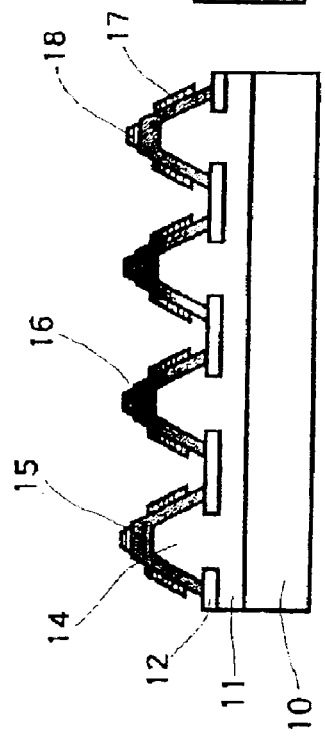

Thereafter, part of the mask layer 12 on the substrate having the growth layers is removed to form openings 20. A Ti/Al/Pt/Au electrode is vacuum deposited within a region of each opening 20 formed by the removal of the part. This is an n-electrode 19. Moreover, a Ni/Pt/Au electrode or Ni (Pd)/Pt/Au electrode is vacuum deposited on the uppermost layer of the magnesium-doped GaN layer 16 of the hexagonal pyramidal trapezoid. The p-electrode is formed by use of a Ni/Pt/Au electrode. In addition, as shown in FIG. 4, the Ni/Pt/Au electrode or Ni(Pd)/Pt/Au electrode is partly removed by a lift-off method using photolithography to form a p-electrode 17 on the S plane and a p-electrode 18 on the C plane. The p-electrodes 17 are independently, separately formed on six S planes, and the p-electrode 18 is formed on the C plane as being separated from other p-electrodes 17. The p-electrode 17 corresponds to a shorter wavelength light emission region of the active layer, and the p-electrode 18 corresponds to a longer wavelength light emission region of the active layer. It will be noted that, in this example, the p-electrode 17 is formed on the S plane, and a common p-electrode for all the S planes may be formed. It is also possible to arrange in such a way that a p-electrode for a longer wavelength is formed on the C plane of the hexagonal pyramidal trapezoid, a p-electrode for a shorter wavelength is formed on a plane portion of the S plane, and a p-electrode for an intermediate wavelength is formed on a side portion that is a contact line of adjacent S planes, thereby forming first to third light-emitting wavelength regions having independent p-electrodes.

Figure 5B:
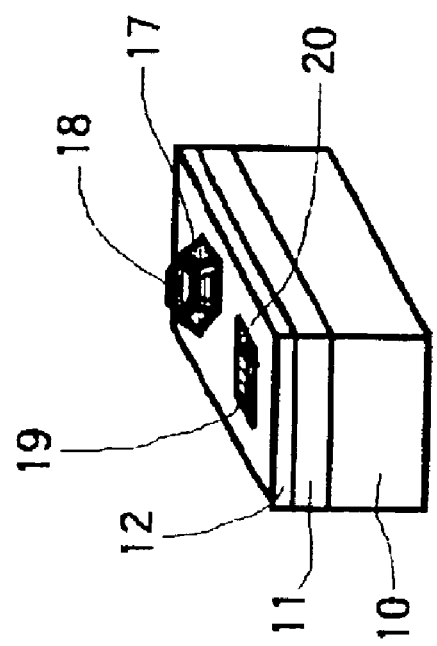
FIG. 5 is a view showing the step of element isolation in the fabrication process of the semiconductor light-emitting element of Example 1 of the present invention, including a sectional view (A) in the fabrication process and a perspective view (B) in the fabrication process.
Figure 5A:
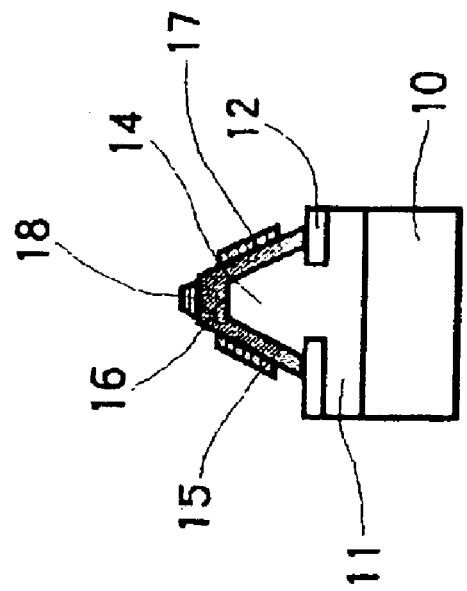

In the course of these vacuum depositions, if the p-electrodes 17, 18 and the n-electrode 19 are in contact with both the hexagonal pyramid layer and the silicon-doped GaN layer formed beneath the mask, short-circuiting takes place. Thus, the depositions should be carried out in high precision. Thereafter, as shown in FIG. 5, the semiconductor light-emitting elements arc separated according to RIE or via a dicer.

Figure 6:
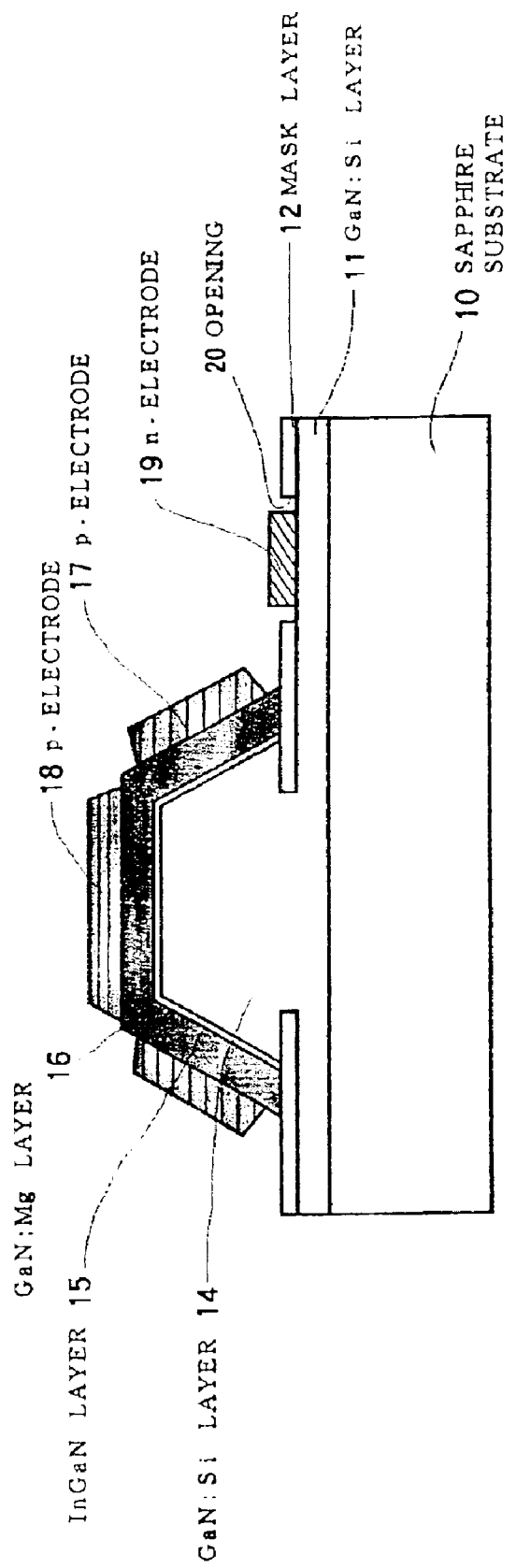
FIG. 6 is a sectional view showing a structure of the semiconductor light-emitting element of Example 1 of the present invention.

FIG. 6 shows the structure of the semiconductor light-emitting element of this example. The main arrangement includes, on the sapphire substrate 10 having the C+ plane as a principal plane thereof, the silicon-doped GaN layer 11 serving as a crystal seed layer, and the silicon-doped GaN layer 14 selectively grown via the opening 13 of the mask layer 12 and serving as a selective crystal growth layer. This silicon-doped GaN layer 14 has the S plane inclined relative to the principal plane of the substrate and the C plane extending parallel to the principal plane of the substrate. The InGaN layer 15 serving as an active layer is formed as extending in parallel to the S planes and C plane. Further, the magnesium-doped GaN layer 16 serving as a clad layer is formed on the InGaN layer 15.

The silicon-doped GaN layer 14 is in the form of a hexagonal pyramidal trapezoid covered with the S planes and the C plane, and the InGaN layer 15 acting as an active layer extends in parallel to the different crystal planes of the S planes and the C plane. The composition of the InGaN layer 15 reflects the shape or profile of the GaN layer 14 in the form of a hexagonal pyramidal trapezoid covered with the S planes and the C plane and differs depending on the profile. The second light-emitting wavelength region of a longer wavelength is formed at the portion of the C plane of the selective crystal growth layer and the first light-emitting wavelength region of a shorter wavelength is formed at the portion of the S plane of the selective crystal growth layer. The second light-emitting wavelength region emits, for example, green light, and the first light-emitting wavelength region emits, for example, blue light.

The p-electrode 17 and the p-electrode 18 are formed on the magnesium-dope GaN layer 16 in correspondence to these first and second light-emitting wavelength regions, respectively, through which an electric current is independently chargeable into the first and second light-emitting wavelength regions. The n-electrode 19 is formed at a region of the opening 20 made at a side portion of the hexagonal pyramid portion and is connected to the silicon-doped GaN layer 14 through the silicon-doped GaN layer 12.

In order to enable the active layer to be responsible for multi-color light emission, the semiconductor light-emitting element of this example having such a structure as set forth hereinabove is arranged such that the S planes, inclined relative to the substrate principal plane, and the C plane, extending parallel to the substrate principal plane, of the GaN layer 14 formed beneath these different crystal planes are utilized so that the active layer is grown on the C plane and the S planes wherein band gaps formed in the active layer are changed without resorting, in particular, to etching. In this way, a light emitting element capable of multi-color light emission is easily fabricated, ensuring precise formation without inviting degradation of crystallinity.

Since the S planes inclined relative to the principal plane of the substrate are utilized, the number of bonds of from the nitrogen atom to the gallium atom increases, so that it becomes possible to increase an effective V/III ratio. Thus, the resultant semiconductor light-emitting element can be made high in performance. The principal plane of the substrate consists of a C+ plane, and the S planes are ones different from the main plane of the substrate, s that dislocations extending from the substrate upwardly are bent, making it possible to reduce the number of defects.

EXAMPLE 2

This example is one which deals with direct selective growth on a sapphire substrate wherein a selective crystal growth layer having an S plane is formed and independent p-electrodes corresponding to two color light-emitting wavelengths are formed on the plane portion and the side portion of the S plane. Referring to FIGS. 7 to 12, the element structure is described along with its fabrication process.

First, a low temperature buffer layer made of either AlN or GaN is formed on a sapphire substrate 30 having a C+ plane as a substrate principal plane at a low temperature of 500° C. After raising to a temperature of 1000° C., a silicon-doped GaN layer 31 is formed. Subsequently, a mask layer 32 made of $SiO_2$ or SiN is formed over the entire surface in a thickness ranging from 100 to 500 nm, and openings 33 with a size of approximately 10 μm are formed according to photolithography using a hydrofluoric acid etchant (FIG. 7). In this example, the opening 33 is substantially in a round shape, and the size may be changed depending on the intended characteristics of a light-emitting element to be fabricated.

Next, crystal growth is performed once more, whereupon the temperature is increased to approximately 1000° C. to form a silicon-doped GaN layer 34 at the respective openings 33 by selective growth. This silicon-doped GaN layer 34 is grown at the openings 33 of the mask layer 32, and when the growth is continued for a while, a hexagonal pyramidal form develops. The surfaces of the hexagonal pyramid are covered with an S (1-101) plane as shown in FIG. 8. Although a hexagonal trapezoidal shape develops if the growth time is in shortage, the Si-doped GaN layer 34 is grown until a hexagonal pyramid covered with the S (1-101) plane is obtained. To this end, the openings 33 should be kept away from one another at appropriate pitches. After the formation of the hexagonal pyramid with the Si-doped doped GaN layer 34, growth is continued for a time until the width of the hexagonal pyramid is at approximately 20 μm (with one side being at approximately 10 μm), whereupon the height of the hexagonal pyramid is about 1.6 times the length of the side, resulting in a height of approximately 16 μm. The hexagonal pyramid-shaped crystal layer covered with the S (1-101) plane preferably should be grown such that the size in a lateral direction along the principal plane of the substrate is larger than the size of the opening 33.

After the formation of the hexagonal pyramid-shaped GaN layer 34 grown to such an extent as set out above and covered with the S plane, a Si-doped GaN is further grown, followed by lowering the growth temperature to grow an InGaN layer 35. Subsequently, the growth temperature is increased, under which a Mg-doped GaN layer 36 is grown so as to cover the hexagonal pyramidal portions therewith. In FIG. 9, the InGaN layer 35 is depicted as a line. The thickness of the InGaN layer 35 is approximately in the range of from 0.5 nm to 3 nm. For the active layer, a quantum well structure (QW) or a multiple quantum well structure (MQW) of an (Al) GaN/InGaN structure may be used. Alternatively, there may be used a multiple structure using a guide layer of GaN or InGaN. In this connection, it is preferred to grow an AlGaN layer as a layer just above InGaN. At this stage, the composition of the InGaN layer 35 serving as the active layer is such that because the size of the hexagonal pyramid-shaped GaN layer 34 covered with the S plane is made greater than the diffusion length of the InGaN layer 35, a difference is found in the uptake of In, so that a second light-emitting wavelength region is formed at a side portion that is a contact line between adjacent S planes of the selective crystal growth layer and a first light-emitting wavelength region is formed at the portion of the S plane of the selective crystal growth layer. The emission wavelength is such that it becomes longer at the second emission region including the contact line between the S planes, and is shorter at the first light-emitting wavelength region formed at the S plane portion closer to the substrate. The second light-emitting wavelength region of a longer wavelength emits, for example, green light, and the first light-emitting wavelength region of a shorter wavelength emits, for example, blue light.

Thereafter, part of the mask layer 32 on the substrate having the growth layers is removed to form openings 38. A Ti/Al/Pt/Au electrode is vacuum deposited at the opening 38 formed by the removal of the part. This serves as an n-electrode 37. Moreover, Ni/Pt/Au or Ni (Pd)/Pt/Au is vacuum deposited on the uppermost layer of the Mg-doped GaN layer 36 grown on the hexagonal pyramid. First, a Ni/Pt/Au layer or Ni(Pd)/Pt/Au layer is vacuum deposited, and the surface electrode is partly removed by lift-off using photolithography for division into a portion at the side of the hexagonal pyramid and a portion at the plane thereof, thereby forming independent p-electrodes 39, 40 at the plane portion and side portion of the hexagonal pyramid as shown in FIG. 10. The light-emitting wavelength regions whose emission wavelengths differ from each other are formed at the side and plane portions of the hexagonal pyramid. Thus, when independent electrodes are formed in the semiconductor light-emitting element, both emission wavelengths, at least, of 470 nm and 520 nm for blue light and green light can be outputted. The results of measurement of emission wavelength at the side and plane portions of the hexagonal pyramid according to cathode luminescence reveal a shift of a wavelength by 50 nm. This corresponds to a wavelength interval of from blue light to green light (470 nm–520 nm). Thus, light emission of different wavelengths from a single element is enabled. Further, when the same signal is applied to the p-electrodes 39, 40, or when such a signal is applied to as to ensure the same emission intensity in such a way that an electric current is supplied to the regions capable of emission at different wavelengths in order to invariably keep the same level of emission intensity, a white light source is provided. It will be noted that the n-electrode 37 is one that is common for the three emission wavelength regions, and is formed at the surface side of the substrate in FIG. 10. Alternatively, it is possible to form the electrode at the back side of the GaN layer 34, which is a selective crystal growth layer, after removal of the sapphire substrate 30.

Figure 11B:
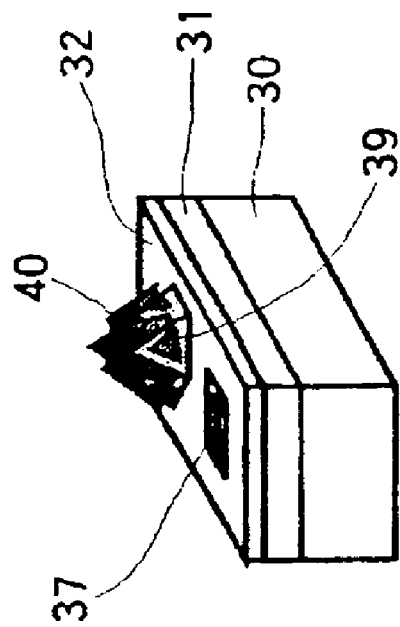
FIG. 11 is a view showing the element isolation step in the fabrication process of the semiconductor light-emitting element of Example 2 of the present invention, including a sectional view (A) in the fabrication process and a perspective view (B) in the fabrication process.
Figure 11A:
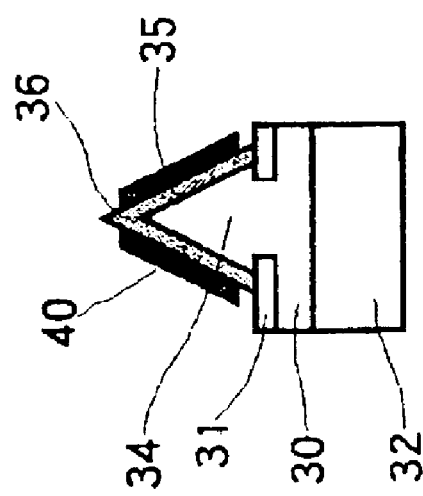

Thereafter, the semiconductor light-emitting elements are separated from one another according to RIE or via a dicer (FIG. 11). In this way, the light-emitting element of this example is completed. The element used is easy for fabrication when it takes a hexagonal pyramidal form, thus leading to the cost saving. Especially, AFM or the like is used to take an AFM image where a step is fine and close to a line. In actual applications, when the clearest portion of the step is employed, a luminous efficiency can be further improved.

Figure 12:
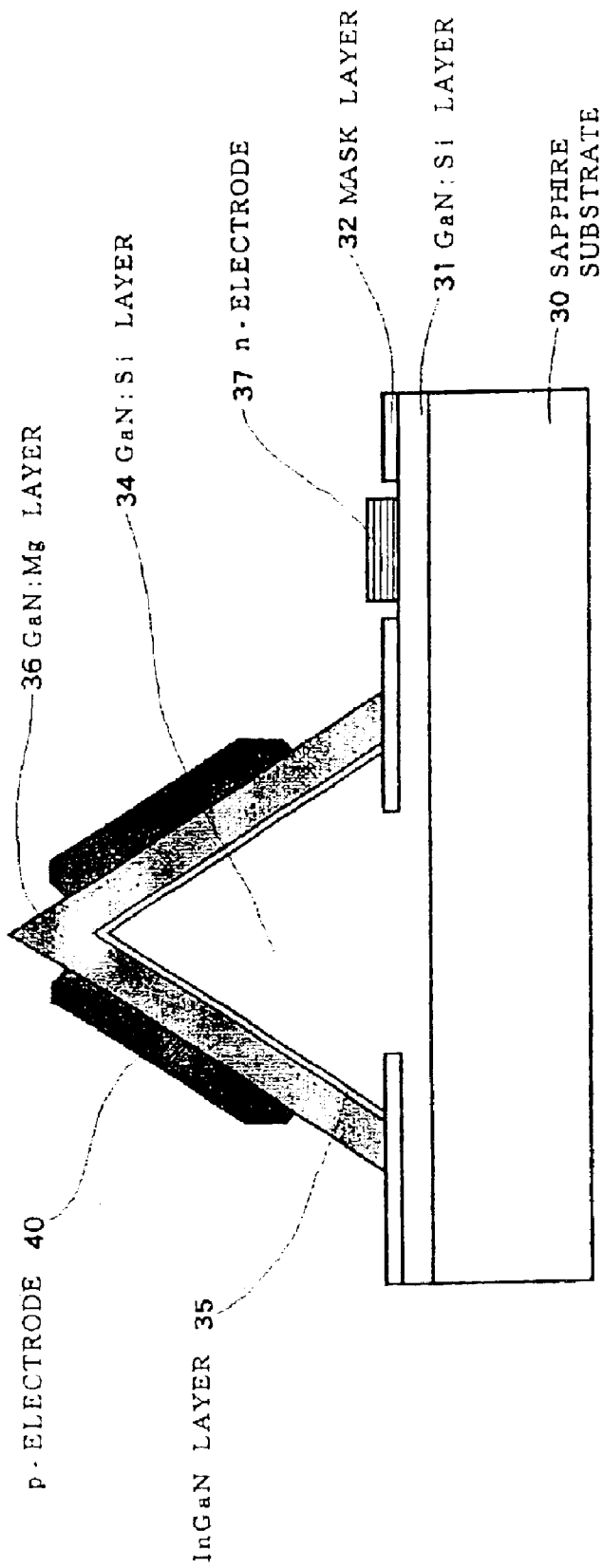
FIG. 12 is a sectional view showing the semiconductor light-emitting element of Example 2 of the present invention.

FIG. 12 shows the structure of the semiconductor light-emitting element of this example. The main arrangement includes, on the sapphire substrate 30 having the C+ plane as a principal plane thereof, the silicon-doped GaN layer 31 serving as a crystal seed layer, and the silicon-doped GaN layer 34 selectively grown via the opening 33 of the mask layer 32 and serving as a selective crystal growth layer. This silicon-doped GaN layer 34 has the S plane inclined relative to the principal plane of the substrate, and the InGaN layer 35 serving as an active layer is formed as extending in parallel to the S planes. Further, the magnesium-doped GaN layer 36 serving as a clad layer is formed on the InGaN layer 35.

The silicon-doped GaN layer 34 is in the form of a hexagonal pyramid covered with the S planes, and the InGaN layer 35 acting as an active layer extends in parallel to the S planes. The composition and thickness of the InGaN layer 35 are such that because the size of the hexagonal pyramid-shaped GaN layer 34 covered with the S planes is greater than the diffusion length of In and the layer 35 is formed as having a composition that differs depending on the profile of the GaN layer 34 The second light-emitting wavelength region of a longer wavelength is formed at a side portion that is the contact line of the S planes of the selective crystal growth layer, and the first light-emitting wavelength region of a shorter wavelength is formed at the portion of the S plane of the selective crystal growth layer. The second light-emitting wavelength region emits, for example, green light, and the first light-emitting wavelength region emits, for example, blue light.

The p-electrode 39 and the p-electrode 40 are formed on the Mg-doped GaN layer 36 in correspondence to these first and second light-emitting wavelength regions, respectively, through which an electric current is independently chargeable into the first and second light-emitting wavelength regions. The n-electrode 37 is formed at a region of the opening 38 made at a side portion of the hexagonal pyramid portion and is connected to the silicon-doped GaN layer 34 through the silicon-doped GaN layer 32.

In order to enable the active layer to be responsible for multi-color light emission, the semiconductor light-emitting element of this example, having such a structure as set forth hereinabove, is arranged such that the S planes, inclined relative to the substrate principal plane, of the Si-doped GaN layer 34, which is selectively grown and serving as a selective crystal growth layer, formed beneath the active layer are utilized so that the active layer is grown on the S planes wherein band gaps formed in the active layer are changed without resorting, in particular, to etching. In this way, a light emitting element capable of multi-color light emission is easily fabricated, ensuring precise formation without inviting degradation of crystallinity.

Since the S planes inclined relative to the principal plane of the substrate are utilized, the number of bonds of from the nitrogen atom to the gallium atom increases, so that it becomes possible to increase an effective V/III ratio. Thus, the resultant semiconductor light-emitting element can be made high in performance. The principal plane of the substrate consists of a C+ plane, and the S planes are ones different from the main plane of the substrate, so that dislocations extending from the substrate upwardly are bent, making it possible to reduce the number of defects.

EXAMPLE 3

This example is one which deals with direct selective growth on a sapphire substrate wherein a selective crystal growth layer having an S plane is formed and independent p-electrodes corresponding to three color light-emitting wavelengths are formed. Referring to FIGS. 13 to 18, the element structure is described along with its fabrication process.

Figure 13A:
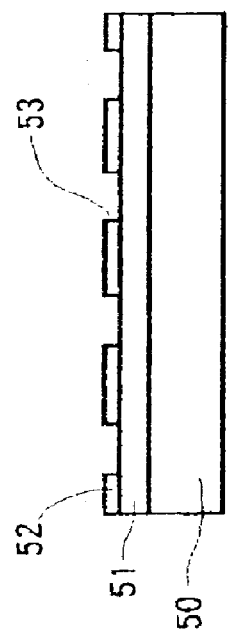
FIG. 13 is a view showing the step of forming a mask in the fabrication process of a semiconductor light-emitting element of Example 3 of the present invention, including a sectional view (A) in the fabrication process and a perspective view (B) in the fabrication process.
Figure 13B:
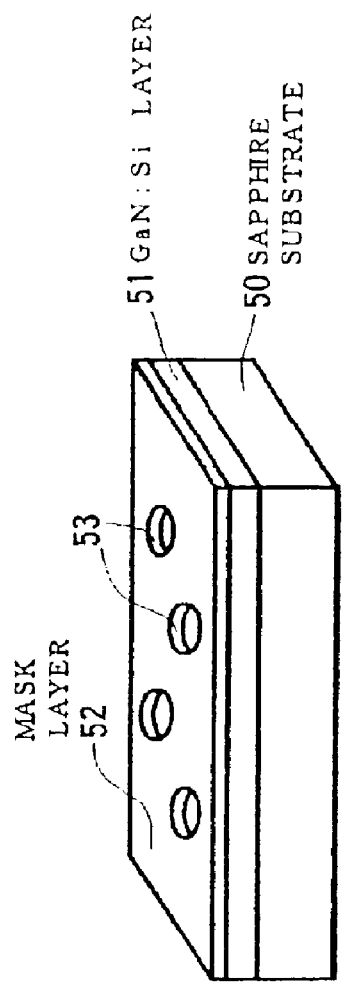

First, a low temperature buffer layer made of either AlN or GaN is formed on a sapphire substrate 50 having a C+ plane as a substrate principal plane thereof at a low temperature of 500° C. After raising to a temperature of 1000° C., a silicon-doped GaN layer 51 is formed. Subsequently, a mask layer 52 made of $SiO_2$ or SiN is formed over the entire surface in a thickness ranging from 100 to 500 nm, and openings 53 with a size of approximately 10 μm are formed according to photolithography using a hydrofluoric acid etchant (FIG. 13). In this example, the opening 53 is substantially in a round shape, and the size may be changed depending on the intended characteristics of a light-emitting element to be fabricated.

Figure 14A:
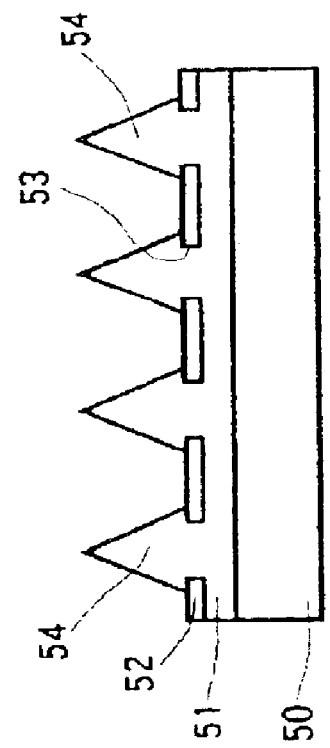
FIG. 14 is a view showing the step of forming a crystal layer in the fabrication process of the semiconductor light-emitting element of Example 3 of the present invention, including a sectional view (A) in the fabrication process and a perspective view (B) in the fabrication process.
Figure 14B:
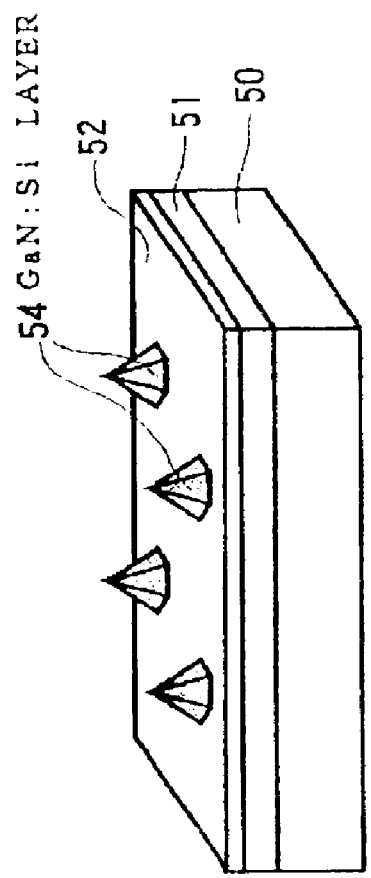

Next, crystal growth is performed once more, whereupon the temperature is increased to approximately 1000° C. to form an Si-doped GaN layer 54, which is a selective crystal growth layer, at the respective openings 53. This Si-doped GaN layer 54 is grown at the openings 53 of the mask layer 52, and when the growth is continued for a while, a hexagonal pyramidal form develops. The surfaces of the hexagonal pyramid are covered with an S (1-101) plane as shown in FIG. 14. Although a hexagonal trapezoidal shape develops if the growth time is in shortage, the Si-doped GaN layer 34 is grown until a hexagonal pyramid covered with the S (1-101) plane is obtained. To this end, the openings 53 should be kept away from one another at appropriate pitches. After the formation of the hexagonal pyramid with the Si-doped GaN layer 54, growth is continued for a time so that the width of the hexagonal pyramid is at approximately 20 μm (with one side being at approximately 10 μm), whereupon the height of the hexagonal pyramid is about 1.6 times the length of the side, resulting in a height of approximately 16 μm. The hexagonal pyramid-shaped crystal layer covered with the S (1-101) plane preferably should be grown such that the size in a lateral direction along the principal plane of the substrate is larger than the size of the opening 53.

Figure 15A:
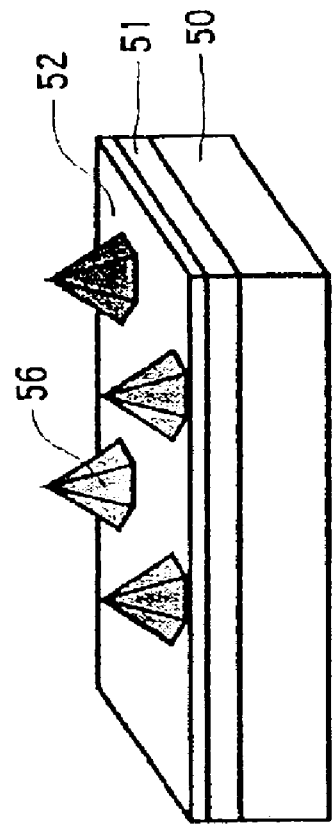
FIG. 15 is a view showing the step of forming an active layer and the like in the fabrication process of the semiconductor light-emitting element of Example 3 of the present invention, including a sectional view (A) in the fabrication process and a perspective view (B) in the fabrication process.
Figure 15B:
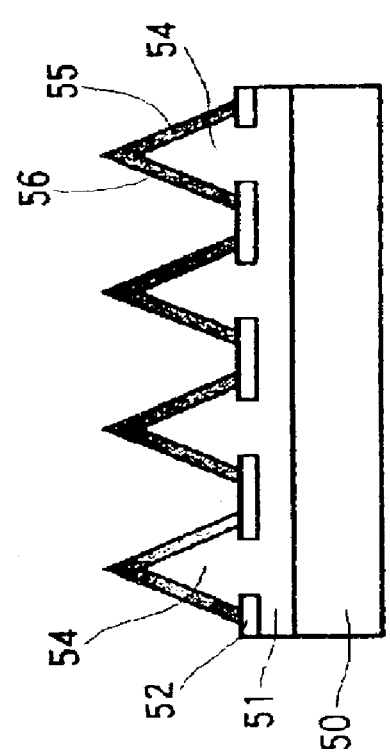

After the formation of the hexagonal pyramid-shaped GaN layer 54 grown to such an extent as set out above and covered with the S plane, a Si-doped GaN is further grown, followed by lowering the growth temperature to grow an InGaN layer 55. Subsequently, the growth temperature is increased, under which a Mg-doped GaN layer 56 is grown so as to cover the hexagonal pyramidal portions therewith. In FIG. 15, the InGaN layer 55 is depicted as a line. The thickness of the InGaN layer 55 is approximately in the range of from 0.5 nm to 3 nm. For the active layer, a quantum well structure (QW) or a multiple quantum well structure (MQW) of an (Al) GaN/InGaN structure may be used. Alternatively, there may be used a multiple structure using a guide layer of GaN or InGaN. In this connection, it is preferred to grow an AlGaN layer as a layer just above InGaN. At this stage, the composition of the InGaN layer 55 serving as the active layer is such that because the size of the hexagonal pyramid-shaped GaN layer 54 covered with the S plane is greater than the diffusion length of the InGaN layer 55, the composition gradually changes between a side near the substrate and a side remote from the substrate. In this condition, the emission wavelength becomes longer at a side near the center, and is shorter at a portion near the substrate. Accordingly, when independent electrodes are formed, first to third light-emitting wavelength regions can be formed.

Thereafter, part of the mask layer 52 on the substrate having the growth layers is removed to form openings 61. A Ti/Al/Pt/Au electrode is vacuum deposited at the opening 61 formed by the removal of the part. This serves as an n-electrode 60. Moreover, a Ni/Pt/Au electrode or Ni (Pd)/Pt/Au electrode is vacuum deposited on the uppermost layer grown on the hexagonal pyramid. In this way, p-electrodes are formed. Moreover, as shown in FIG. 16, the Ni/Pt/Au electrode or Ni (Pd)/Pt/Au electrode is partly removed by lift-off using photolithography wherein a p-type layer corresponding to the removed portion may be removed, thereby forming p-electrodes 57, 58 and 59 formed by division into three portions along the height of the hexagonal pyramid as shown in FIG. 16. The p-electrode 57 is an electrode which corresponds to the shortest wavelength light emission region and is so formed that an electric current is charged into a region capable of blue light emission. The p-electrode 58 is an electrode which corresponds to the second-shortest wavelength light emission region and is so formed as to charge an electric current into a region capable of green light emission. The p-electrode 59 is an electrode which corresponds to the longest wavelength light emission region and is so formed as to charge an electric current into a region capable of red light emission.

The results of measurement of emission wavelength according to cathode luminescence reveal a shift of a wavelength by 100 to 150 nm. This corresponds to a wavelength interval of from blue light to red light (470 nm–620 nm). Thus, the semiconductor light-emitting element of this example exhibits light emission of different wavelengths from a single element by changing the electrode sites along the S plane as with the case of the p-electrodes 57, 58, 59. Further, when the same signal is applied to the p-electrodes 57, 58, 59 so that the regions capable of emission at different wavelengths are invariably kept at the same level of emission intensity, a white light source is provided. It will be noted that the n-electrode 60 is one that is common for the three emission wavelength regions, and is formed at the surface side of the substrate in FIG. 16. Alternatively, it is possible to form the electrode at the back side of the GaN layer 54, which is a selective crystal growth layer, after removal of the sapphire substrate 50.

Figure 17A:
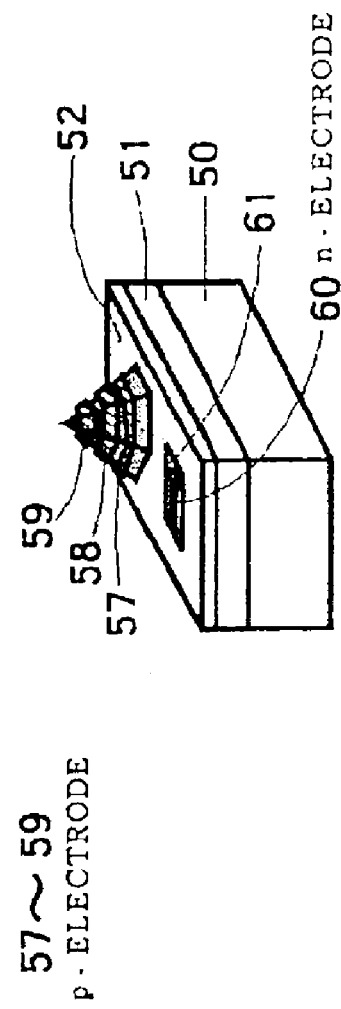
FIG. 17 is a view showing the element isolation step in the fabrication process of the semiconductor light-emitting element of Example 3 of the present invention, including a sectional view (A) in the fabrication process and a perspective view (B) in the fabrication process.
Figure 17B:
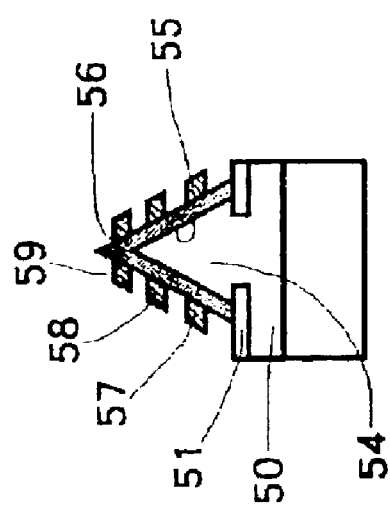

Thereafter, the semiconductor light-emitting elements, each formed with the p-electrodes divided into three portions, are separated from one another according to RIE or via a dicer as shown in FIG. 17. In this way, the light-emitting element of this example is completed. The element used is easy for fabrication when it takes a hexagonal pyramidal form, thus leading to the cost saving. Especially, AFM or the like is used to take an AFM image where a step is fine and close to a line. In actual applications, when the clearest portion of the step is employed, a luminous efficiency can be further improved.

Figure 18:
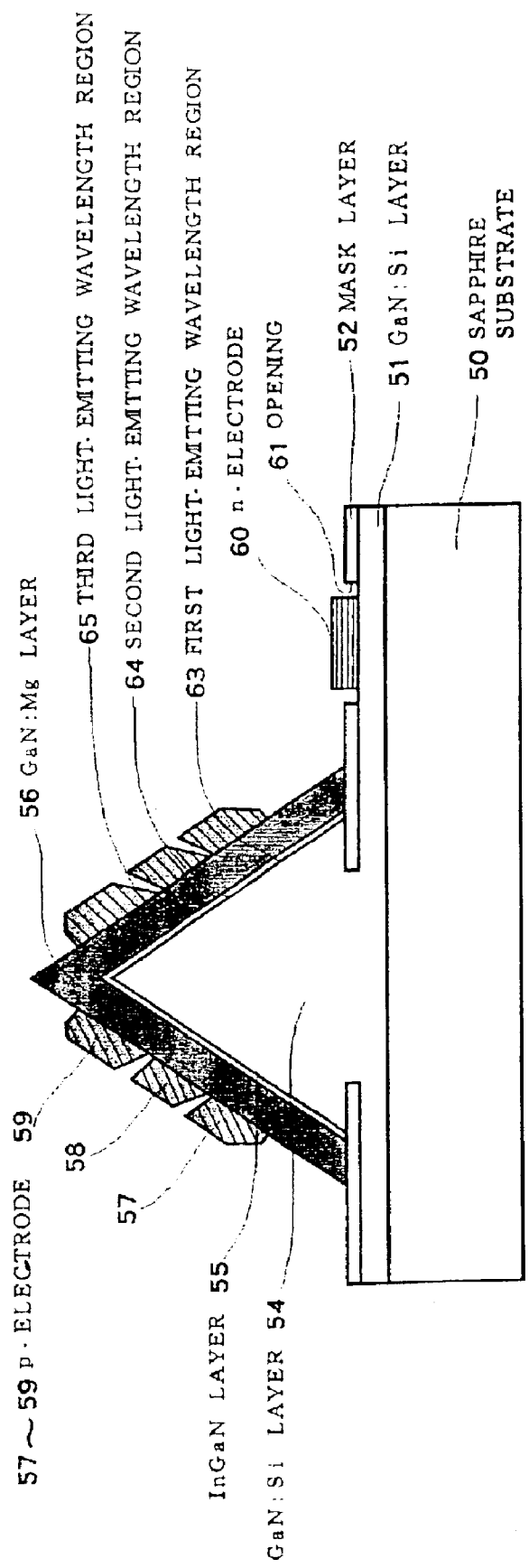
FIG. 18 is a sectional view showing the semiconductor light-emitting element of Example 3 of the present invention.

The light-emitting element of this example fabricated in such a fabrication process as set forth hereinabove has the structure shown in FIG. 18. The main arrangement includes, on the sapphire substrate 50 having the C+ plane as a principal plane thereof, the silicon-doped GaN layer 51 serving as a crystal seed layer, and the silicon-doped GaN layer 54 selectively grown via the opening 53 of the mask layer 52 and serving as a selective crystal growth layer. This silicon-doped GaN layer 54 has the S plane inclined relative to the principal plane of the substrate, and the InGaN layer 55 serving as an active layer is formed as extending in parallel to the S planes. Further, the magnesium-doped GaN layer 56 serving as a clad layer is formed on the InGaN layer 55.

The silicon-doped GaN layer 54 is in the form of a hexagonal pyramid covered with the S planes, and the InGaN layer 55 acting as an active layer extends in parallel to the S planes. Because the InGaN layer 55 is arranged such that the diffusion length of In is shorter than the size of the active layer, the thickness and composition thereof gradually vary between the side near the substrate and the side distant from the substrate. Thus, first to third emission wavelength regions 63, 64 and 65 are formed in the InGaN layer 55 wherein the emission wavelength becomes longer at the side nearer to the center and shorter at a portion nearer to the substrate.

The p-electrode 57, p-electrode 58 and p-electrode 59 corresponding to these first to third emission wavelength regions 63, 64 and 65 are formed on the magnesium-doped GaN layer 56, so that an electric current is independently chargeable into the first to third emission wavelength regions 63, 64 and 65. The n-electrode 60 is formed at the region of each opening 61 made at the side portion of the hexagonal pyramid portion and is connected to the silicon-doped GaN layer 54 via the silicon-doped GaN layer 51.

In order to enable the active layer to be responsible for multi-color light emission, the semiconductor light-emitting element of this example having such a structure as set forth hereinabove is arranged such that the S planes, inclined relative to the substrate principal plane, of the silicon-doped GaN layer 54, which is selectively grown and serves as a selective crystal growth layer, formed beneath the active layer are utilized so that the active layer is grown on the S planes wherein band gaps formed in the active layer are changed without resorting, in particular, to etching. In this way, a light emitting element capable of multicolor light emission is easily fabricated, ensuring precise formation without inviting degradation of crystallinity.

Since the S planes inclined relative to the principal plane of the substrate are utilized, the number of bonds of from the nitrogen atom to the gallium atom increases, so that it becomes possible to increase an effective V/III ratio. Thus, the resultant semiconductor light-emitting element can be made high in performance. The principal plane of the substrate consists of a C+ plane, and the S planes are ones different from the main plane of the substrate, so that dislocations extending from the substrate upwardly are bent, making it possible to reduce the number of defects.

EXAMPLE 4

This example is one which deals with the formation of light emission regions by processing the surface of an underlying crystal layer on a sapphire substrate in the form of irregularities, followed by selective growth from the irregularity portions. Referring to FIGS. 19 to 22, the element structure is described along with the fabrication process thereof First, a low temperature buffer layer made of either AlN or GaN is formed on a sapphire substrate 70 at a low temperature of 500° C. After raising to a temperature of 1000° C, a silicon-doped GaN layer 71 is formed as an underlying crystal layer. Subsequently, a mask layer made of SiO$_2$ or SiN is formed over the entire surface in a thickness ranging from 100 to 500 nm, and striped stepped portions 72 with a size of approximately 10 μm are formed along the direction of 1-101 by use of photolithography and a hydrofluoric acid etchant, followed by etching to an extent of approximately 10 μm by RUE.

Figure 19B:
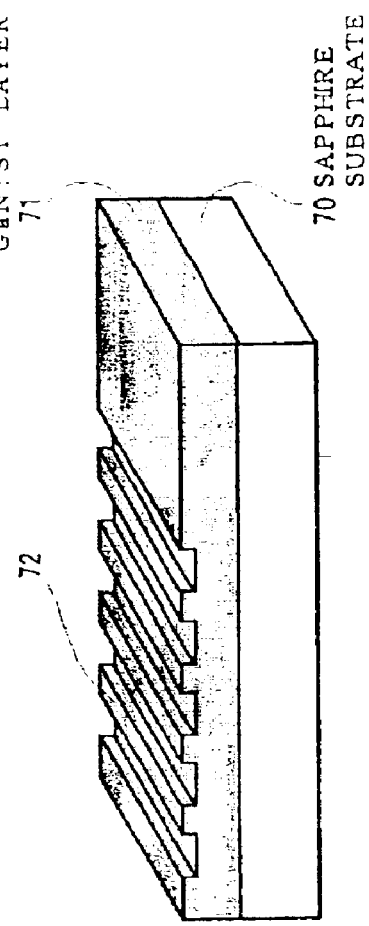
FIG. 19 is a view showing the step of forming stepped portions in the fabrication process of a semiconductor light-emitting element of Example 4 of the present invention, including a sectional view (A) in the fabrication process and a perspective view (B) in the fabrication process.
Figure 19A:
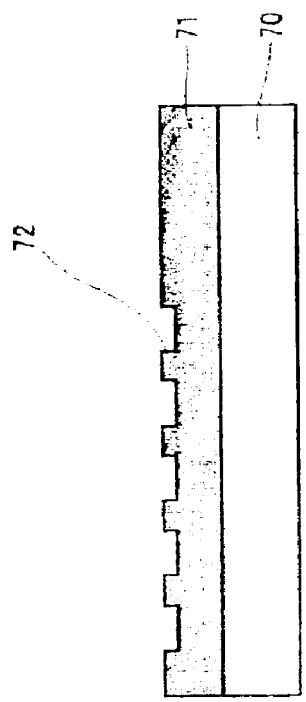
Figure 20A:
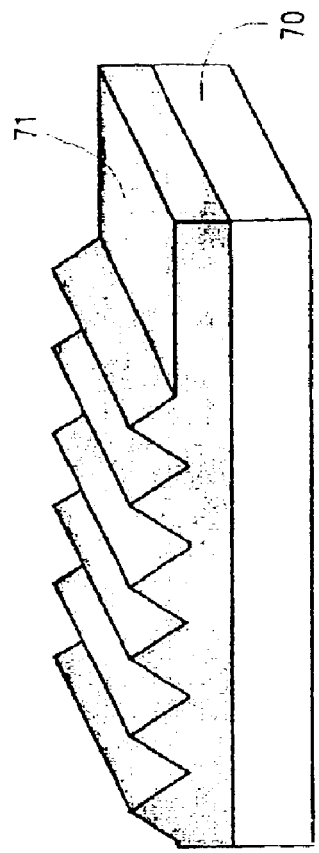
FIG. 20 is a view showing the selective growth step of a crystal layer in the fabrication process of the semiconductor light-emitting element of Example 4 of the present invention, including a sectional view (A) in the fabrication process and a perspective view (B) in the fabrication process.
Figure 20B:
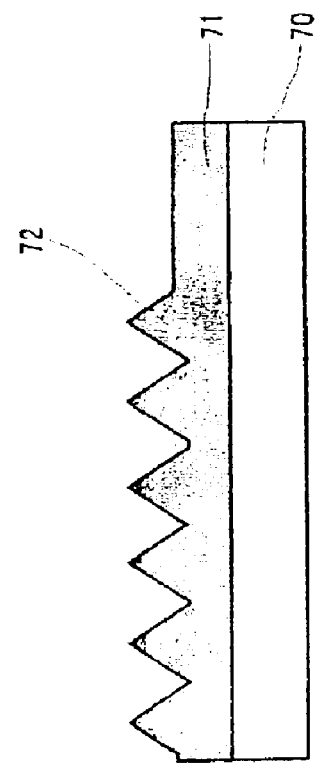
Figure 21A:
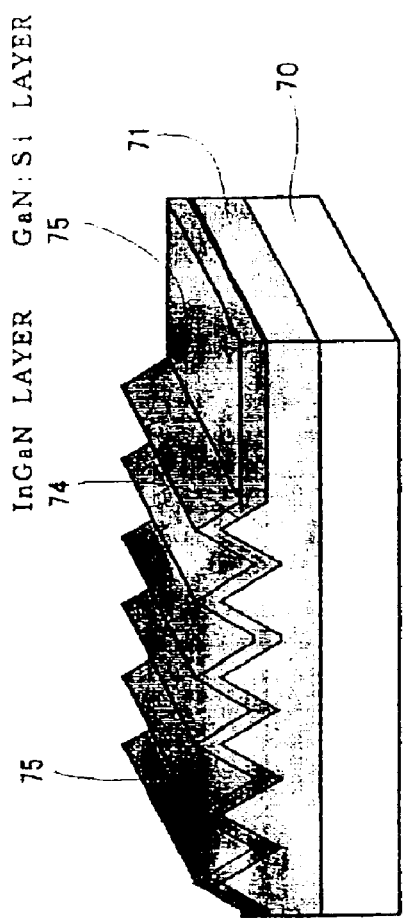
FIG. 21 is a view showing the step of forming an active layer in the fabrication process of the semiconductor light-emitting element of Example 4 of the present invention, including a sectional view (A) in the fabrication process and a perspective view (B) in the fabrication process.
Figure 21B:
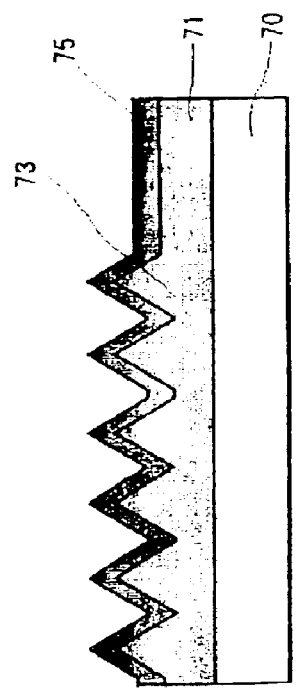

Next, as shown in FIG. 19, the mask layer is removed. Crystal growth is then performed once more, whereupon the temperature is increased to approximately 1000° C. to form a silicon-doped GaN layer 73 by selective growth. This silicon-doped GaN layer 73 is grown as stepped portion 72, and when the growth is continued for a while, a serrated form in section develops as shown in FIG. 20. After the formation of the silicon-doped GaN layer, growth is continued for a time to permit the silicon-doped GaN layer acting as a clad layer to be grown. Thereafter, the growth temperature is lowered to grow an InGaN layer 74. The InGaN layer 74 has thickness of approximately from 0.5 nm to 3 nm. For the active layer, a quantum well structure (QW) or a multiple quantum well structure (MQW) of an (Al) GaN/InGaN structure may be used. Alternatively, there may be used a multiple structure using a guide layer of GaN or InGaN. In this connection, it is preferred to grow an AlGaN layer as a layer just above InGaN. Thereafter, the growth temperature is increased to permit a magnesium-doped GaN layer 75 to be grown as shown in FIG. 21.

Figure 22A:
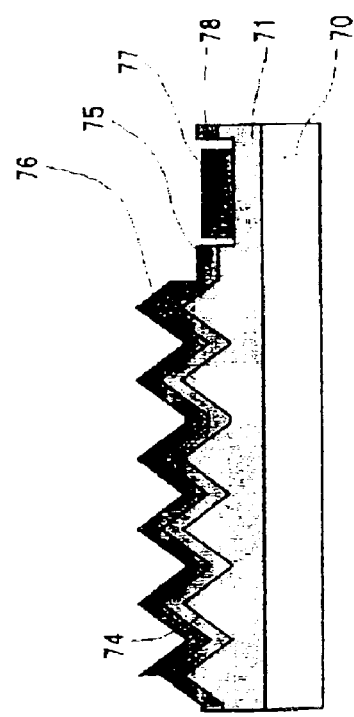
FIG. 22 is a view showing the step of forming electrodes in the fabrication process of the semiconductor light-emitting element of Example 4 of the present invention, including a sectional view (A) in the fabrication process and a perspective view (B) in the fabrication process.
Figure 22B:
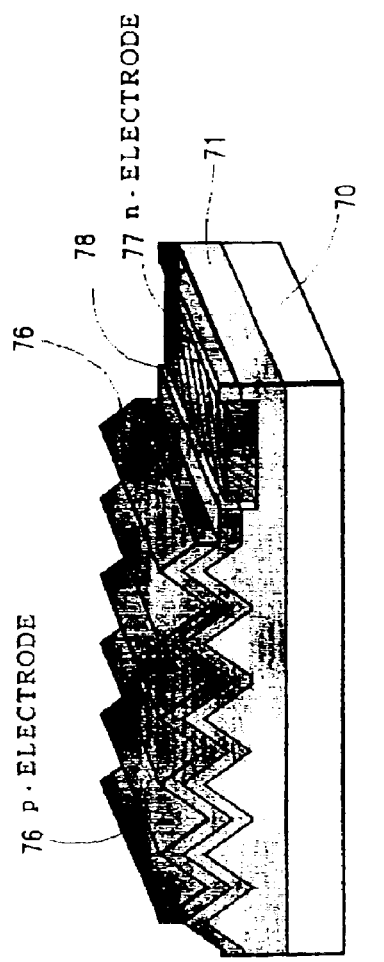

Further, Ni/Pt/Au or Ni (Pd)/Pt/Au is vacuum deposited on the uppermost layer grown on this layer. In this way, a p-electrode 76 is formed on the magnesium-doped GaN layer 75 as shown in FIG. 22. Thereafter, the magnesium-doped GaN layer on the substrate having the growth layers is partly removed, and a Ti/Al/Pt/Au electrode is vacuum deposited at the resulting opening formed by the removal of the part. This Ti/Al/Pt/Au electrode serves as an n-electrode 77.

The light-emitting element of this example is formed with light-emitting wavelength regions formed by processing the surface of the underlying crystal layer in the form of irregularities and selectively growing from the irregular portions. This emission element is usually reduced in the uptake of In over the case using openings of a mask or crystal species in a circular or hexagonal form and becomes shorter in wavelength. Accordingly, there can be fabricated an image display device capable of multi-color light emission through a combination of these elements.

EXAMPLE 5

This example is one which deals with a semiconductor light-emitting element wherein a band-shaped window region is formed for selective growth. Referring to FIGS. 23 to 26, the element structure is described.

Figure 23:
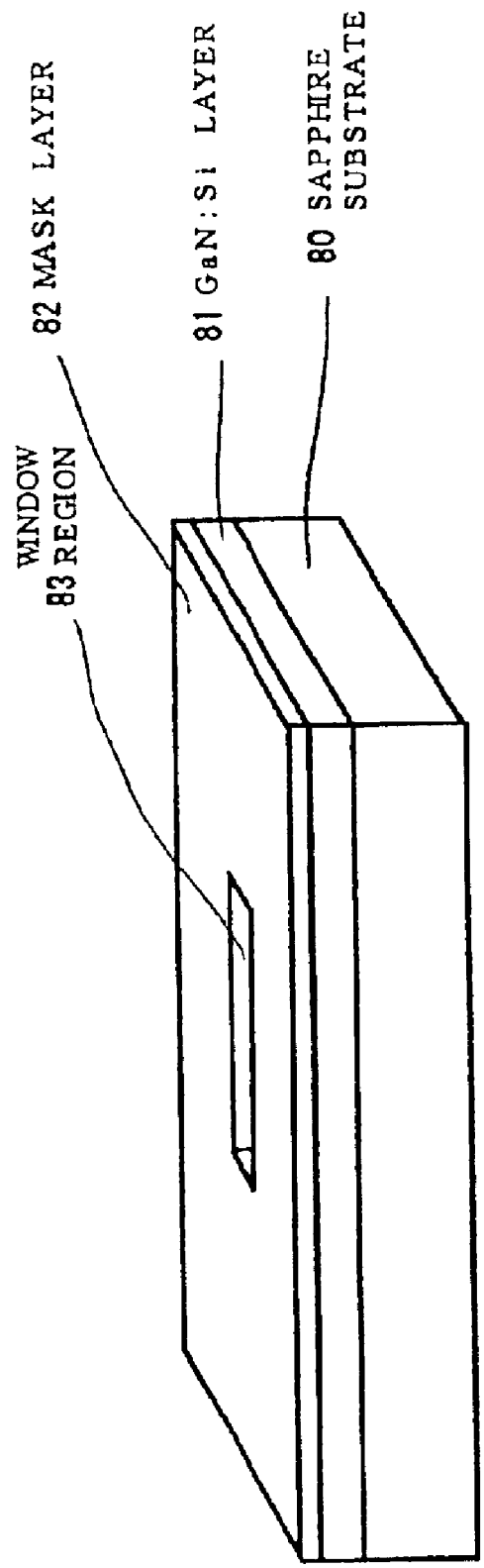
FIG. 23 is a perspective view of a fabrication process showing the step of forming a mask layer in the fabrication process of a semiconductor light-emitting element of Example 5 of the present invention.
Figure 24:
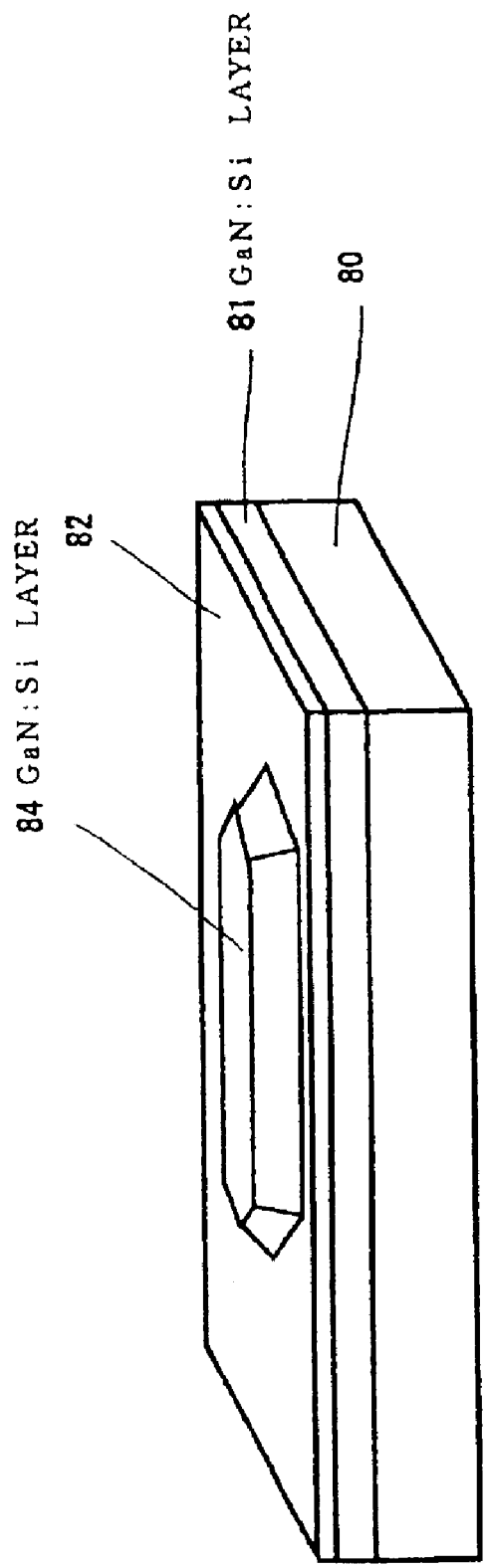
FIG. 24 is a perspective view of a fabrication process showing the step of forming a crystal layer in the fabrication process of the semiconductor light-emitting element of Example 5 of the present invention.

As shown in FIG. 23, a buffer layer made of either AlN or GaN is formed on a sapphire substrate 80 having a C+ plane as a principal plane thereof at a low temperature of 500° C. After raising to a temperature of 1000° C., a silicon-doped GaN layer 81 is formed. Subsequently, a mask layer 82 made of $SiO_2$ or SiN is formed over the entire surface in a thickness ranging from 100 to 500 nm, and a window region 83 made of a rectangular opening having a size of approximately 10 µm×50 µm is formed by use of photolithography and a hydrofluoric acid etchant. In this connection, the long side is arranged in the direction of 1-100. Thereafter, the crystal growth is effected once more, whereupon the temperature is raised to approximately 1000° C. to form a silicon-doped GaN layer 84. The silicon-doped GaN layer 84 is grown into the window region 83 of a mask, and when the growth is continued for a while, a ship bottom-shaped form develops as shown in FIG. 24. The projected hexagonal pyramid should be so arranged that the side planes thereof are covered with different crystal planes such as S planes and 11-22 planes.

When the uppermost C plane becomes substantially flat, at least, after lapse of a sufficient time, a silicon-doped GaN layer is formed. Thereafter, the growth temperature is decreased, followed by growth of an InGaN layer 85 serving as an active layer. Next, the growth temperature is again increased so as to grow a magnesium-doped GaN layer 86. The InGaN layer 85 has a thickness of approximately 0.5 nm to 3 nm. Like the foregoing Example 1, 2, the active layer may be, in some case, made of a quantum well layer or a multiple quantum well layer made of (Al)GaN/InGaN, or may be made of a multiple structure using GaN or InGaN functioned as a guide layer. It is preferred that an AlGaN layer is grown as a layer just above InGaN, like the foregoing examples.

Figure 25:
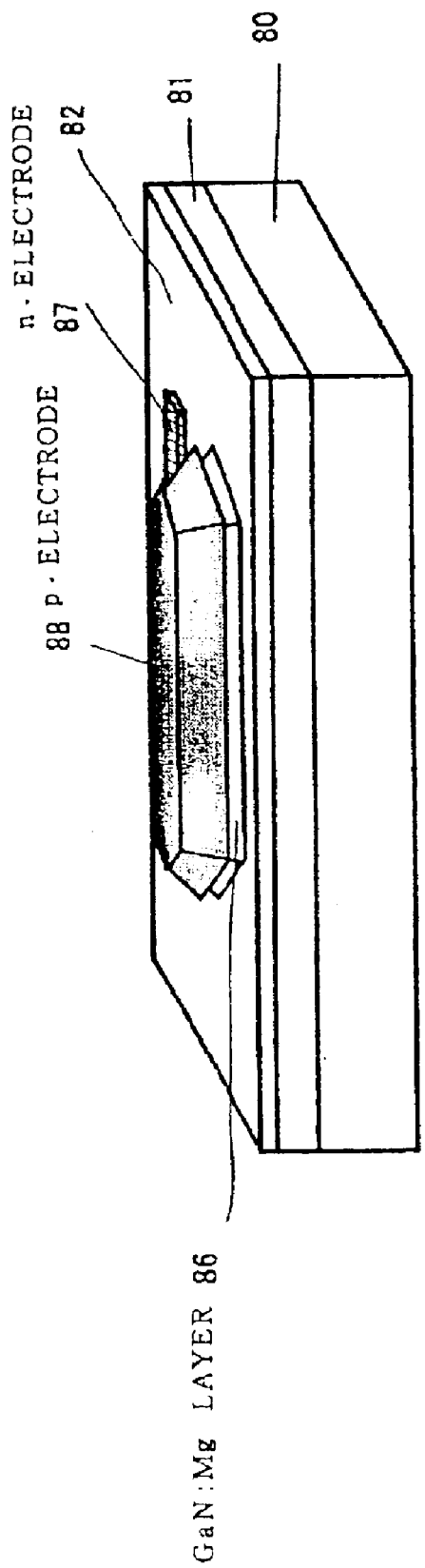
FIG. 25 is a perspective view of a fabrication process showing the step of forming electrodes in the fabrication process of the semiconductor light-emitting element of Example 5 of the present invention.

Thereafter, an opening is made at part of the mask layer to expose the GaN layer 81, followed by vacuum deposition of a Ti/Al/Pt/Au electrode at the removed part. This provides an n-electrode 87. Ni/Pt/Au or Ni(Pd)/Pt/Au is vacuum deposited on the uppermost layer grown on the hexagonal pyramid. The p-electrode 88 is completed through the vacuum deposition (FIG. 25). These depositions should be effected to deposit the p-electrode 88 and n-electrode 87 in high precision, respectively. Thereafter, the p-electrode 88 is divided into a p-electrode 88a, a p-electrode 88b formed on a (11-22) plane, and a p-electrode, not shown, on an S plane. The light-emitting elements are divided into individual ones by RIE (reactive ion etching) or a dicer to complete a light-emitting element of this example.

Figure 26:
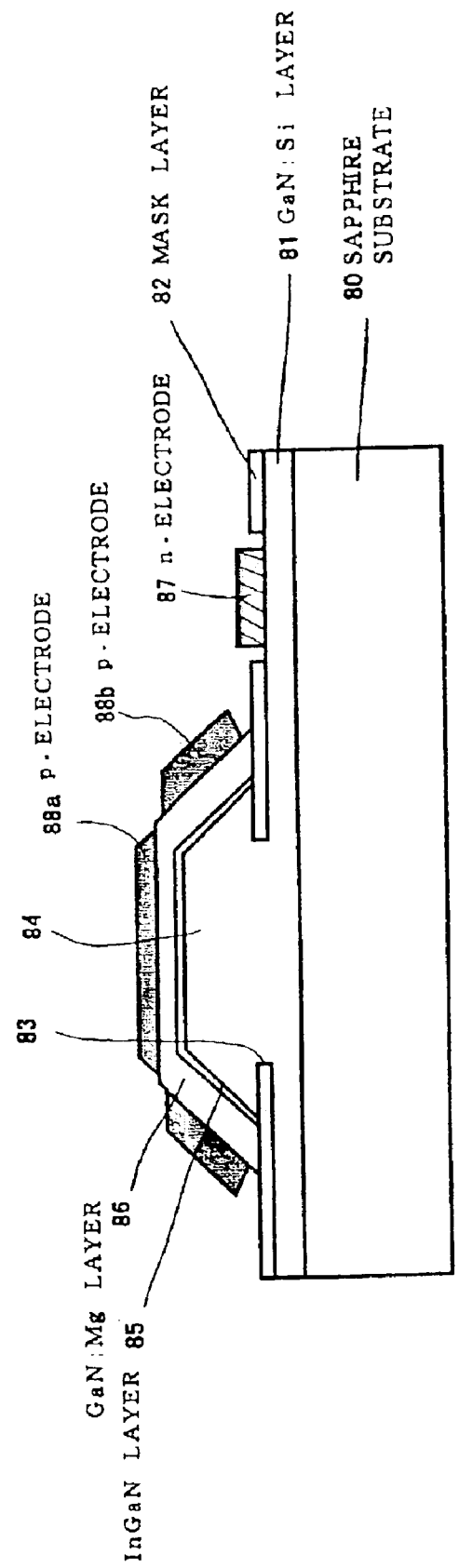
FIG. 26 is a sectional view of the semiconductor light-emitting element of Example 5 of the present invention.

The light-emitting element of this example fabricated in such a fabrication process as set forth hereinabove has such an element structure as shown in FIG. 26 and has the silicon-doped GaN layer 84 formed not only with the S plane, but also with the 11-22 plane. Since the active layer is formed by use of different crystal plane portions of such a structure, it becomes thus possible to arrange a structure suitable for multi-color light emission wherein light-emitting wavelength regions capable of emitting different emission wavelengths at the respective crystal planes are formed.

EXAMPLE 6

Figure 27:
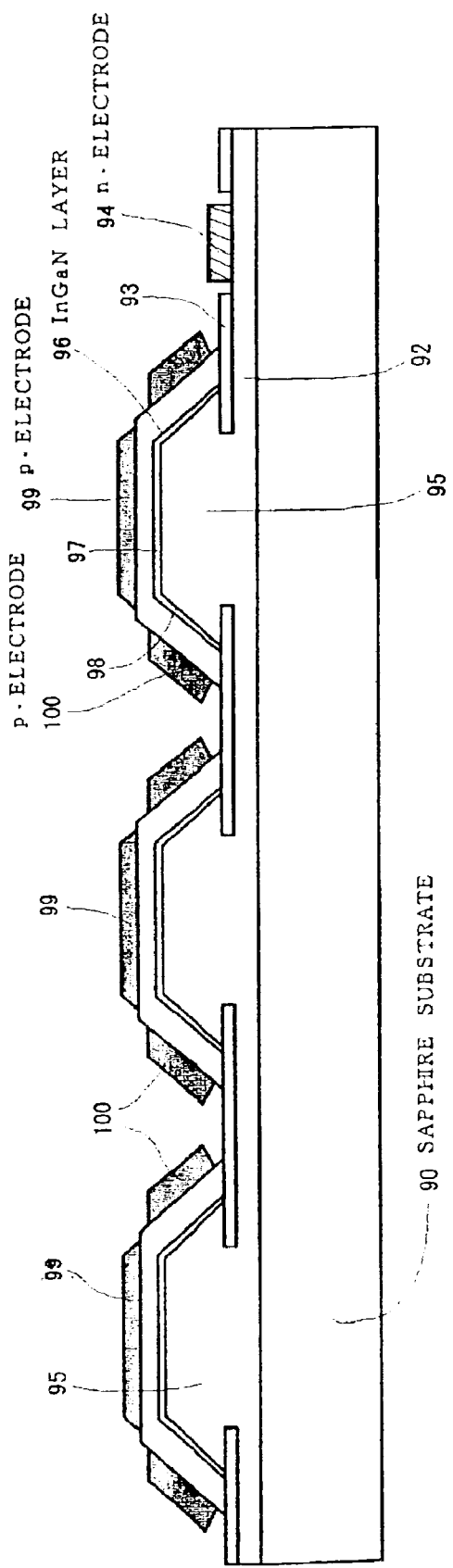
FIG. 27 is a sectional view of an image display device of Example 6 of the present invention.

This example is directed to an image display device wherein a number of semiconductor light-emitting elements of the types stated hereinbefore are arranged side by side. As shown in FIG. 27, a sapphire substrate 90 having a C plane as a principal plane thereof has a silicon-doped GaN layer 92 serving as a crystal species layer and a silicon-doped GaN layer 95, which is a selective crystal growth layer selectively grown through an opening of a mask layer 93. This silicon-doped GaN layer 95 has an S plane, inclined relative to the principal plane of the substrate, and a C plane extending in parallel to the principal plane. An InGaN layer 96 serving as an active layer is formed as extending in parallel to the S plane and C plane. Moreover, a magnesium-doped GaN layer serving as a clad layer is formed on the InGaN layer 96.

The silicon-doped GaN layer 95 is in the form of a hexagonal pyramidal trapezoid covered with S and C planes, and the InGaN layer 96 serving as the active layer are extended in parallel to the respective S planes and C plane. The composition of the InGaN layer 96 is reflective of the shape of the GaN layer 95 in the form of the hexagonal pyramidal trapezoid covered with the S planes and the C plane wherein a second light-emitting wavelength region 97 of a longer wavelength is formed at the C plane side of the selective crystal growth layer, and a first emission wavelength region 98 of a shorter wavelength is formed at the S plane side of the selective crystal growth layer. The second emission wavelength region 97 is capable, for example, of green light emission, and the first emission wavelength region 98 is capable, for example, of blue light emission.

A p-electrode 99 that supplies an electric current to the second light-emitting wavelength region 97 at the C plane side is formed, and the first emission wavelength region 98 at the S plane side is formed with a p-electrode 100 for supplying an electric current. Further, a common n-electrode 94 is formed for the purpose of supplying an electric current to individual semiconductor light-emitting elements.

When the image display device of this example arranges elements capable of multi-color light emission on the substrate 90 and drive signals for the elements corresponding to image signals are applied thereto, this device can be used as a given color display device. If individual light-emitting devices are those capable of emitting three wavelengths or if a light-emitting element capable of emitting light of a wavelength different from those of a two color light-emitting element is arranged adjacent to the two color light-emitting element, there can be obtained a full color image display device. When a light-emitting element having light emission regions whose emission wavelengths differ from one another is applied at the respective electrodes thereof with such a signal as to ensure the same emission intensity, an illumination device can be provided.

It will be noted that although semiconductor light-emitting elements of the same type may be arranged to provide an image display device or an illumination device, semiconductor light-emitting devices fabricated by different methods may be partly combined to provide such devices.

EXAMPLE 7

This example is one which deals with the formation of a selective crystal growth layer having S planes by direct selective growth on a sapphire substrate and the formation of independent p-electrodes corresponding to three emission wavelengths. With reference to FIGS. 28 to 33, the element structure is described along with its fabrication process.

Figures 28A, 28B:
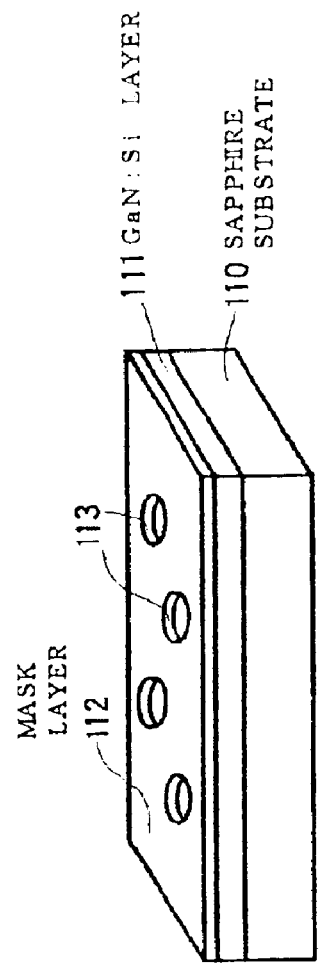
FIG. 28 is a view showing the step of forming a mask in the fabrication process of a semiconductor light-emitting element of Example 7 of the present invention, including a sectional view (A) in the fabrication process and a perspective view (B) in the fabrication process.

First, a low temperature buffer layer made of either AlN or GaN is formed on a sapphire substrate 110 having a C+ plane as a principal plane thereof at a low temperature of 500° C. After raising to a temperature of 1000° C., a silicon-doped GaN layer 111 is formed. Subsequently, a mask layer 112 made of SiO₂ or SiN is formed over the entire surface in a thickness ranging from 100 to 500 nm, and openings 113 with a size of approximately 10 µm are formed by use of photolithography and a hydrofluoric acid etchant (FIG. 28). In this example, the opening 113 is substantially in a round shape, and the size may be changed depending on the intended characteristics of a light-emitting element to be fabricated.

Figure 29A:
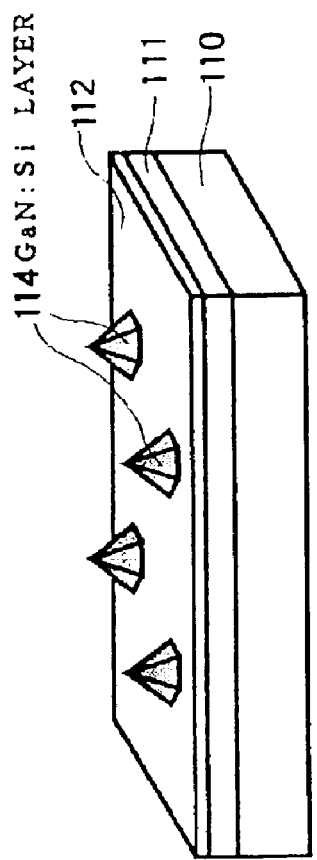
FIG. 29 is a view showing the step of forming a silicon-doped GaN layer in the fabrication process of the semiconductor light-emitting element of Example 7 of the present invention, including a sectional view (A) in the fabrication process and a perspective view (B) in the fabrication process.
Figure 29B:
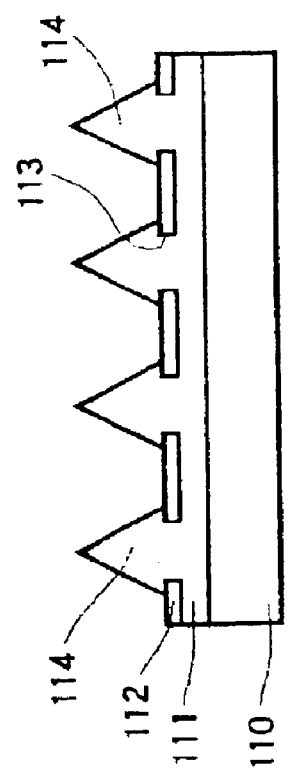

Next, crystal growth is performed once more, whereupon the temperature is increased to approximately 1000° C. to form a silicon-doped GaN layer 114, which is a selective crystal growth layer, at the respective openings 113. This Si-doped GaN layer 114 is grown at the openings 113 of the mask layer 112, and when the growth is continued for a while, a hexagonal pyramidal form develops. The surfaces of the hexagonal pyramid are covered with an S (1-101) plane as shown in FIG. 29. Different growth conditions may result in the hexagonal trapezoidal form. The openings 113 should be sufficiently kept away from one another so that adjacent growth portions are not broken down. After the formation of the hexagonal pyramids each made of the Si-doped GaN layer 114, the selective growth is continued for a while. When the hexagonal pyramid has a width of approximately 20 µm (i.e., about 10 µm at one side), the height is approximately 1.6 times the length of one side as a hexagonal pyramid, resulting in approximately 16 µm. The crystal layer of the hexagonal pyramidal form covered with the S (1-101) planes preferably should be grown so that the size in a lateral direction along the principal plane of the substrate is larger than the size of the opening 113. It will be noted that the width of the hexagonal pyramid at approximately 20 µm is indicated only for illustration, and the width of the hexagonal pyramid can be made, for example, at approximately 10 µm.

After the formation of the hexagonal pyramid-shaped GaN layer 114 grown to such an extent as set out above and covered with the S planes, Si-doped GaN is further grown, followed by lowering the growth temperature to form an InGaN layer 115. Thereafter, the growth temperature is increased to permit a Mg-doped GaN layer 116 to be grown as covering the hexagonal pyramid-shaped portion therewith. In FIG. 30, the InGaN layer 115 is depicted as a line. The InGaN layer 115 has a thickness of approximately 0.5 nm to 3 m. For the active layer, a quantum well structure (QW) or a multiple quantum well structure (MQW) of an (Al) GaN/InGaN structure may be used. Alternatively, there may be used a multiple structure using a guide layer of GaN or InGaN. In this connection, it is preferred to grow an AlGaN layer as a layer just above InGaN. At this stage, the composition and thickness of the InGaN layer 115 serving as the active layer is reflective of the shape of the GaN layer 114 in the form of a hexagonal pyramid covered with the S planes so that the composition and thickness gradually vary in matching with the shape and between a side near the substrate and a side remote from the substrate. In this condition, the emission wavelength becomes longer at a side near the center, and is shorter at a portion near the substrate. Accordingly, when independent three electrodes are independently formed on the S planes, first to third light-emitting wavelength regions can be formed.

Figure 31A:
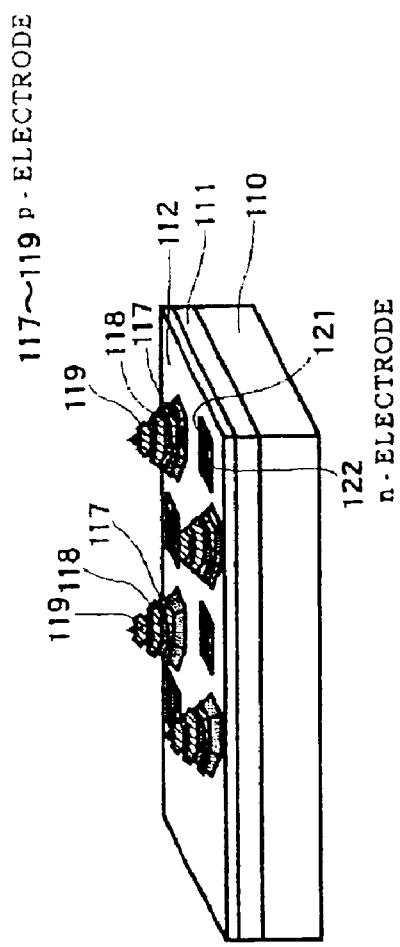
FIG. 31 is a view showing the step of forming electrodes in the fabrication process of the semiconductor light-emitting element of Example 7 of the present invention, including a sectional view (A) in the fabrication process and a perspective view (B) in the fabrication process.
Figure 31B:
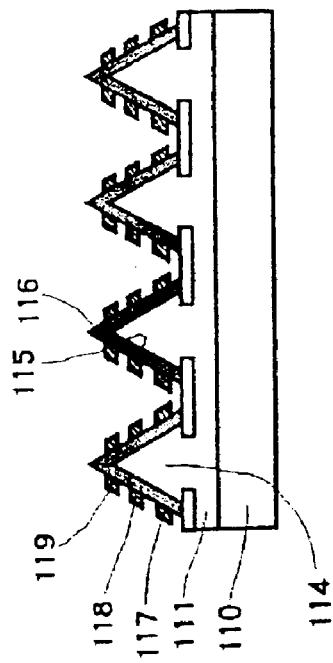

Thereafter, part of the mask layer 112 on the substrate having the growth layers is removed to form openings 121. A Ti/Al/Pt/Au electrode is vacuum deposited at the opening 121 formed by the removal of the part. This serves as an n-electrode 120. Moreover, a Ni/Pt/Au electrode or Ni (Pd)/Pt/Au electrode is vacuum deposited on the uppermost layer grown on the hexagonal pyramid. In this way, p-electrodes are formed. Moreover, as shown in FIG. 31, the Ni/Pt/Au electrode or Ni (Pd)/Pt/Au electrode is partly removed by lift-off using photolithography, thereby forming p-electrodes 117, 118 and 119 formed by division into three portions along the height of the hexagonal pyramid as shown in FIG. 31. The p-electrode 117 is an electrode which corresponds to the shortest wavelength light emission region and is so formed that an electric current is charged into a region capable of blue light emission. The p-electrode 118 is an electrode corresponding to a light-emitting wavelength region of a next shortest wavelength and is so formed that an electric current is chargeable into a region capable of green light emission. The p-electrode 119 is an electrode, which corresponds to the longest wavelength light emission region and is so formed as to charge an electric current into a region capable of red light emission.

The results of measurement of emission wavelength according to cathode luminescence reveal a shift of a wavelength by 100 to 150 nm from the upper portion to lower portion of the hexagonal pyramid. This corresponds to a wavelength interval covering blue light to red light (470 nm–620 nm). Thus, the semiconductor light-emitting element of this example exhibits light emission of different wavelengths from a single element by changing the electrode sites along the S plane as with the case of the p-electrodes 117, 118, 119. Further, when the same signal is applied to the p-electrodes 117, 118, 119 so that the regions capable of emission at different wavelengths are invariably kept at the same level of emission intensity, a white light source is provided. It will be noted that the n-electrode 120 is one that is common for the three emission wavelength regions, and is formed at the surface side of the substrate in FIG. 31. Alternatively, it is possible to form the n-electrode at the back side of the GaN layer 114, which is a selective crystal growth layer, after removal of the sapphire substrate 110.

Figure 32A:
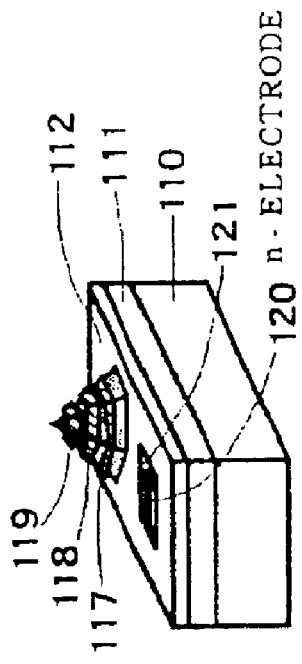
FIG. 32 is a view showing the element isolation step in the fabrication process of the semiconductor light-emitting element of Example 7 of the present invention, including a sectional view (A) in the fabrication process and a perspective view (B) in the fabrication process.
Figure 32B:
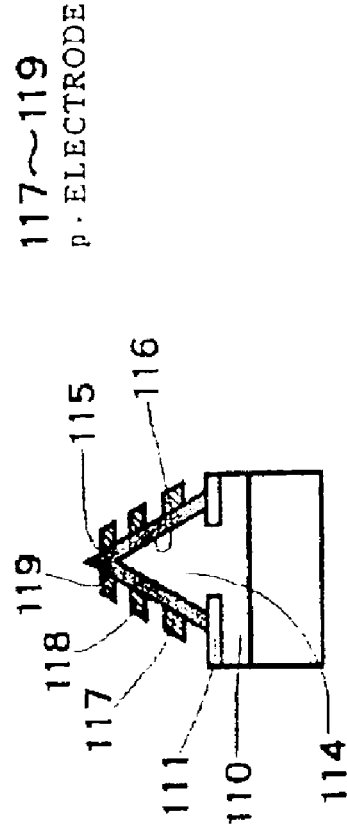

Thereafter, the semiconductor light-emitting elements, each formed with the p-electrodes divided into three portions, are separated from one another according to RIE or via a dicer as shown in FIG. 32. In this way, the light-emitting element of this example is completed. The element used is easy for fabrication when it takes a hexagonal pyramidal form, thus leading to the cost saving. Especially, AFM or the like is used to take an AFM image where a step is fine and close to a line. In actual applications, when the clearest portion of the step is employed, a luminous efficiency can be further improved.

Figure 33:
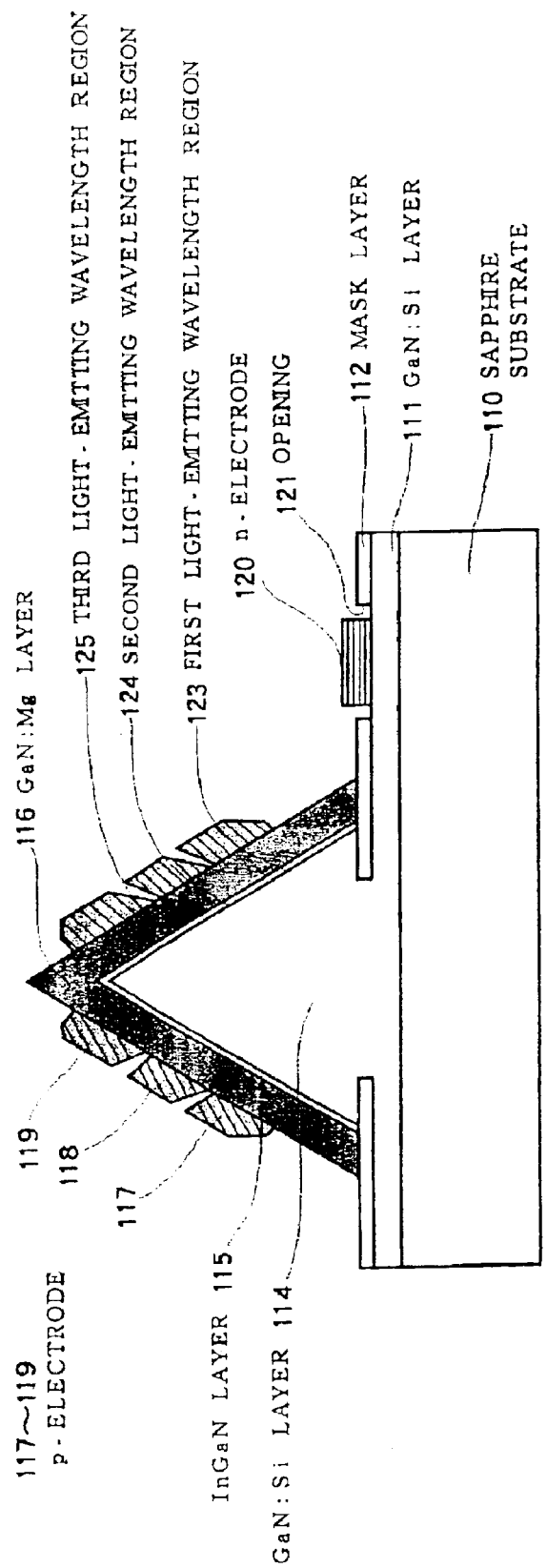
FIG. 33 is a sectional view showing the structure of the semiconductor light-emitting element of Example 7 of the present invention.

The light-emitting element of this example fabricated in such a fabrication process as set forth hereinabove has the structure shown in FIG. 33. The main arrangement includes, on the sapphire substrate 110 having the C+ plane as a principal plane thereof, the silicon-doped GaN layer 111 serving as a crystal seed layer, and the silicon-doped GaN layer 114 selectively grown via the opening 113 of the mask layer 112 and serving as a selective crystal growth layer. This silicon-doped GaN layer 114 has the S plane inclined relative to the principal plane of the substrate, and the InGaN layer 115 serving as an active layer is formed as extending in parallel to the S planes. Further, the magnesium-doped GaN layer 116 serving as a clad layer is formed on the InGaN layer 115.

The silicon-doped GaN layer 114 is in the form of a hexagonal pyramid covered with the S planes, and the InGaN layer 115 acting as an active layer extends in parallel to the respective S planes. The thickness and composition of the InGaN layer 115 gradually vary between the side near the substrate and the side distant from the substrate. Thus, first to third emission wavelength regions 123, 124 and 125 are formed in the InGaN layer 115 wherein the emission wavelength becomes longer at the side nearer to the center and shorter at a portion nearer to the substrate.

The p-electrode 117, p-electrode 118 and p-electrode 119 corresponding to these first to third emission wavelength regions 123, 124 and 125, respectively, are formed on the magnesium-doped GaN layer 116, so that an electric current is independently chargeable into the first to third emission wavelength regions 123, 124 and 125. The n-electrode 120 is formed at the region of each opening 121 made at the side portion of the hexagonal pyramid portion and is connected to the silicon-doped GaN layer 114 via the silicon-doped GaN layer 111.

In order to enable the active layer to be responsible for multi-color light emission, the semiconductor light-emitting element of this example having such a structure as set forth hereinabove is arranged such that the S planes, inclined relative to the substrate principal plane, of the GaN layer 114, which is selectively grown and serves as a selective crystal growth layer, formed beneath the active layer are utilized so that the active layer is grown on the S planes wherein band gaps formed in the active layer are changed without resorting to, in particular, etching. In this way, a light emitting element capable of multi-color light emission is easily fabricated, ensuring precise formation without inviting degradation of crystallinity.

Since the S planes inclined relative to the principal plane of the substrate are utilized, the number of bonds of from the nitrogen atom to the gallium atom increases, so that it becomes possible to increase an effective V/III ratio. Thus, the resultant semiconductor light-emitting element can be made high in performance. The principal plane of the substrate consists of a C+ plane, and the S planes are ones different from the main plane of the substrate, so that dislocations extending from the substrate upwardly are bent, making it possible to reduce the number of defects.

In actual applications of the element, the n-electrode is commonly used and an electric current is independently supplied to the three electrodes, thereby obtaining independent light emissions. It will be noted that the three electrodes can be insulated from one another by etching or ion implantation. The thus formed semiconductor light-emitting element is able to emit light at least simultaneously through two different wavelengths from such independent signal controls.

EXAMPLE 8

This example is one which deals with the formation of a selective crystal growth layer having S planes by direct selective growth on a sapphire substrate and the formation of independent p-electrodes, corresponding to two color light-emitting wavelengths, at plane and side portions of the S plane. With reference to FIGS. 34 to 39, the element structure is described along with its fabrication process.

Figure 34A:
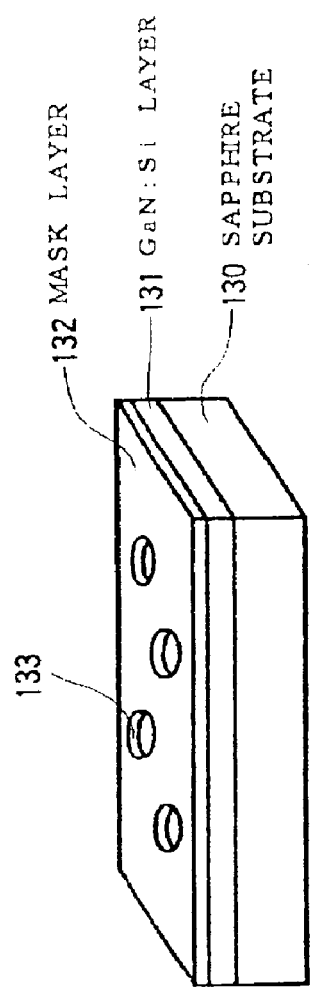
FIG. 34 is a view showing the step of forming a mask in the fabrication process of a semiconductor light-emitting element of Example 8 of the present invention, including a sectional view (A) in the fabrication process and a perspective view (B) in the fabrication process.
Figure 34B:
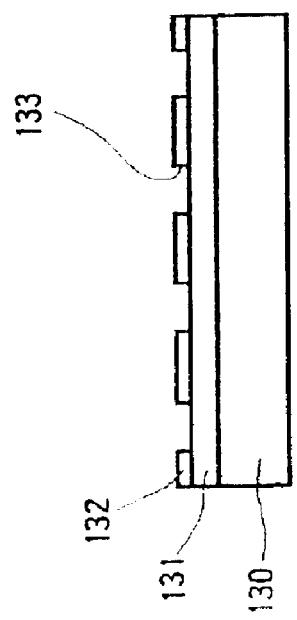

First, a low temperature buffer layer made of either AlN or GaN is formed on a sapphire substrate 130 having a C+ plane as a principal plane thereof at a low temperature of 500° C. After raising to a temperature of 1000° C., a silicon-doped GaN layer 131 is formed. Subsequently, a mask layer 132 made of $SiO_2$ or SiN is formed over the entire surface in a thickness ranging from 100 to 500 nm, and openings 133 with a size of approximately 10 µm are formed by use of photolithography and a hydrofluoric acid etchant (FIG. 34). In this example, the opening 133 is substantially in a round shape, and the size may be changed depending on the intended characteristics of a light-emitting element to be fabricated.

Figure 35A:
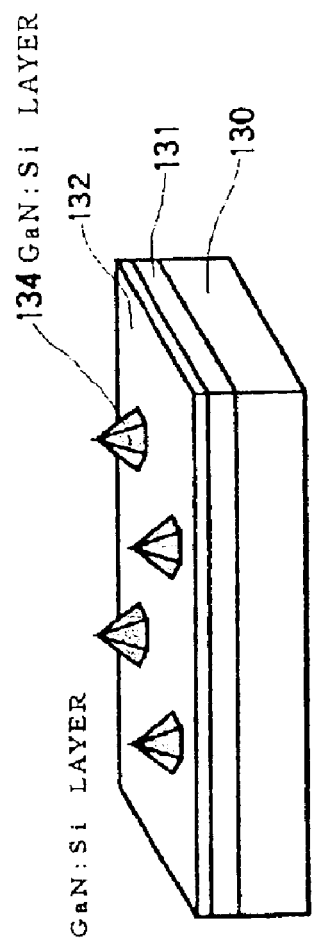
FIG. 35 is a view showing the step of forming a crystal layer in the fabrication process of the semiconductor light-emitting element of Example 8 of the present invention, including a sectional view (A) in the fabrication process and a perspective view (B) in the fabrication process.
Figure 35B:
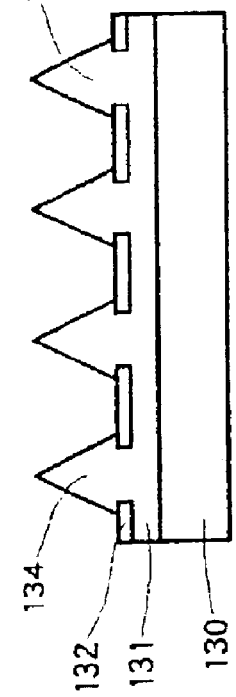

Next, crystal growth is performed once more, whereupon the temperature is increased to approximately 1000° C. to form a silicon-doped GaN layer 134, which is a selective crystal growth layer, at the respective openings 133. This Si-doped GaN layer 134 is grown at the openings 133 of the mask layer 132, and when the growth is continued for a while, a hexagonal pyramidal form develops. The surfaces of the hexagonal pyramid are covered with an S (1-101) plane as shown in FIG. 35. If the growth time is in shortage, a hexagonal trapezoidal shape is formed. Accordingly, the Si-doped GaN layer 134 is continuously grown until a hexagonal pyramid which is covered with the S (1-101) planes is obtained. To this end, the openings 133 should be sufficiently kept away from each other at appropriate pitches. When the hexagonal pyramid has a width of approximately 20 µm (i.e., about 10 µm at one side) by continuing the selective growth for a given time after the formation of the hexagonal pyramid with the GaN layer 134, the height is approximately 1.6 times the length of one side as a hexagonal pyramid, resulting in approximately 16 µm. The crystal layer of the hexagonal pyramidal form covered with the S (1-101) planes preferably should be grown so that the size in a lateral direction along the principal plane of the substrate is larger than the size of the opening 113.

After the formation of the hexagonal pyramid-shaped GaN layer 134 grown to such an extent as set above and covered with the S planes, Si-doped GaN is further grown, followed by lowering the growth temperature to form an InGaN layer 135. Thereafter, the growth temperature is increased to permit a Mg-doped GaN layer 136 to be grown as covering the hexagonal pyramid-shaped portion therewith. In FIG. 36, the InGaN layer 135 is depicted as a line. The InGaN layer 135 has a thickness of approximately 0.5 nm to 3 nm. For the active layer, a quantum well structure (QW) or a multiple quantum well structure (MQW) of an (Al) GaN/InGaN structure may be used. Alternatively, there also may be used a multiple structure using a guide layer of GaN or InGaN. In this connection, it is preferred to grow an AlGaN layer as a layer just above InGaN. At this stage, the composition and thickness of the InGaN layer 135 serving as the active layer is reflective of the shape of the GaN layer 134 in the form of a hexagonal pyramid covered with the S planes so that the composition and thickness gradually vary in matching with the shape. A second light-emitting wavelength region is formed at a side portion which is a contact line between the S planes of the selective crystal growth layer, and a first light-emitting wavelength region is formed at the portion of the S planes of the selective crystal growth layer. The emission wavelength becomes longer at the second light-emitting wavelength region including the contact line between the S planes and becomes shorter at the first light-emitting wavelength region formed at the portion of the S plane nearer to the substrate. The second emission region of a longer wavelength develops, for example, green light emission, and the first emission region of a shorter wavelength develops, for example, blue light emission.

Figure 37A:
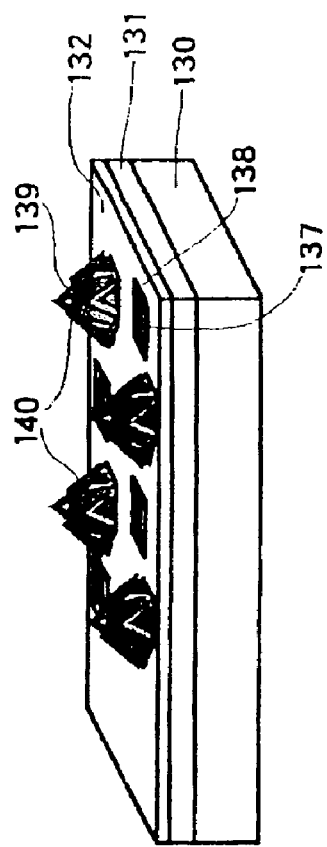
FIG. 37 is a view showing the step of forming electrodes in the fabrication process of the semiconductor light-emitting element of Example 8 of the present invention, including a sectional view (A) in the fabrication process and a perspective view (B) in the fabrication process.
Figure 37B:
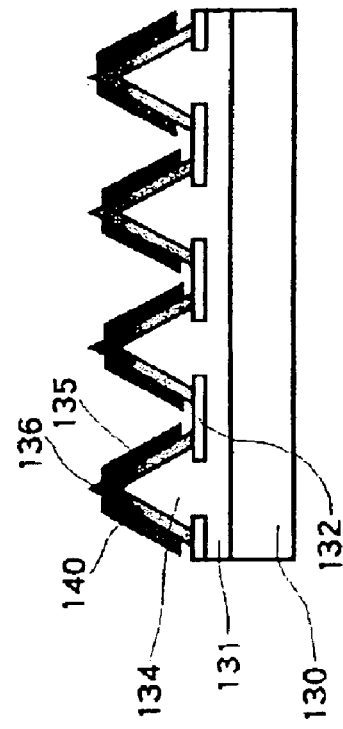

Thereafter, part of the mask layer 132 on the substrate having the growth layers is removed to form openings 138. A Ti/Al/Pt/Au electrode is vacuum deposited at the opening 138 formed by the removal of the part. This serves as an n-electrode 137. Moreover, a Ni/Pt/Au electrode or Ni (Pd)/Pt/Au electrode is vacuum deposited on the Mg-doped GaN layer 136, which is the uppermost layer grown on the hexagonal pyramid. Initially, the Ni/Pt/Au layer or Ni (Pd)/Pt/Au layer is vacuum deposited, and the surface electrode is partly removed by lift-off by use of photolithography for division into side portions and plane portions of the hexagonal pyramid, thereby forming p-electrodes 139, 140 which are independent at the plane and side portions of the hexagonal pyramid as shown in FIG. 37. Thus, light-emitting wavelength regions whose emission wavelengths differ from each other are formed at the side and plane portions of the hexagonal pyramid, respectively. Such independent electrodes are formed in the semiconductor light-emitting element, permitting at least emission wavelengths corresponding to blue light and green light at 470 nm and 520 nm to be outputted. The results of measurement of emission wavelength according to cathode luminescence reveal a shift of a wavelength by 50 nm between the side portion and the plane portion of the hexagonal pyramid. This corresponds to a wavelength interval covering blue light to green light (470 nm–520 nm). Thus, this permits a single element to emit light with different wavelengths. When the same signal is applied to the p-electrodes 139, 140 so that the regions of different wavelengths are invariably kept at the same potential and a red component is added by use of an emission diode made of another type of material, if necessary, a white light source can be provided. It will be noted that the n-electrode 137 is one that is common for the three emission wavelength regions, and is formed at the surface side of the substrate in FIG. 37. Alternatively, it is possible to form the n-electrode at the back side of the GaN layer 134, which is a selective crystal growth layer, after removal of the sapphire substrate 130.

Figure 38A:
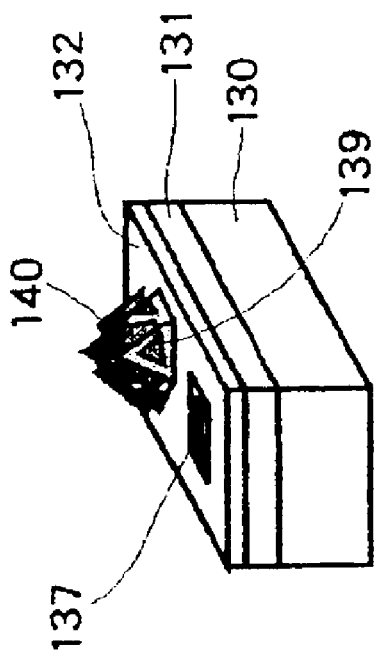
FIG. 38 is a view showing the element isolation step in the fabrication process of the semiconductor light-emitting element of Example 8 of the present invention, including a sectional view (A) in the fabrication process and a perspective view (B) in the fabrication process.
Figure 38B:
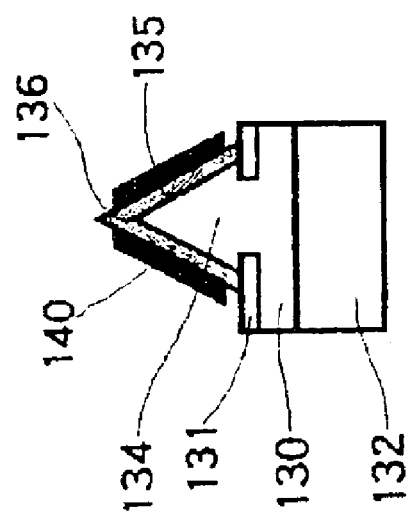

Thereafter, the semiconductor light-emitting elements are separated from one another according to RIE or via a dicer (FIG. 38). In this way, the light-emitting element of this example is completed. The element used is easy for fabrication when it takes a hexagonal pyramidal form, thus leading to the cost saving. Especially, AFM or the like is used to take an AFM image where a step is fine and close to a line. In actual applications, when the clearest portion of the step is employed, a luminous efficiency can be further improved.

Figure 39:
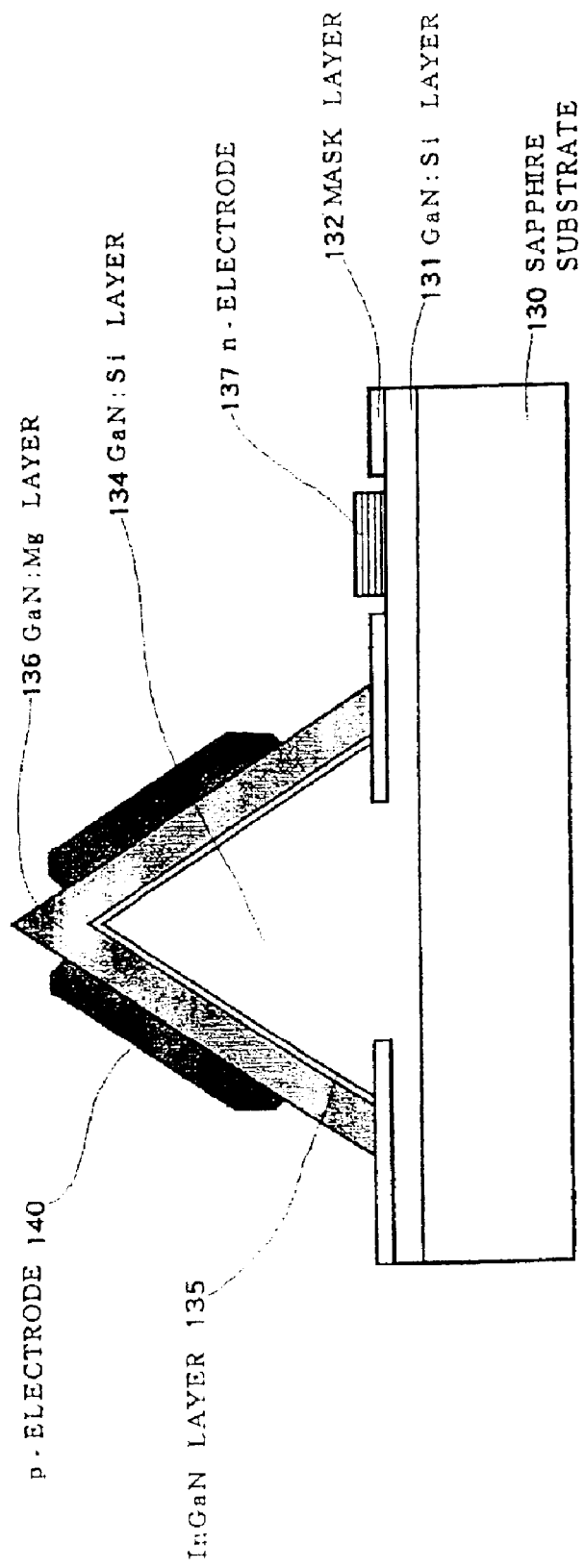
FIG. 39 is a sectional view showing the semiconductor light-emitting element of Example 8 of the present invention.

FIG. 39 shows the structure of the light-emitting element of this example whose main arrangement includes, on the sapphire substrate 130 having the C+ plane as a principal plane thereof, the silicon-doped GaN layer 131 serving as a crystal seed layer, and the silicon-doped GaN layer 134 selectively grown via the opening 133 of the mask layer 132 and serving as a selective crystal growth layer. This silicon-doped GaN layer 134 has the S plane inclined relative to the principal plane of the substrate, and the InGaN layer 135 serving as an active layer is formed as extending in parallel to the S planes. Further, the magnesium-doped GaN layer 136 serving as a clad layer is formed on the InGaN layer 135.

The silicon-doped GaN layer 134 is in the form of a hexagonal pyramid covered with the S planes, and the InGaN layer 135 acting as an active layer extends in parallel to the respective S planes. The thickness and composition of the InGaN layer 135 is reflective of the shape of the hexagonal pyramid-shaped GaN layer 134 covered with the S planes and thus vary in matching with the shape thereof. The second emission wavelength region of a longer wavelength is formed at the side portion which is the contact line between the S planes of the selective crystal growth layer, and the first emission wavelength region of a shorter wavelength is formed on the portion of the S planes of the selective crystal growth layer. The second emission wavelength region develops, for example, a green light emission and the first emission wavelength region develops, for example, blue light emission.

The p-electrode 139 and p-electrode 140 respectively corresponding to these first and second emission wavelength regions are formed on the magnesium-doped GaN layer 136, so that an electric current is independently chargeable into the first and second emission wavelength regions. The n-electrode 137 is formed at the region of each opening 138 made at the side portion of the hexagonal pyramid portion and is connected to the silicon-doped GaN layer 134 via the silicon-doped GaN layer 132.

In order to enable the active layer to be responsible for multi-color light emission, the semiconductor light-emitting element of this example having such a structure as set forth hereinabove is arranged such that the S planes, inclined relative to the substrate principal plane, of the GaN layer 134, which is selectively grown and serves as a selective crystal growth layer, formed beneath the active layer are utilized so that the active layer is grown on the S planes wherein band gaps formed in the active layer are changed without resorting to, in particular, etching. In this way, a light emitting element capable of multi-color light emission is easily fabricated, ensuring precise formation without inviting degradation of crystallinity.

Since the S planes inclined relative to the principal plane of the substrate are utilized, the number of bonds of from the nitrogen atom to the gallium atom increases, so that it becomes possible to increase an effective V/III ratio. Thus, the resultant semiconductor light-emitting element can be made high in performance. The principal plane of the substrate consists of a C+ plane, and the S planes are ones different from the main plane of the substrate, so that dislocations extending from the substrate upwardly are bent, making it possible to reduce the number of defects.

EXAMPLE 9

This example is one which deals with the formation of a selective crystal growth layer having S and C planes by direct selective growth on a sapphire substrate and the formation of independent p-electrodes, corresponding to two color light-emitting wavelengths, by division into the regions of the S plane and the C plane. With reference to FIGS. 40 to 45, the element structure is described along with its fabrication process.

Figure 40A:
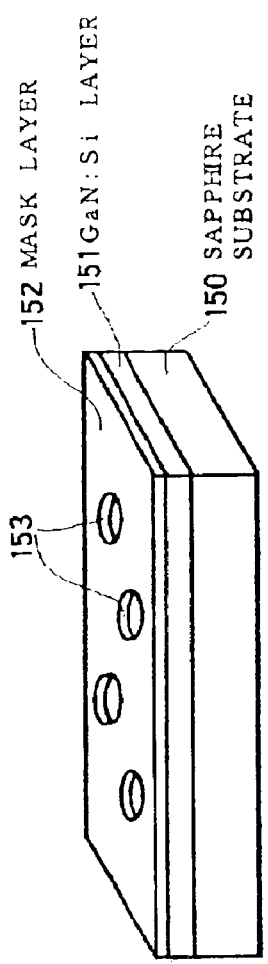
FIG. 40 is a view showing the step of forming a mask in the fabrication process of a semiconductor light-emitting element of Example 9 of the present invention, including a sectional view (A) in the fabrication process and a perspective view (B) in the fabrication process.
Figure 40B:
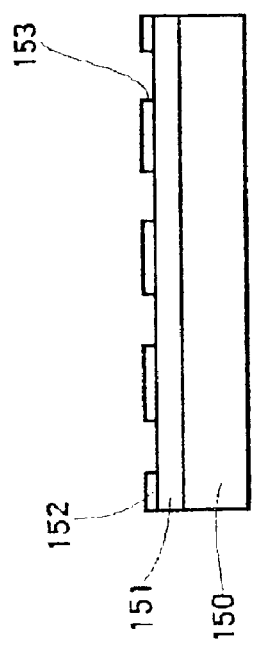

First, a low temperature buffer layer made of either AlN or GaN is formed on a sapphire substrate 150 having a C+ plane as a principal plane thereof at a low temperature of 500° C. After raising to a temperature of 1000° C., a silicon-doped GaN layer 151 is formed. Subsequently, a mask layer 152 made of $SiO_2$ or SiN is formed over the entire surface in a thickness ranging from 100 to 500 nm, and openings 153 with a size of approximately 10 µm are formed by use of photolithography and a hydrofluoric acid etchant (FIG. 40). In this example, the opening 153 is substantially in a round shape, and the size may be changed depending on the intended characteristics of a light-emitting element to be fabricated.

Figure 41A:
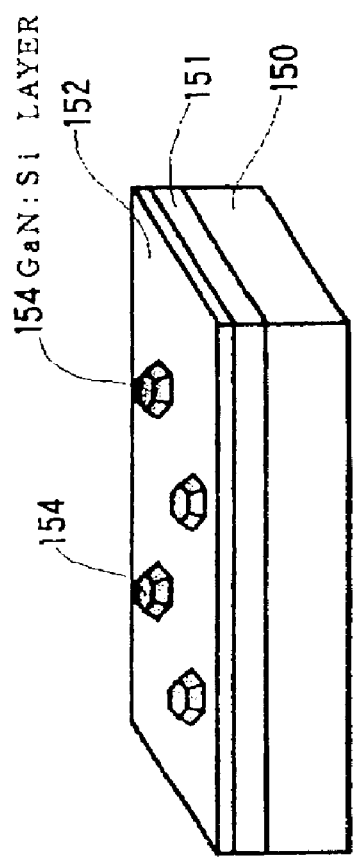
FIG. 41 is a view showing the step of forming a crystal layer in the fabrication process of the semiconductor light-emitting element of Example 9 of the present invention, including a sectional view (A) in the fabrication process and a perspective view (B) in the fabrication process.
Figure 41B:
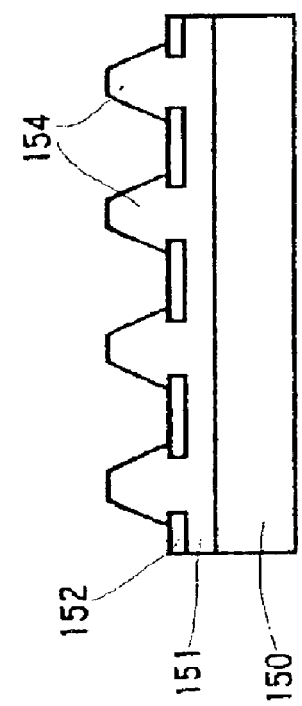
Figure 42A:
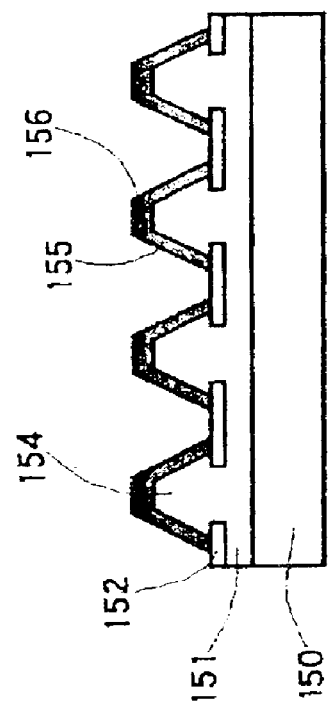
FIG. 42 is a view showing the step of forming an active layer and the like in the fabrication process of the semiconductor light-emitting element of Example 9 of the present invention, including a sectional view (A) in the fabrication process and a perspective view (B) in the fabrication process.
Figure 42B:
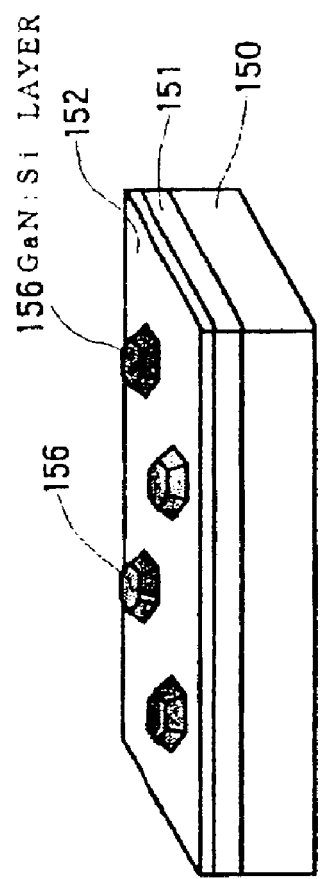

Next, crystal growth is performed once more, whereupon the temperature is increased to approximately 1000° C. to form a silicon-doped GaN layer 154 by selective crystal growth. This Si-doped GaN layer 154 is grown at the openings 153 of the mask layer 152, and when the growth is continued for a while, a hexagonal pyramidal trapezoidal form develops as shown in FIG. 41. The inclined surfaces of the hexagonal pyramid are covered with an S (1-101) plane, with its upper surface being covered with the C plane which is the same as the principal plane of the sapphire substrate 150. When the uppermost portion of the C plane becomes substantially flat after passage of a sufficient time, the silicon-doped GaN layer is further formed, followed by further growth for a time to grow a silicon-doped GaN layer 154 as a first conduction-type clad layer. Thereafter, the growth temperature is lowered to grow an InGaN layer 155. Subsequently, the growth temperature is increased, thereby growing a magnesium-doped GaN layer 156 as shown in FIG. 42.

The InGaN layer 155 has a thickness of approximately 0.5 nm to 3 nm. For the active layer, a quantum well structure (QW) or a multiple quantum well structure (MQW) of an (Al) GaN/InGaN structure may be used. Alternatively, there also may be used a multiple structure using a guide layer of GaN or InGaN. In this connection, it is preferred to grow an AlGaN layer as a layer just above InGaN. The composition and thickness of the InGaN layer 115 serving as the active layer is reflective of the shape of the GaN layer 154 in the form of a hexagonal pyramidal trapezoid covered with the S planes at the side planes and also with the C plane, parallel to the principal plane of the substrate, at the upper surface thereof. In matching with the shape, the emission wavelength becomes longer at the C plane nearer to the center and becomes shorter at the S planes nearer to the substrate. Accordingly, when electrodes formed by separation on the C plane and the S plane are formed, there can be formed first and second light-emitting wavelength regions.

Thereafter, part of the mask layer 152 on the substrate having the growth layers is removed to form openings 160. A Ti/Al/Pt/Au electrode is vacuum deposited within a region of the opening 160 formed by the removal of the part. This serves as an n-electrode 159. Moreover, a Ni/Pt/Au electrode or Ni (Pd)/Pt/Au electrode is vacuum deposited on the uppermost layer of the Mg-doped GaN layer 156 of the hexagonal pyramidal trapezoid. The p-electrode is formed by use of a Ni/Pt/Au electrode or Ni (Pd)/Pt/Au electrode. Further, as shown in FIG. 43, the Ni/Pt/Au electrode or Ni (Pd)/Pt/Au electrode is partly removed by lift-off by use of photolithography, thereby forming a p-electrode 157 on the S plane and a p-electrode 158 respectively on the C plane. The p-electrodes 157 are independently formed as separated on the six S planes, and the p-electrode 158 is formed on the C plane while separating from other p-electrodes 157. The p-electrode 157 corresponds to a light-emitting wavelength region of a shorter wavelength of the active layer, and the p-electrode 158 corresponds to a light-emitting wavelength region of a longer wavelength of the active layer. It will be noted that the p-electrode 157 is formed on each S plane, and all the p-electrodes may be commonly formed for all the S planes. Moreover, it may be possible to arrange first to third light-emitting wavelength regions having independent p-electrodes by forming a p-electrode for a longer wavelength on the C plane of the hexagonal pyramidal trapezoid and a p-electrode for a shorter wavelength on the plane portion of the S plane, and also forming a p-electrode for an intermediate wavelength at a side portion which is a contact line between the S planes.

Figure 44A:
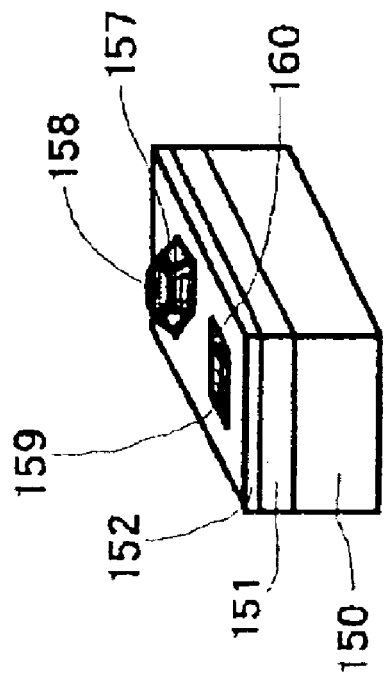
FIG. 44 is a view showing the element isolation step in the fabrication process of the semiconductor light-emitting element of Example 9 of the present invention, including a sectional view (A) in the fabrication process and a perspective view (B) in the fabrication process.
Figure 44B:
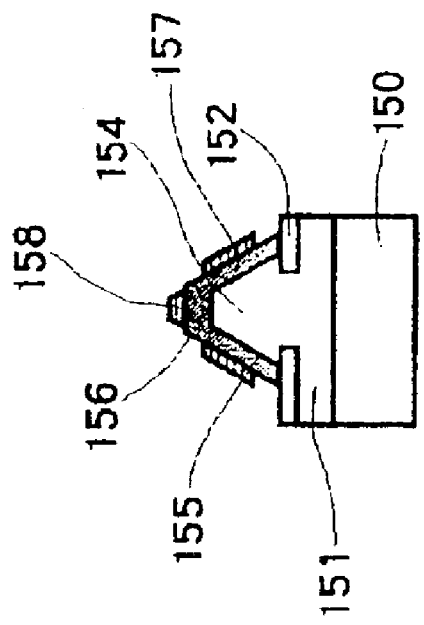

For these vacuum depositions, when the p-electrodes 157, 158 and the n-electrode 159 are in contact with both the hexagonal pyramid-shaped layer and the silicon-doped GaN layer formed beneath the mask, short-circuiting takes place. To avoid this, high precision deposition is necessary. Thereafter, as shown in FIG. 44, the semiconductor light-emitting elements are separated from each other according to RIE or a dicer.

Figure 45:
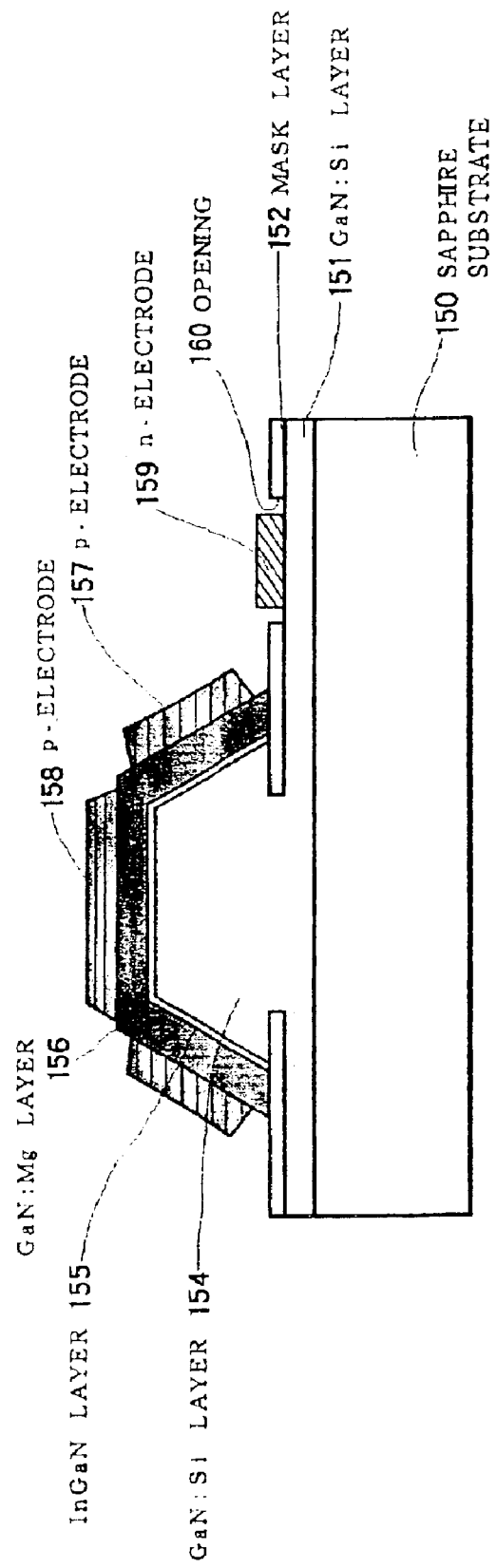
FIG. 45 is a sectional view showing the semiconductor light-emitting element of Example 9 of the present invention.

FIG. 45 shows the structure of the light-emitting element of this example whose main arrangement includes, on the sapphire substrate 150 having the C+ plane as a principal plane thereof, the silicon-doped GaN layer 151 serving as a crystal seed layer, and the silicon-doped GaN layer 154 selectively grown via the opening 153 of the mask layer 152 and serving as a selective crystal growth layer. This silicon-doped GaN layer 154 has the S plane inclined relative to the principal plane of the substrate and the C+ plane parallel to the principal plane of the substrate, and the InGaN layer 155 serving as an active layer is formed as extending in parallel to the S and C+ planes. Further, the magnesium-doped GaN layer 156 serving as a clad layer is formed on the InGaN layer 155.

The silicon-doped GaN layer 154 is in the form of a hexagonal pyramidal trapezoid covered with the S and C planes, and the InGaN layer 155 acting as an active layer extends in parallel to the respective S planes and the C+ plane. The thickness and composition of the InGaN layer 155 is reflective of the shape of the hexagonal pyramidal trapezoid-shaped GaN later 154 covered with the S and C+ planes and thus vary in matching with the shape thereof. The second emission wavelength region of a longer wavelength is formed at the portion of the C plane of the selective crystal growth layer, and the first emission wavelength region of a shorter wavelength is formed on the portion of the S planes of the selective crystal growth layer. The second emission wavelength region develops, for example, a green light emission and the first emission wavelength region develops, for example, blue light emission.

The p-electrode 157 and p-electrode 158 respectively corresponding to these first and second emission wavelength regions are formed on the magnesium-doped GaN layer 156, so that an electric current is independently chargeable into the first and second emission wavelength regions. The n-electrode 159 is formed at the region of each opening 160 made at the side portion of the hexagonal pyramid portion and is connected to the silicon-doped GaN layer 154 via the silicon-doped GaN layer 152.

In order to enable the active layer to be responsible for multi-color light emission, the semiconductor light-emitting element of this example, having such a structure as set forth hereinabove, is arranged such that the S planes, inclined relative to the substrate principal plane, and the C+ plane, extending parallel to the principal plane of the substrate, of the GaN layer 154 formed beneath the active layer are utilized so that the active layer is grown on the C+ and S planes wherein band gaps formed in the active layer are changed without resorting to, in particular, etching. In this way, a light emitting element capable of multi-color light emission is easily fabricated, ensuring precise formation without inviting degradation of crystallinity.

EXAMPLE 10

This example is one which deals with the formation of light-emitting wavelength regions by processing the surface of an underlying crystal layer on a sapphire substrate in the form of irregularities, followed by selective growth from the irregular portions. With reference to FIGS. 46 to 49, the element structure is described along with its fabrication process.

First, a low temperature buffer layer made of either AlN or GaN is formed on a sapphire substrate 170 at a low temperature of 500° C. After raising to a temperature of 1000° C., a silicon-doped GaN layer 171 is formed as an underlying crystal layer. Subsequently, a mask layer made of SiO$_2$ or SiN is formed over the entire surface in a thickness ranging from 100 to 500 nm, and striped steps 172 of approximately 10 μm are formed in a direction of 1-101 by use of photolithography and a hydrofluoric acid etchant, followed by etching of the silicon-doped GaN layer 171 as exposed according to RIE.

Figure 46A:
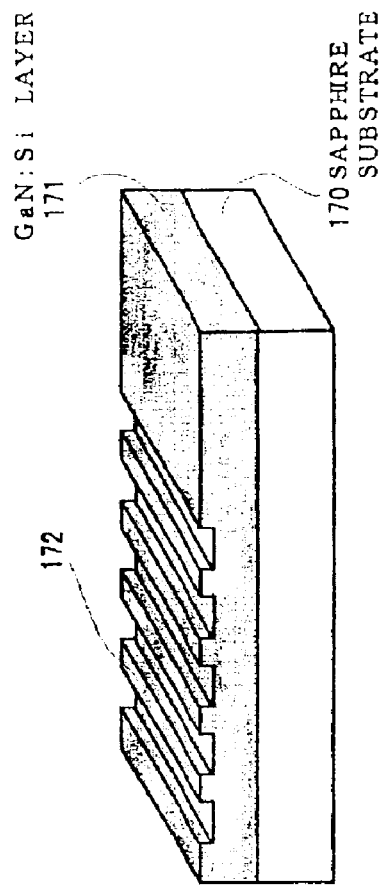
FIG. 46 is a view showing the step of forming stepped portions in the fabrication process of a semiconductor light-emitting element of Example 10 of the present invention, including a sectional view (A) in the fabrication process and a perspective view (B) in the fabrication process.
Figure 46B:
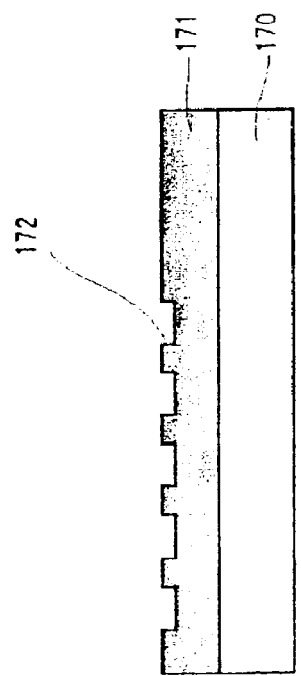
Figure 47A:
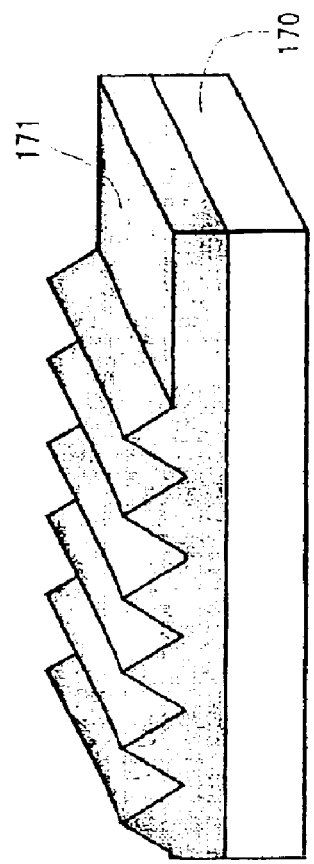
FIG. 47 is a view showing the selective growth step of a crystal layer in the fabrication process of the semiconductor light-emitting element of Example 10 of the present invention, including a sectional view (A) in the fabrication process and a perspective view (B) in the fabrication process.
Figure 47B:
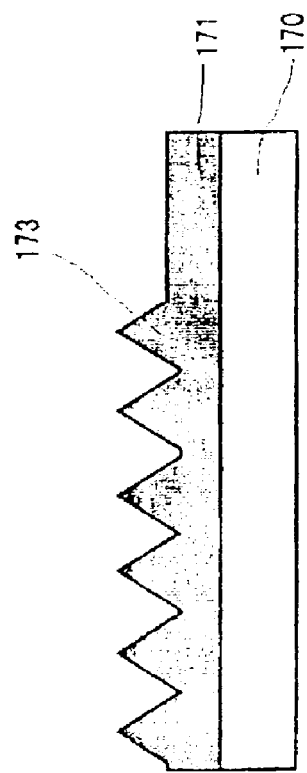
Figure 48A:
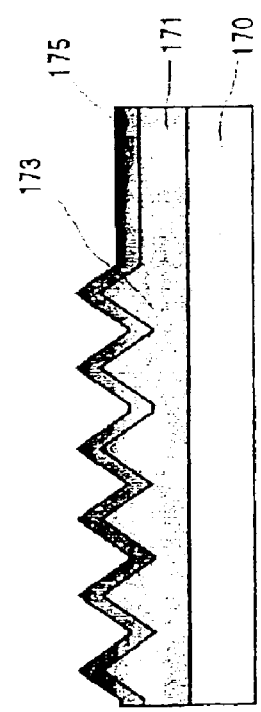
FIG. 48 is a view showing the step of forming an active layer in the fabrication process of the semiconductor light-emitting element of Example 10 of the present invention, including a sectional view (A) in the fabrication process and a perspective view (B) in the fabrication process.
Figure 48B:
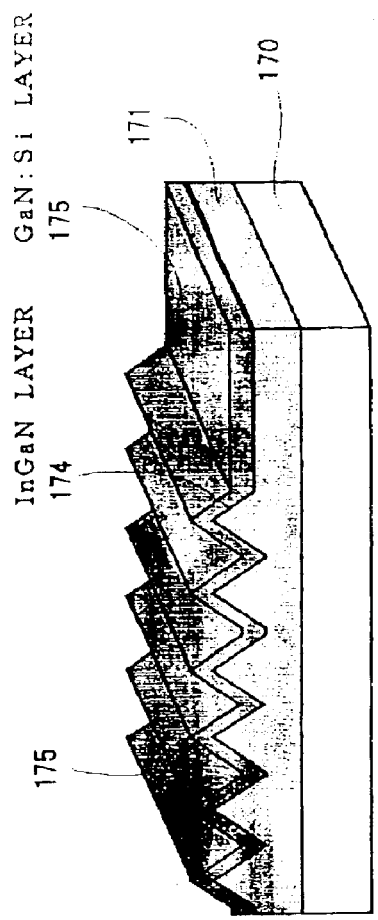

Thereafter, the mask layer is removed as shown in FIG. 46. Subsequently, crystal growth is performed once more, whereupon the temperature is increased to approximately 1000° C. to form a silicon-doped GaN layer 173 by selective crystal growth. This Si-doped GaN layer 173 is grown at the steps 172, and when the growth is continued for a while, a serrate form in section shown in FIG. 47 develops. She growth is continued for a time after the formation of the silicon-doped GaN layer, and a silicon-doped GaN layer serving as a clad layer is further grown, followed by lowering the growth temperature to permit an InGaN layer 174 to be grown. The InGaN layer 174 has a thickness of approximately 0.5 nm to 3 nm. For the active layer, a quantum well structure (QW) or a multiple quantum well structure (MQW) of an (Al) GaN/InGaN structure may be used. Alternatively, there also may be used a multiple structure using a guide layer of GaN or InGaN. In this connection, it is preferred to grow an AlGaN layer as a layer just above InGaN. Thereafter, the growth temperature is increased to grow a magnesium-doped GaN layer 175 as shown in FIG. 48.

Figure 49A:
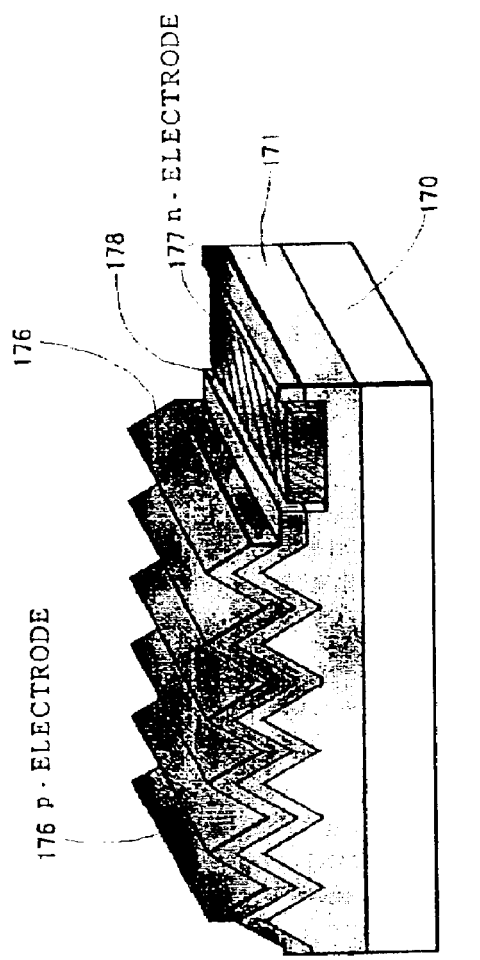
FIG. 49 is a view showing the step of forming electrodes in the fabrication process of the semiconductor light-emitting element of Example 10 of the present invention, including a sectional view (A) in the fabrication process and a perspective view (B) in the fabrication process.
Figure 49B:
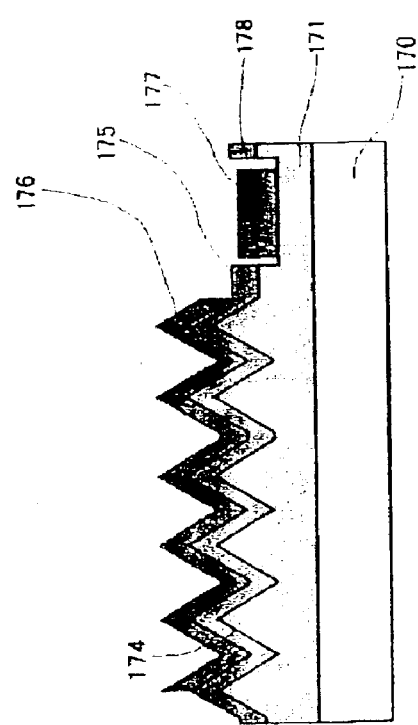

Moreover, Ni/Pt/Au or Ni (Pd)/Pt/Au is vacuum deposited on the uppermost layer grown on the last-mentioned layer to form a p-electrode 176 on the magnesium-doped GaN layer 175 as shown in FIG. 49. Thereafter, part of the magnesium-doped GaN layer 175 and the like on the substrate having the growth layers is removed, followed by vacuum deposition of a Ti/Al/Pt/Au electrode at the resulting opening 178 formed by the removal of the part. This Ti/Al/Pt/Au electrode serves as an n-electrode 177.

In the light-emitting element of this example, the light-emitting wavelength region is formed by processing the surface of the underlying crystal layer in the form of irregularities, followed by selective growth from the irregular portions. This light-emitting element usually becomes shorter in wavelength than those making use of a circular or hexagonal opening of a mask or crystal species. Accordingly, there can be fabricated a semiconductor light-emitting device capable of multi-color light emission through combination with other types of elements.

EXAMPLE 11

This example is one wherein a semiconductor light-emitting device is arranged in such a way that the light-emitting element obtained by making use of selective growth as in Example 7 is formed with different light-emitting wavelength regions while changing a shape element, and a light-emitting region that is made shorter in wavelength by use of such selective growth, as illustrated in Example 10, is formed.

Figure 50:
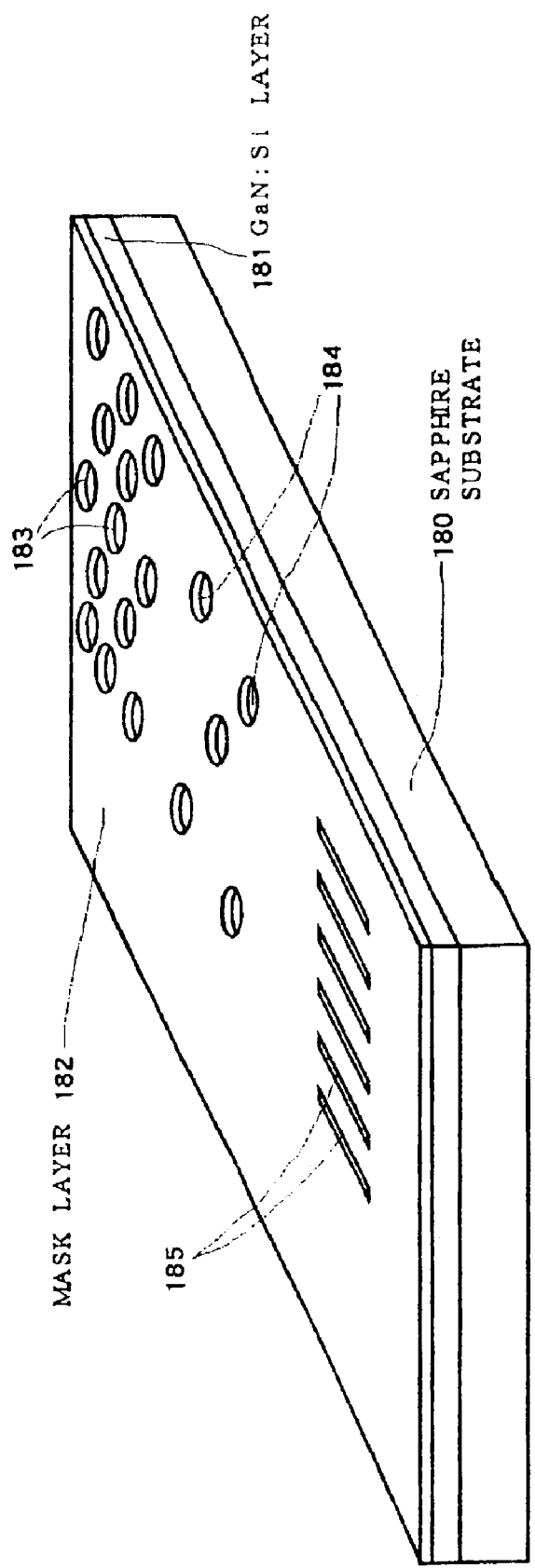
FIG. 50 is a perspective view of a fabrication process showing the step of forming a mask layer in the fabrication process of a semiconductor light-emitting device of Example 11 of the present invention.

First, a low temperature buffer layer made of either AlN or GaN is formed on a sapphire substrate 180 at a low temperature of 500° C. After raising to a temperature of 1000° C., a silicon-doped GaN layer 181 is formed as an underlying crystal layer. Subsequently, a mask layer 182 made of SiO$_2$ or SiN is formed over the entire surface in a thickness ranging from 100 to 500 nm. In order to arrange light emission groups having three different shape elements, the mask layer 182 is formed thereon with openings 183 having a high array density; openings 184 having a relatively low array density, and openings 185 being in the form of an approximately 10 μm wide striped pattern, respectively. In FIG. 50, a light emission group arranged correspondingly to the openings 183 has a high array density wherein the distance between adjacent openings 183 is made short. With the light emission group arranged correspondingly to the openings 184, the array density is low wherein the distance between adjacent openings 184 is made long. The opening 183 and the opening 184 have the same diameter and are arranged such that the distances to other openings are different from each other. The openings 185 in the form of a striped pattern are formed by processing steps in the direction of 1-101by use of photolithography and a hydrofluoric acid etchant in the same manner as in Example 10.

Figure 51:
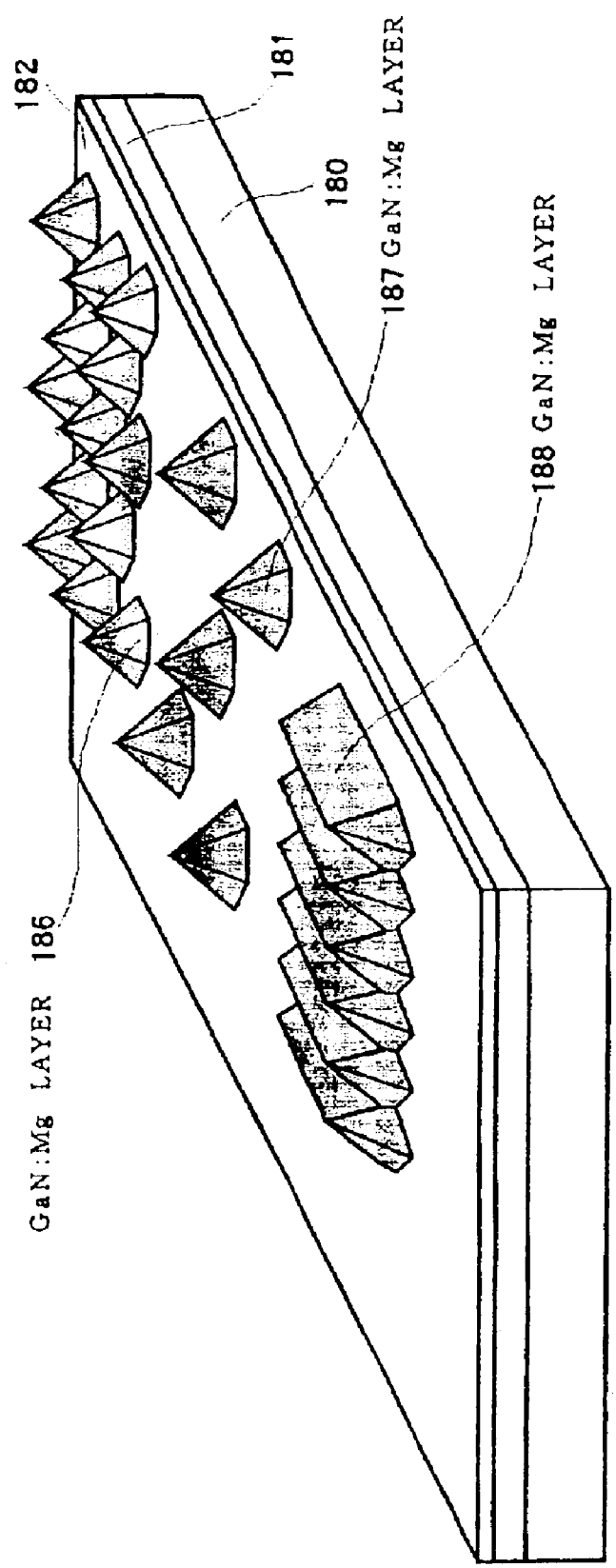
FIG. 51 is a perspective view of a fabrication process showing the step of forming a crystal layer in the fabrication process of the semiconductor light-emitting device of Example 11 of the present invention.

Subsequently, a silicon-doped GaN layer is formed from the openings 183, 184, 185 of the respective emission groups using the three types of shape elements by selective growth, on which an InGaN layer is formed as an active layer, followed by further formation of magnesium-doped GaN layers 186, 187, 188 as shown in FIG. 51. At this point in time, the composition and thickness of the InGaN layer serving as the active layer change depending on the emission group. The InGaN layer formed by reflection of the striped pattern permits blue light emission, the InGaN layer formed by reflection of the openings 184 having a low array density permits red light emission, and the InGaN layer formed by reflection of the openings 183 having a high array density permits green light emission.

Figure 52:
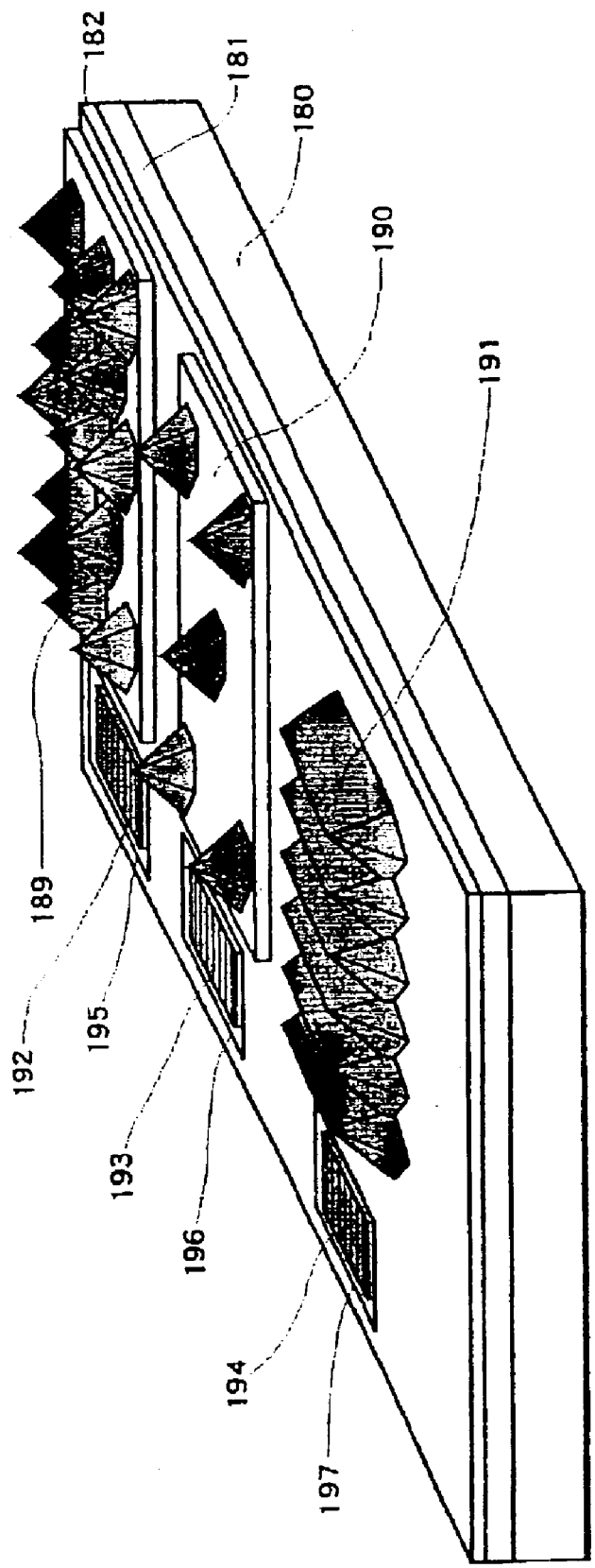
FIG. 52 is a perspective view of a fabrication process showing the step of forming electrodes in the fabrication process of the semiconductor light-emitting device of Example 11 of the present invention.

As shown in FIG. 52, p-electrodes 189, 190, 191 are, respectively, formed on the magnesium-doped GaN layer 186, 187, 188 of the emission groups, so that an electric current is independently charged into the respective emission groups. The mask layer 182 adjacent to these element-forming portions is etched to make openings 195, 196, 197, thereby forming n-electrodes 192, 193, 194. Although three n-electrodes are formed in the semiconductor light-emitting element of this example, the electrodes may be reduced in number for common use within a range where a voltage drop is negligible. In this manner, a semiconductor light-emitting element capable of three-color light emission can be arranged through one cycle of crystal growth within one apparatus. As having stated hereinbefore, the three colors can be red, blue and green. In general, the striped portion becomes short in wavelength, and an element having greater pitches (or a smaller fill factor) results in a longer wavelength. The size of the openings of the mask is not changed in the example, but similar results may be obtained when the size is changed.

In particular, such a semiconductor light-emitting device as stated above may be readily applied as a display, when the semiconductor light-emitting devices of this example are arranged by 1,000,000 pixels, an image display device can be fabricated. With a simple matrix system, there can be obtained an image display device only by forming electrodes along directions of X and Y.

EXAMPLE 12

Figure 53:
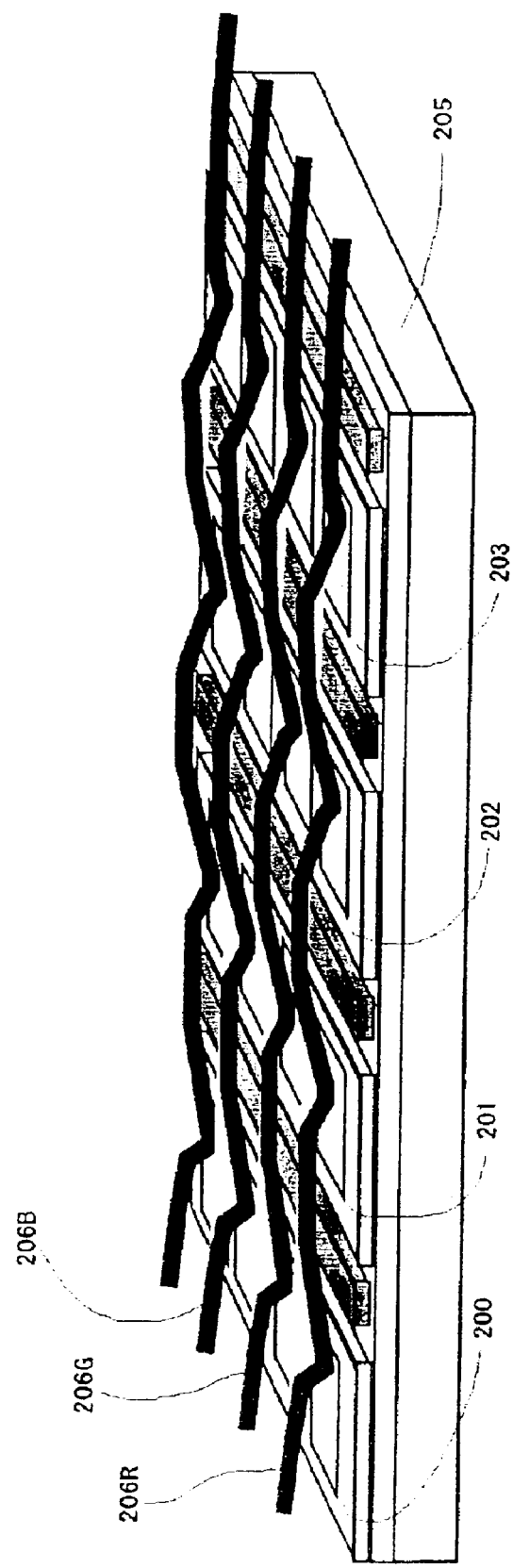
FIG. 53 is a partial perspective view showing a schematic structure of an image display device or an illumination device of Example 12 of the present invention.

The multi-color semiconductor light-emitting devices obtained in Example 11 are wired according to a simple matrix system to make an image display device or an illumination device. FIG. 53 shows an example of such an image display device or illumination device, in which semiconductor light-emitting devices 200, 201, 202, 203 are so arranged on a substrate 205 that red light-emitting regions, blue light-emitting regions and green light-emitting regions are, respectively, aligned in line. Wirings 206R, 206G and 206B for supplying an electric current to p-electrodes of the red light-emitting regions, blue light-emitting regions and green light-emitting regions are arranged as shown. It will be noted that an n-electrode is in common use, and selective transistors for controlling individual pixels may be formed, if necessary.

The image display device or illumination device has such a structure that first to third light-emitting regions whose light-emitting wavelengths differ from one another by changing at least one of the composition and the thickness thereof and which, respectively, serve as a red light-emitting region, a blue light-emitting region and a green light-emitting region are formed in the active layer. When independent signals are applied to the wirings 206R, 206G and 206B, respectively, it becomes possible to display a two-dimensional image on an image display device. Alternatively, when the same signal is applied to the wirings 206R, 206G and 206B, respectively, an illumination device can be provided.

It will be noted that the light-emitting regions for the respective colors may not always be arranged in line, but may be arranged so as to basically permit emission in a zigzag fashion or two-color light emission or to provide a structure where pixels for one color among the three primary colors are larger in number than those of the other colors. Alternatively, semiconductor light-emitting devices fabricated according to other methods may be used partly in combination to provide an image display device or illumination device. It should be noted that in the foregoing examples, there is illustrated the method wherein the GaN layer is grown after the formation of the low temperature buffer layer on the sapphire substrate, followed by selective growth after formation of a selective mask. However, the selective growth is not limited to the above method. For instance, not only the layers are built up on the sapphire substrate, but also a GaN layer may be formed directly on Si at about 900° C., GaN is grown after growth of AlN on Si in 5 nm at 1000° C., or a GaN substrate may be used, followed by formation of a selective mask. Moreover, the size such as of a hexagonal pyramid of the foregoing examples is indicated by way of illustration only. For example, the size of a hexagonal pyramid or the like may be set at a width of approximately 10 μm.

In the semiconductor light-emitting element of the present invention, it is taught to change a band gap energy within the same active layer by utilization of a difference in crystal plane or formation of an active layer whose size is larger than a diffusion length in the structure based on selective growth. Accordingly, the step of etching or the like is unnecessary for the formation of light-emitting regions whose wavelengths differ; thus, a fabrication procedure is not complicated. The fabricated element has a structure which can be made in high precision and does not invite degradation of crystallinity.

Because a light-emitting diode for three primary colors is obtained by one cycle of growth, light-emitting diodes are ready for use as a display. In addition, three colors can be emitted simultaneously, so that if a luminous efficiency is further improved, the element can be used as an illuminator device in place of a fluorescent lamp. Because of a solid-state light-emitting element, it is convenient for portable purposes. In addition, when crystallinity is increased, the element may be converted to a laser device and the emission of three primary color laser beams is effective for high output emission.

Although the present invention has been described with reference to specific embodiments, those of skill in the art will recognize that changes may be made thereto without departing from the spirit and scope of the invention as set forth in the hereafter appended claims.

Illustration of Reference Numerals

10: sapphire substrate
11: Si-doped GaN layer
15: InGaN layer (active layer)
16: Mg-doped GaN layer
17: p-electrode
19: n-electrode
111: Si-doped GaN layer.
200: semiconductor light-emitting device

What is claimed is:

1. A semiconductor light-emitting element, comprising:
   a selective crystal growth layer formed by selectively growing a compound semiconductor of a Wurtzite type;
   a clad layer of a first conduction type formed on the selective crystal growth layer;
   an active layer formed on the selective crystal growth layer; and
   a clad layer of a second conduction type formed on the selective crystal growth layer;
   wherein at least part of the active layer extends in parallel to different crystal planes, and first and second light-emitting wavelength regions, whose respective light-emitting wavelengths are different from each other, are formed in the active layer and are arranged such that an electric current is chargeable into both the first and the second light-emitting wavelength regions.

2. A semiconductor light-emitting element as claimed in claim 1, wherein the different crystal planes include at least two crystal planes selected from a (0001) plane, a (1-100) plane, a (1-101) plane, a (11-20) plane, a (1-102) plane, a (1-123) plane and a (11-22) plane of the Wurtzite type and crystal planes equivalent thereto.

3. A semiconductor light-emitting element as claimed in claim 1, wherein the selective crystal growth layer includes a layer selectively grown from an opening of a mask layer formed on an underlying crystal layer.

4. A semiconductor light-emitting element as claimed in claim 1, wherein the selective crystal growth layer includes a layer selectively grown from a seed crystal portion formed on a substrate.

5. A semiconductor light-emitting element as claimed in claim 1, wherein the selective crystal growth layer includes a layer formed by processing a surface of an underlying crystal layer in the form of irregularities and selectively growing from the irregularities.

6. A semiconductor light-emitting element as claimed in claim 1, wherein the selective crystal growth layer is formed of a nitride semiconductor.

7. A semiconductor light-emitting element as claimed in claim 1, wherein the active layer includes a semiconductor crystal layer formed by one growth cycle.

8. A semiconductor light-emitting element as claimed in claim 1, further comprising electrodes for both the first and second light-emitting wavelength regions, each of the first and second light-emitting wavelength regions having at least one of the electrodes individually formed for the respective wavelength region, wherein independent signals are respectively supplied to the individually formed electrodes.

9. A semiconductor light-emitting element as claimed in claim 1, further comprising electrodes for both the first and second light-emitting wavelength regions, each of the first and second light-emitting wavelength regions having at least one of the electrodes individually formed for the respective wavelength region, wherein a signal permitting a same level of emission intensity is applied to the individually formed electrodes.

10. A semiconductor light-emitting element as claimed in claim 1, wherein the active layer further includes a third light-emitting wavelength region capable of emitting light with an emission wavelength which differs from the emission wavelengths of the first and the second light-emitting wavelength regions.

11. A semiconductor light-emitting element, comprising:
a selective crystal growth layer formed by selectively growing a compound semiconductor of a Wurtzite type;
a clad layer of a first conduction type formed on the selective crystal growth layer;
an active layer formed on the selective crystal growth layer; and
a clad layer of a second conduction type formed on the selective crystal growth layer;
wherein the active layer is formed of at least a ternary mixed crystal material such that a diffusion length of an atom constituting part of the mixed crystal material is shorter than an extending length of the active layer, so that first and second light-emitting wavelength regions, whose respective light-emitting wavelengths are different from each other, are formed in the active layer and are arranged such that an electric current is chargeable into both the first and the second light-emitting wavelength regions.

12. A semiconductor light-emitting element as claimed in claim 11, wherein the compound semiconductor of the Wurtzite type is formed of a nitride semiconductor, the active layer is formed of an InGaN layer, and the atom includes In.

13. A semiconductor light-emitting element, comprising:
a selective crystal growth layer formed by selectively growing a compound semiconductor of a Wurtzite type;
a clad layer of a first conduction type formed on the selective crystal growth layer;
an active layer formed on the selective crystal growth layer; and
a clad layer of a second conduction type formed on the selective crystal growth layer;
wherein first and second light-emitting wavelength regions, which have respectively different light-emitting wavelengths due to a difference in at least one of a respective composition and a thickness thereof, are formed in the active layer and are arranged such that an electric current is chargeable into both the first and the second light-emitting wavelength regions.

14. A semiconductor light-emitting element as claimed in claim 13, wherein the selective crystal growth layer includes a layer which is selectively grown from an opening of a mask layer formed on an underlying crystal layer.

15. A semiconductor light-emitting element as claimed in claim 13, wherein the selective crystal growth layer includes a layer selectively grown from a seed crystal portion formed on a substrate.

16. A semiconductor light-emitting element as claimed in claim 13, wherein the selective crystal growth layer includes a layer formed by processing a surface of an underlying crystal layer in the form of irregularities and selectively growing from the irregularities.

17. A semiconductor light-emitting element as claimed in claim 13, wherein the first and the second light-emitting wavelength regions are formed at a side portion of the active layer which is a contact line between adjacent planes of the selective crystal growth layer and at a plane portion of the selective crystal growth layer.

18. A semiconductor light-emitting element as claimed in claim 13, wherein the selective crystal growth layer has an S plane whose orientation differs from an orientation of a principal plane of a substrate.

19. A semiconductor light-emitting element as claimed in claim 13, wherein the active layer is formed of at least a ternary mixed crystal material, with a mixed crystal ratio differing between the first and the second light-emitting wavelength regions.

20. A semiconductor light-emitting element as claimed in claim 19, wherein the active layer is formed of an InGaN layer, and a mixed crystal ratio in the InGaN layer differs between the first and the second light-emitting wavelength regions.

21. A semiconductor light-emitting element as claimed in claim 13, wherein the selective crystal growth layer is formed of a nitride semiconductor.

22. A semiconductor light-emitting element as claimed in claim 13, wherein the active layer is formed of a semiconductor crystal layer formed by one cycle of growth.

23. A semiconductor light-emitting element as claimed in claim 13, further comprising at least two electrodes of the first conduction type.

24. A semiconductor light-emitting element as claimed in claim 13, further comprising electrodes for both the first and the second light-emitting wavelength regions, each of the first and the second light-emitting wavelength regions having at least one of the electrodes individually formed for the respective wavelength region, wherein a same signal is supplied to the individually formed electrodes.

25. A semiconductor light-emitting element as claimed in claim 13, wherein the active layer further includes a third light-emitting wavelength region capable of emitting light with an emission wavelength which differs from the emission wavelengths of the first and the second light-emitting wavelength regions.

26. A semiconductor light-emitting element as claimed in claim 13, wherein the first and the second light-emitting wavelength regions, as well as a third light-emitting wavelength region, are provided such that light emission is possible at least simultaneously at two different wavelengths.

27. A semiconductor light-emitting device, comprising:
a substrate;
a plurality of selective crystal growth layers formed by selectively growing a compound semiconductor of a Wurtzite type on the substrate;
a clad layer of a first conduction type formed on each of the plurality of selective crystal growth layers;
an active layer formed on each of the plurality of selective crystal growth layers; and
a clad layer of a second conduction type formed on each of the plurality of selective crystal growth layers;
wherein at least two light emission groups, each consisting of the plurality of selective crystal growth layers that are at least similar to each other with respect to a shape element thereof, are formed on the substrate and have respective light-emitting wavelengths different from each other due to a difference in their respective shape element.

28. A semiconductor light-emitting device as claimed in claim 27, wherein the selective crystal growth layers are selectively grown via openings of a mask layer formed on an underlying crystal layer, and the shape elements respectively include a shape, a size and an array density of the openings.

29. A semiconductor light-emitting device as claimed in claim 27, wherein the selective crystal growth layers are selectively grown from a seed crystal portion formed on the substrate, and the shape element respectively include a shape, a size and an array density of the seed crystal portion.

30. A semiconductor light-emitting device as claimed in claim 27, wherein independent signals are respectively supplied to the plurality of light emission groups.

31. A semiconductor light-emitting device as claimed in claim 27, wherein a same signal is supplied to the plurality of light emission groups.

32. An image display device including, as a pixel, a semiconductor light-emitting element, the element comprising:
   a selective crystal growth layer formed by selectively growing a compound semiconductor of a Wurtzite type;
   a clad layer of a first conduction type formed on the selective crystal growth layer;
   an active layer formed on the selective crystal growth layer; and
   a clad layer of a second conduction type formed on the selective crystal growth layer;
   wherein at least part of the active layer extends in parallel to different crystal planes, and first and second light-emitting wavelength regions, whose respective light-emitting wavelengths are different from each other, are formed in the active layer and are arranged such that an electric current is chargeable into both the first and the second light-emitting wavelength regions.

33. An illumination device including a plurality of semiconductor light-emitting elements in array, each element comprising:
   a selective crystal growth layer formed by selectively growing a compound semiconductor of a Wurtzite type;
   a clad layer of a first conduction type formed on the selective crystal growth layer;
   an active layer formed on the selective crystal growth layer; and
   a clad layer of a second conduction type formed on the selective crystal growth layer;
   wherein at least part of the active layer extends in parallel to different crystal planes, and first and second light-emitting wavelength regions, whose respective light-emitting wavelengths are different from each other, are formed in the active layer and are arranged such that an electric current is chargeable into both the first and the second light-emitting wavelength regions.

34. An image display device including, as a pixel, a semiconductor light-emitting element, the element comprising:
   a selective crystal growth layer formed by selectively growing a compound semiconductor of a Wurtzite type;
   a clad layer of a first conduction type formed on the selective crystal growth layer;
   an active layer formed on the selective crystal growth layer; and
   a clad layer of a second conduction type formed on the selective crystal growth layer;
   wherein the active layer is formed of at least a ternary mixed crystal material such that a diffusion length of an atom constituting part of the mixed crystal material is shorter than an extending length of the active layer, so that first and second light-emitting wavelength regions, whose respective light-emitting wavelengths are different from each other, are formed in the active layer and are arranged such that an electric current is chargeable into both the first and the second light-emitting wavelength regions.

35. An illumination device including a plurality of semiconductor light-emitting elements in array, each element comprising:
   a selective crystal growth layer formed by selectively growing a compound semiconductor of a Wurtzite type;
   a clad layer of a first conduction type formed on the selective crystal growth layer;
   an active layer formed on the selective crystal growth layer; and
   a clad layer of a second conduction type formed on the selective crystal growth layer;
   wherein the active layer is formed of at least a ternary mixed crystal material such that a diffusion length of an atom constituting part of the mixed crystal material is shorter than an extending length of the active layer, so that first and second light-emitting wavelength regions, whose respective light-emitting wavelengths are different from each other, are formed in the active layer and are arranged such that an electric current is chargeable into both the first and the second light-emitting wavelength regions.

36. An image display device including, as a pixel, a semiconductor light-emitting element, the element comprising:
   a selective crystal growth layer formed by selectively growing a compound semiconductor of a Wurtzite type;
   a clad layer of a first conduction type formed on the selective crystal growth layer;
   an active layer formed on the selective crystal growth layer; and
   a clad layer of a second conduction type formed on the selective crystal growth layer;
   wherein first and second light-emitting wavelength regions, which have respectively different light-emitting wavelengths due to a difference in at least one of a respective composition and a thickness thereof, are formed in the active layer and are arranged such that an electric current is chargeable into both the first and the second light-emitting wavelength regions.

37. An illumination device including a plurality of semiconductor light-emitting elements in array, each element comprising:
   a selective crystal growth layer formed by selectively growing a compound semiconductor of a Wurtzite type;
   a clad layer of a first conduction type formed on the selective crystal growth layer;
   an active layer formed on the selective crystal growth layer; and
   a clad layer of a second conduction type formed on the selective crystal growth layer;
   wherein first and second light-emitting wavelength regions, which have respectively different light-emitting wavelengths due to a difference in at least one of a respective composition and a thickness thereof, are formed in the active layer and are arranged such that an electric current is chargeable into both the first and the second light-emitting wavelength regions.

38. An image display device including, as a pixel, a semiconductor light-emitting device, the light emitting device comprising:

a substrate;

a plurality of selective crystal growth layers formed by selectively growing a compound semiconductor of a Wurtzite type on the substrate;

a clad layer of a first conduction type formed on each of the plurality of selective crystal growth layers;

an active layer formed on each of the plurality of selective crystal growth layers; and a clad layer of a second conduction type formed on each of the plurality of selective crystal growth layers;

wherein at least two light emission groups, each consisting of the plurality of selective crystal growth layers that are at least similar to each other with respect to a shape element thereof, are formed on the substrate and have respective light-emitting wavelengths different from each other due to a difference in their respective shape element.

39. An illumination device including a plurality of semiconductor light-emitting devices in array, each light-emitting device comprising:

a substrate;

a plurality of selective crystal growth layers formed by selectively growing a compound semiconductor of a Wurtzite type on the substrate;

a clad layer of a first conduction type formed on each of the plurality of selective crystal growth layers;

an active layer formed on each of the plurality of selective crystal growth layers; and a clad layer of a second conduction type formed on each of the plurality of selective crystal growth layers;

wherein at least two light emission groups, each consisting of the plurality of selective crystal growth layers that are at least similar to each other with respect to a shape element thereof, are formed on the substrate and have respective light-emitting wavelengths different from each other due to a difference in their respective shape element.

* * * * *